(12) United States Patent
Komori

(10) Patent No.: US 9,178,504 B2
(45) Date of Patent: Nov. 3, 2015

(54) SIGNAL TRANSMISSION DEVICE, ELECTRONIC DEVICE, AND SIGNAL TRANSMISSION METHOD

(75) Inventor: Kenji Komori, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 633 days.

(21) Appl. No.: 13/341,088

(22) Filed: Dec. 30, 2011

(65) Prior Publication Data

US 2012/0183091 A1    Jul. 19, 2012

(30) Foreign Application Priority Data

Jan. 14, 2011  (JP) ................. 2011-005631

(51) Int. Cl.
*H03K 7/06* (2006.01)
*H03K 7/02* (2006.01)
*H03K 9/02* (2006.01)
*H03K 9/06* (2006.01)

(52) U.S. Cl.
CPC .. *H03K 7/06* (2013.01); *H03K 7/02* (2013.01); *H03K 9/02* (2013.01); *H03K 9/06* (2013.01); *H01L 2924/0002* (2013.01)

(58) Field of Classification Search
CPC ........................................................ H04B 1/40
USPC .................. 375/303, 272, 259, 271, 135
See application file for complete search history.

(56) References Cited

U.S. PATENT DOCUMENTS

| | | | | |
|---|---|---|---|---|
| 8,059,200 | B2 * | 11/2011 | Chen | 348/536 |
| 8,102,665 | B2 * | 1/2012 | Rofougaran | 361/764 |
| 2011/0051780 | A1 * | 3/2011 | Kawasaki | 375/135 |
| 2011/0076944 | A1 * | 3/2011 | Mihota | 455/41.2 |

FOREIGN PATENT DOCUMENTS

| | | | | |
|---|---|---|---|---|
| JP | 2002-359853 A | 12/2002 | | |
| JP | 2003-244016 | * 8/2003 | .............. | H04B 1/40 |
| JP | 2009-124463 A | 6/2009 | | |

OTHER PUBLICATIONS

Office Action Issued Aug. 12, 2014 in Japanese Patent Application No. 2011-005631.

* cited by examiner

*Primary Examiner* — Shuwang Liu
*Assistant Examiner* — Helene Tayong
(74) *Attorney, Agent, or Firm* — Hazuki International, LLC

(57) ABSTRACT

A signal transmission device includes: at least one of a first communication device that transmits a control signal as a wireless signal and a second communication device that receives the wireless signal transmitted from the first communication device to reproduce the control signal, wherein the wireless signal for the control signal is transmitted separately from a wireless signal for a transmission subject signal which is transmitted between a third communication device and a fourth communication device.

14 Claims, 18 Drawing Sheets

<FIRST EXAMPLE>

<SECOND EXAMPLE>

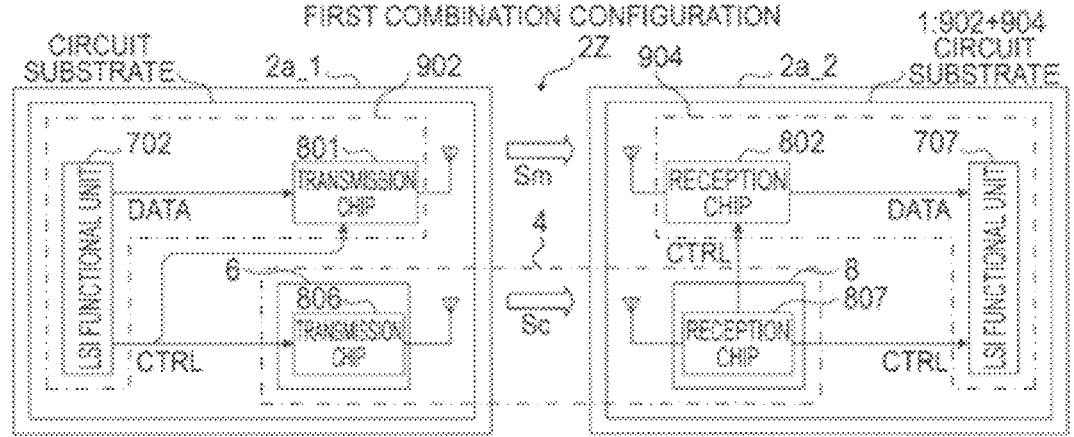
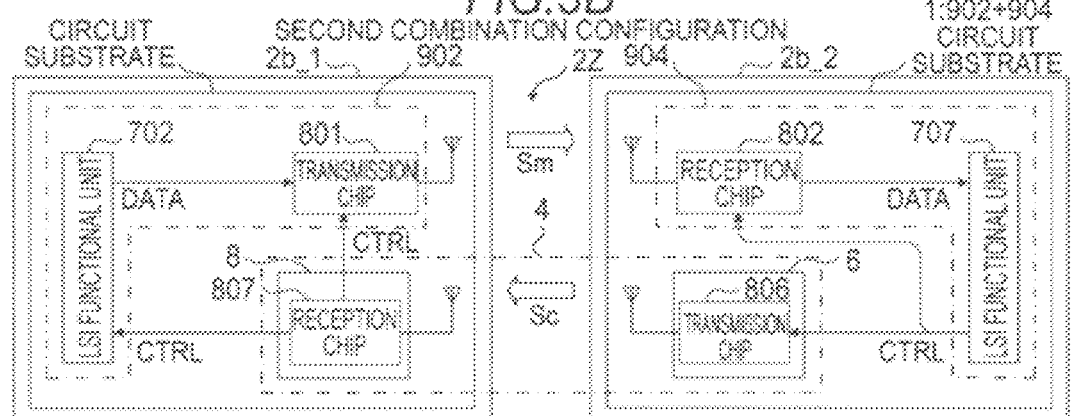
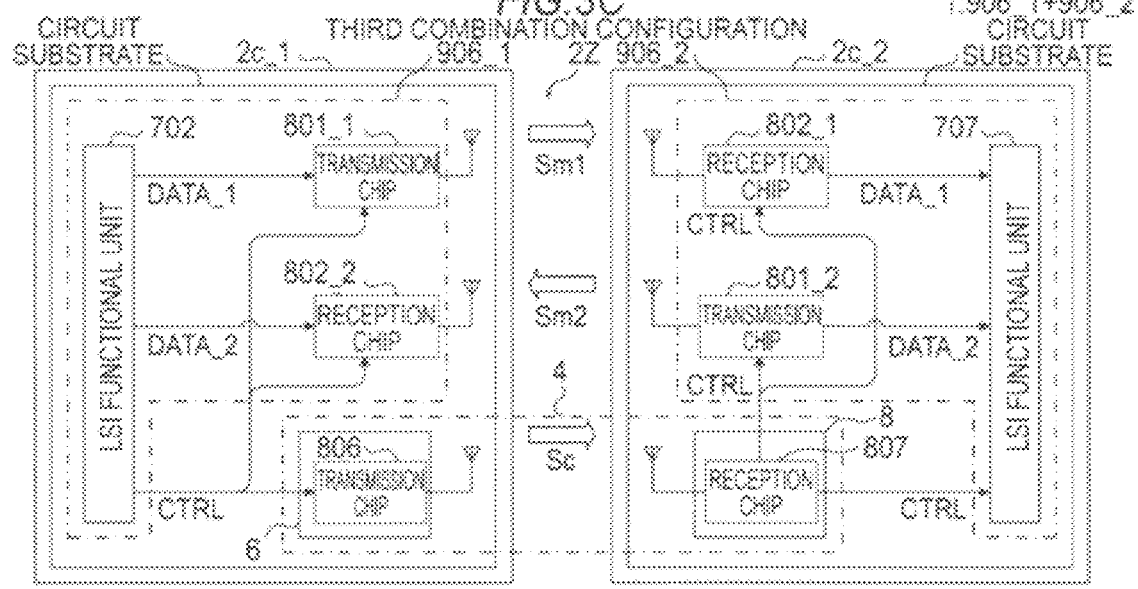

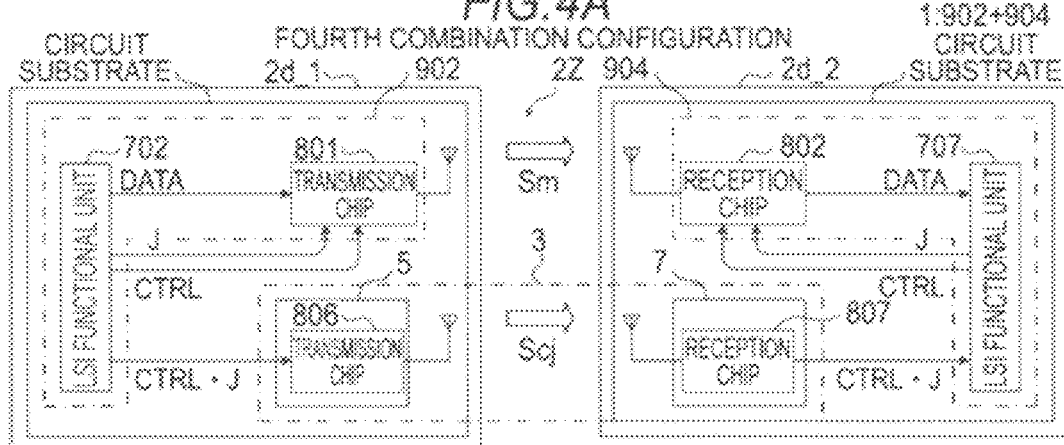
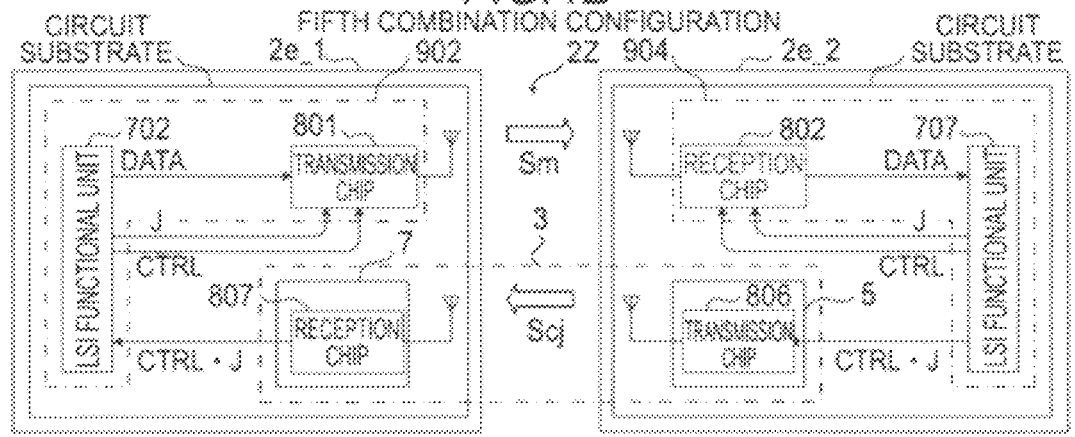
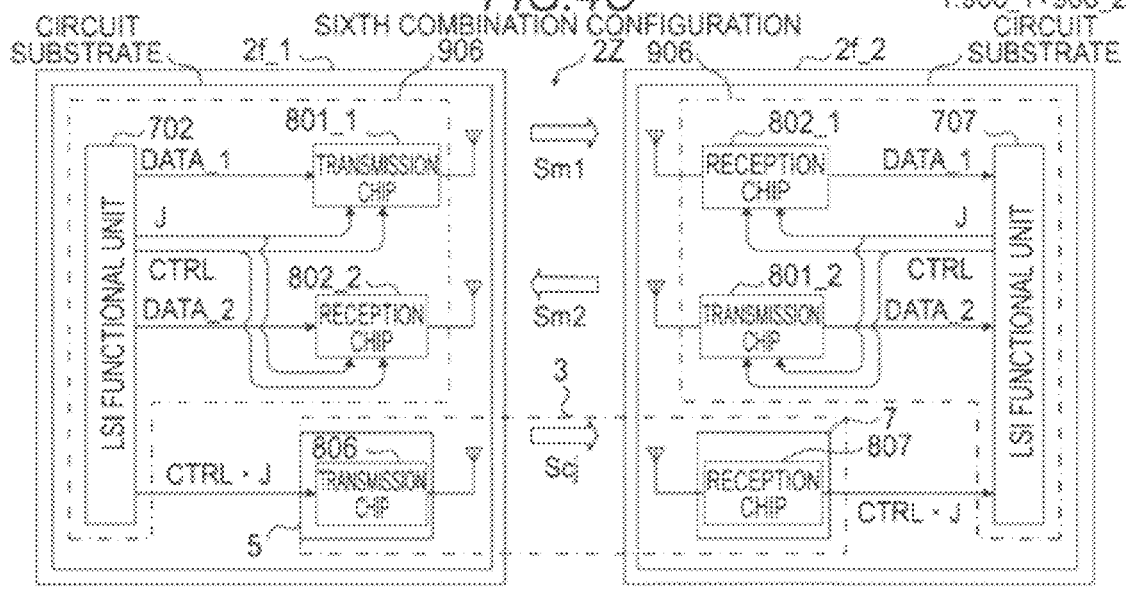

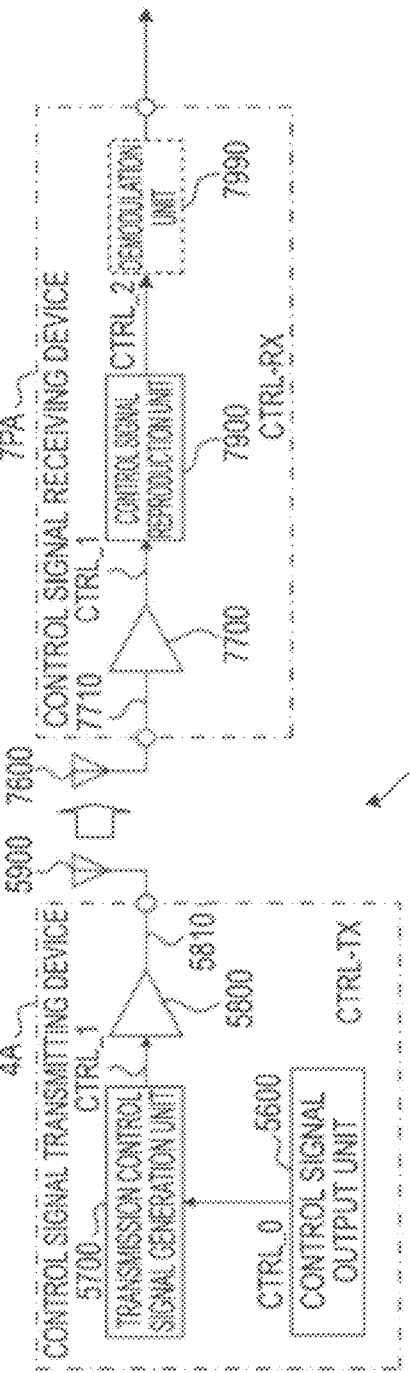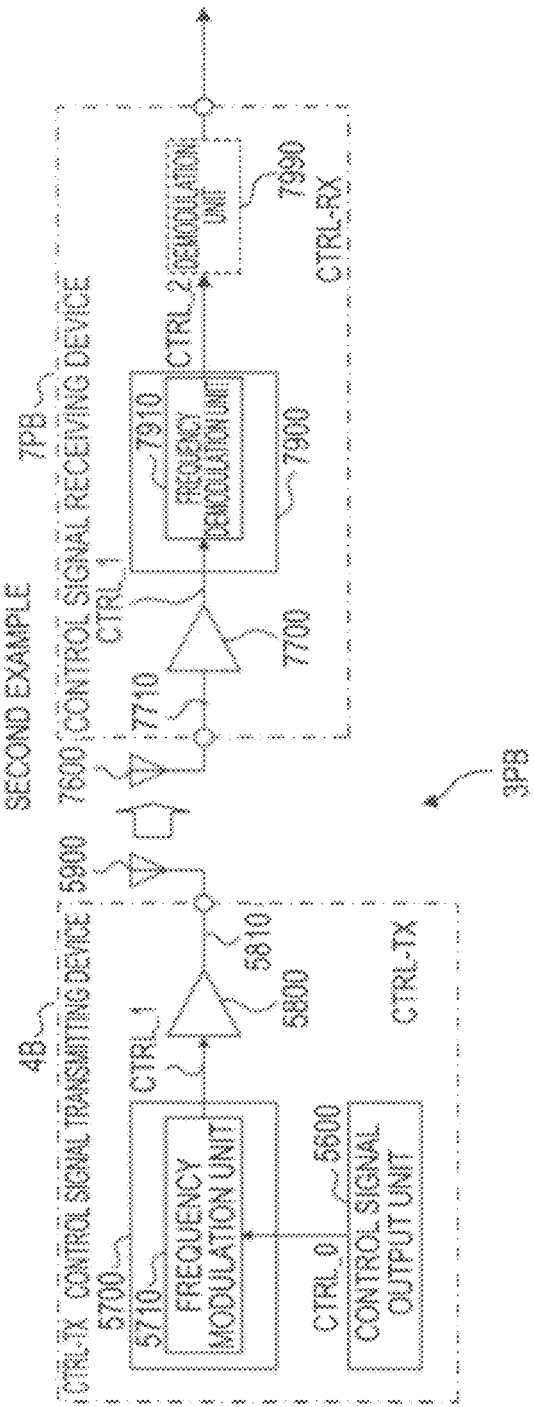

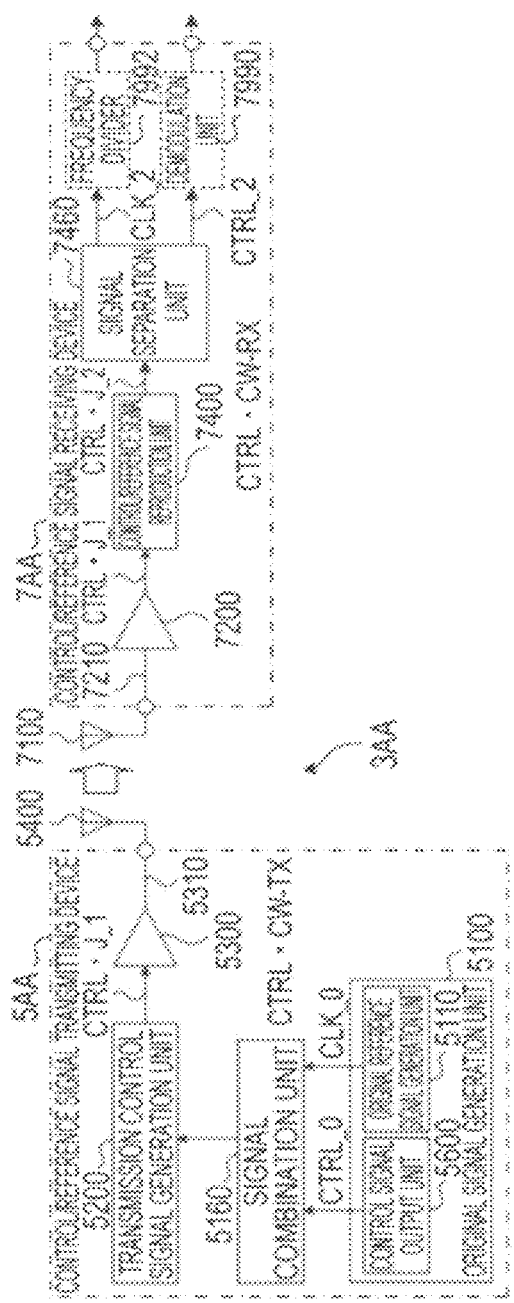
FIG. 6A FIRST EXAMPLE
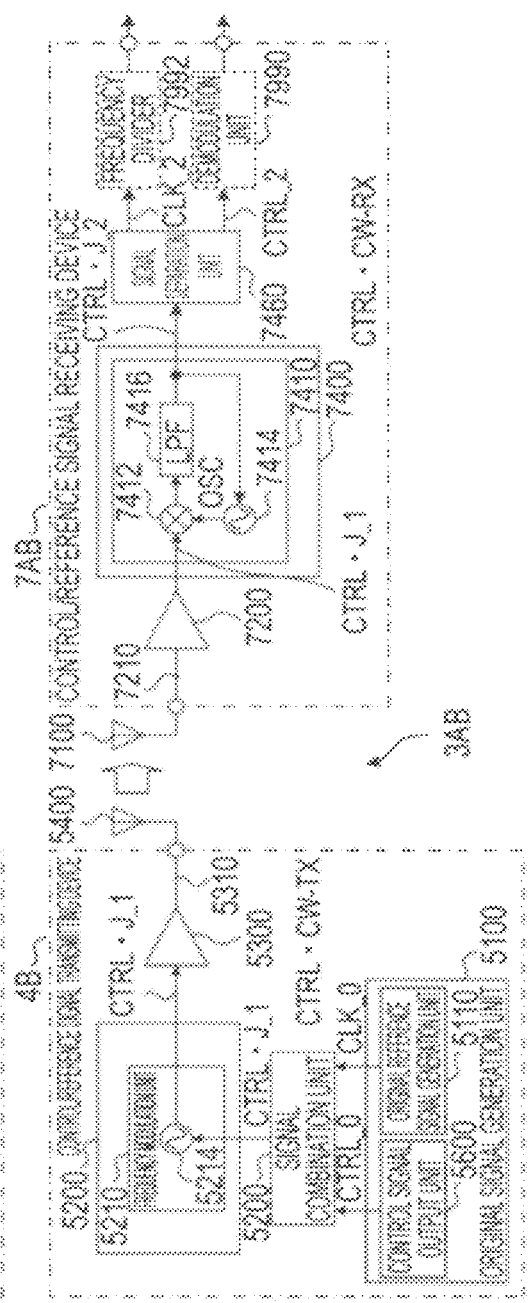
FIG. 6B SECOND EXAMPLE

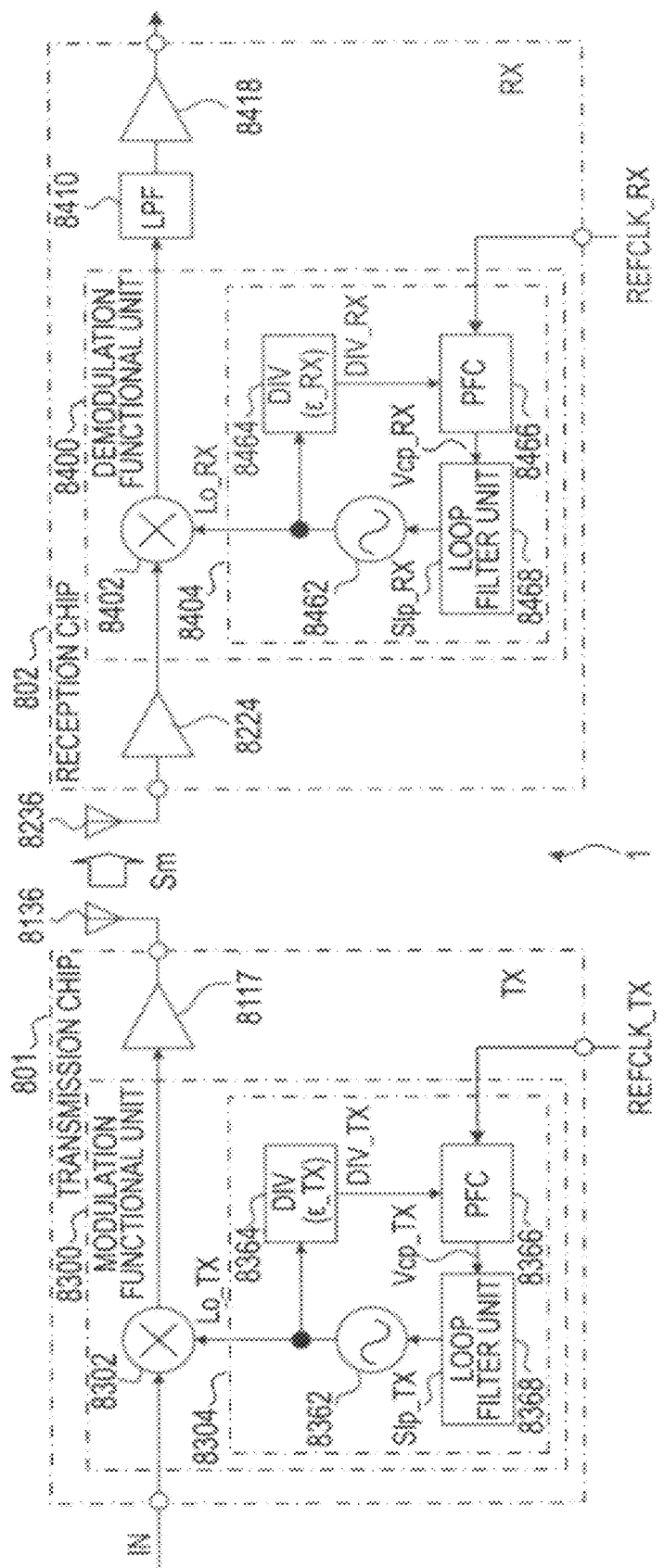

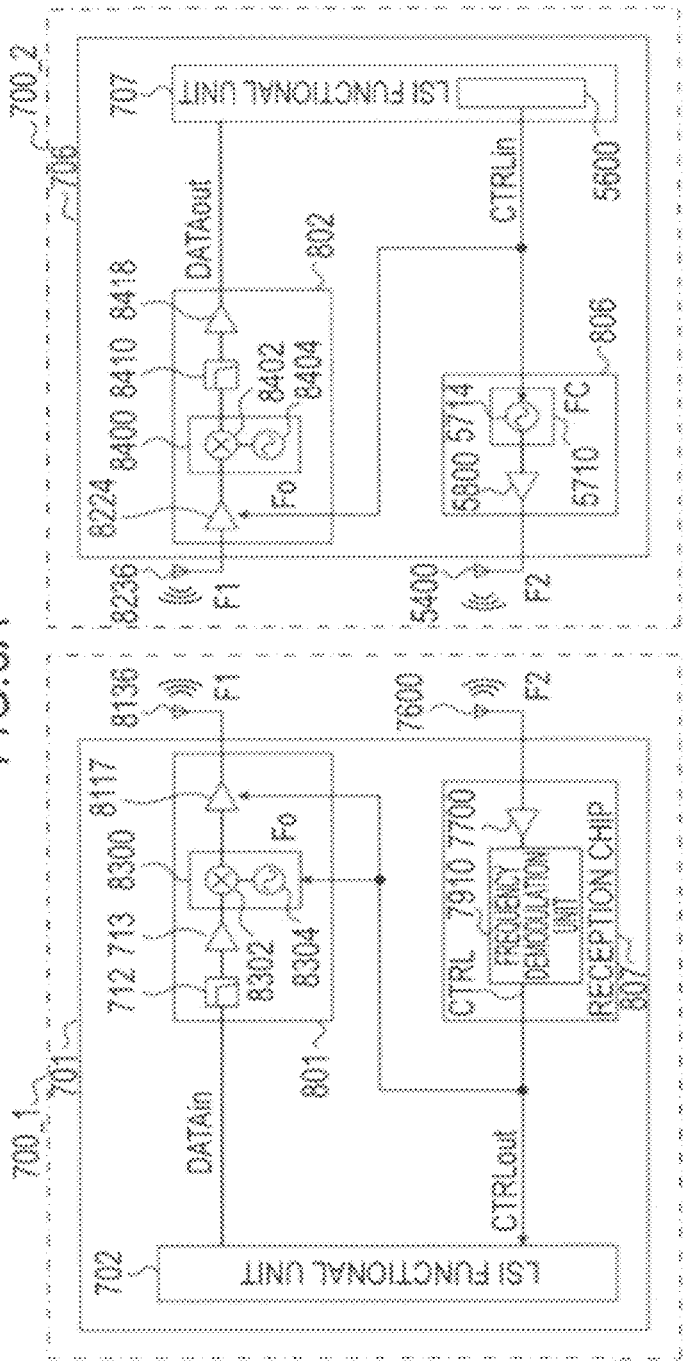
FIG. 8A <FIRST EXEMPLARY EMBODIMENT>
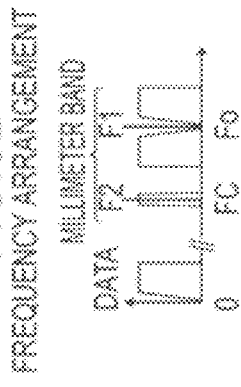
FIG. 8B FREQUENCY ARRANGEMENT

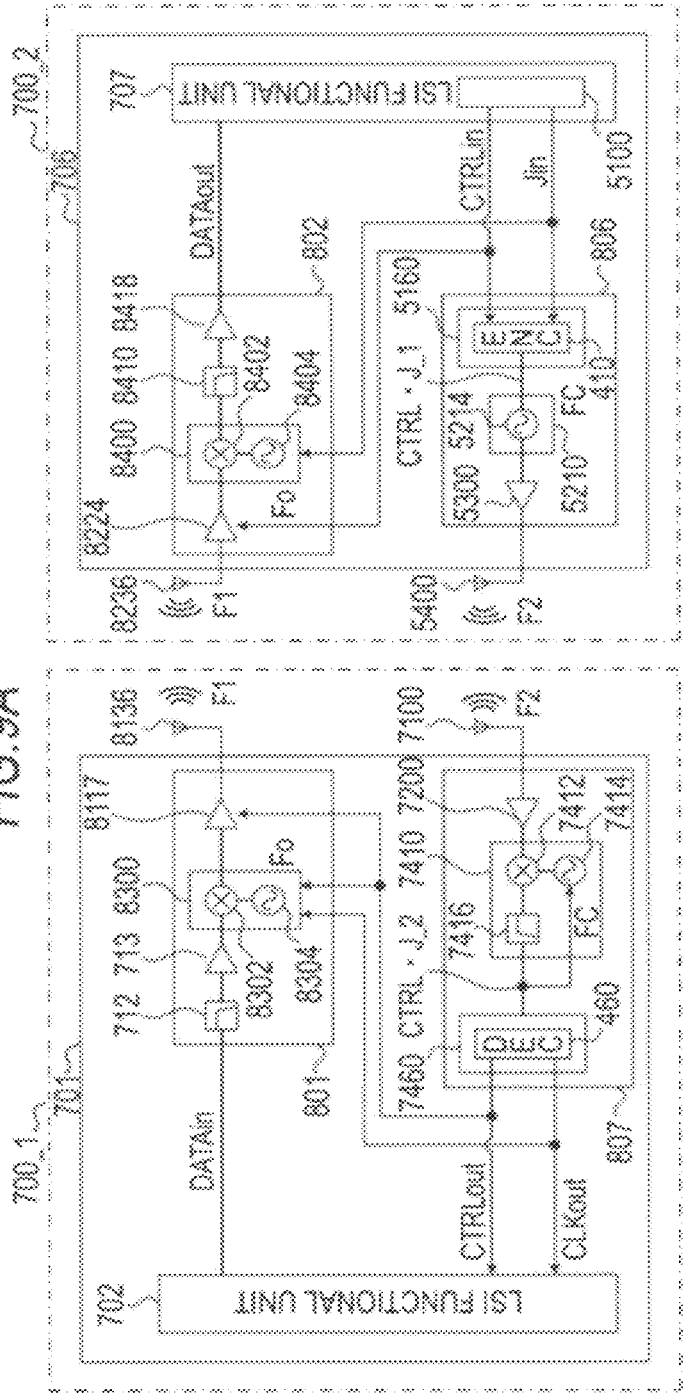
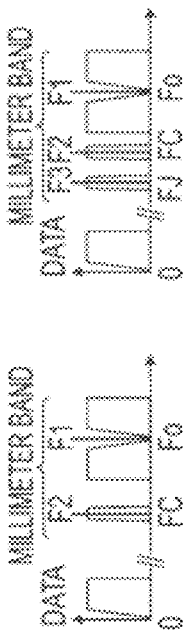
FIG.9A <SECOND EXEMPLARY EMBODIMENT>
FIG.9B FREQUENCY ARRANGEMENT MILLIMETER BAND
FIG.9C FREQUENCY ARRANGEMENT MILLIMETER BAND

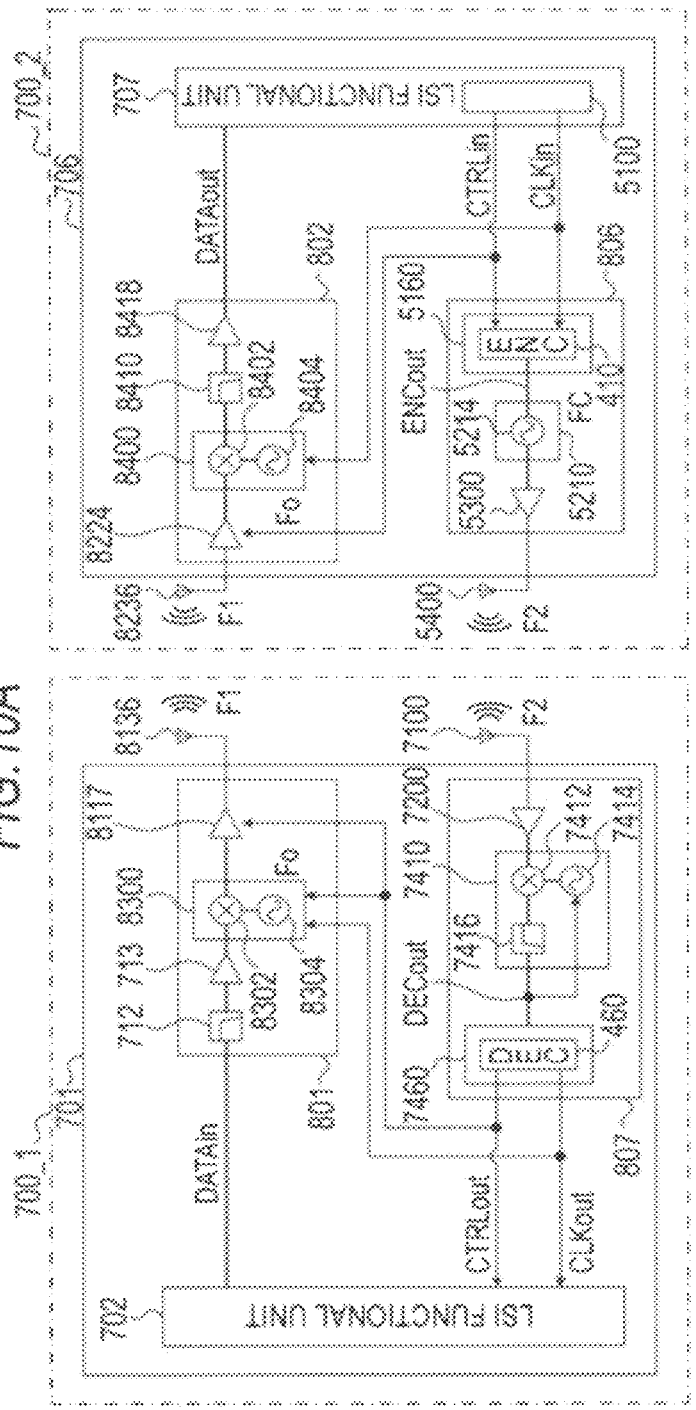

<ENCODING UNIT>
FIG.11A
CIRCUIT DIAGRAM
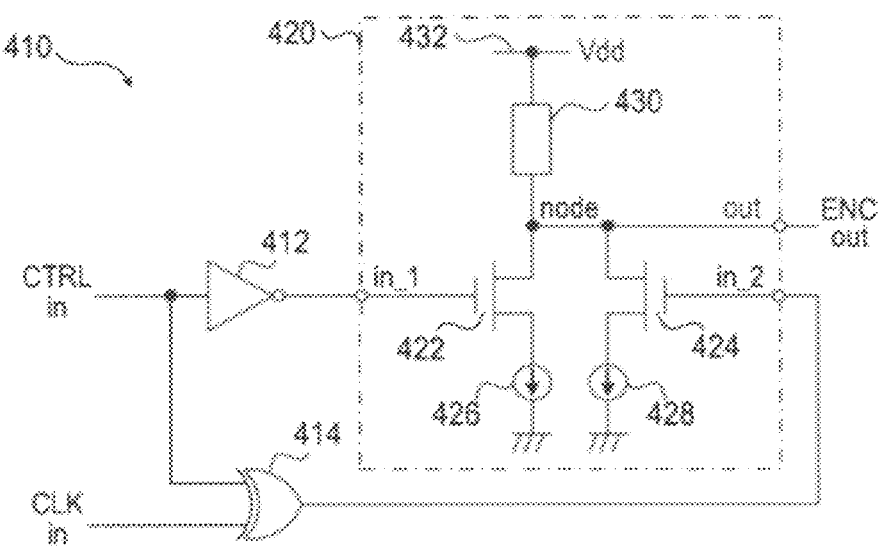
FIG.11B
STATE TRANSITION DIAGRAM
| CTRL in | CLK in | 422 gate | 424 gate | ENC out | Freq |
|---|---|---|---|---|---|
| 0 | 0 | 1 | 0 | 0 | FC |
| 0 | 1 | 1 | 1 | -1 | FL |
| 1 | 0 | 0 | 1 | 0 | FC |
| 1 | 1 | 0 | 0 | +1 | FH |
FIG.11C
WAVEFORM DIAGRAM
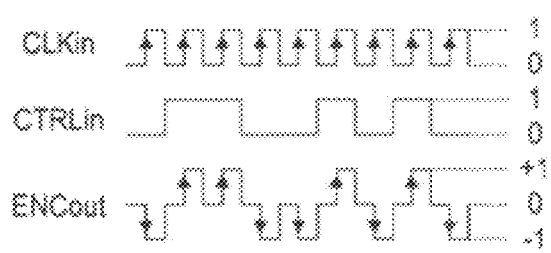
FIG.11D
FREQUENCY ARRANGEMENT DIAGRAM
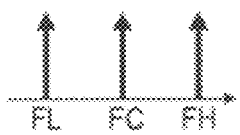

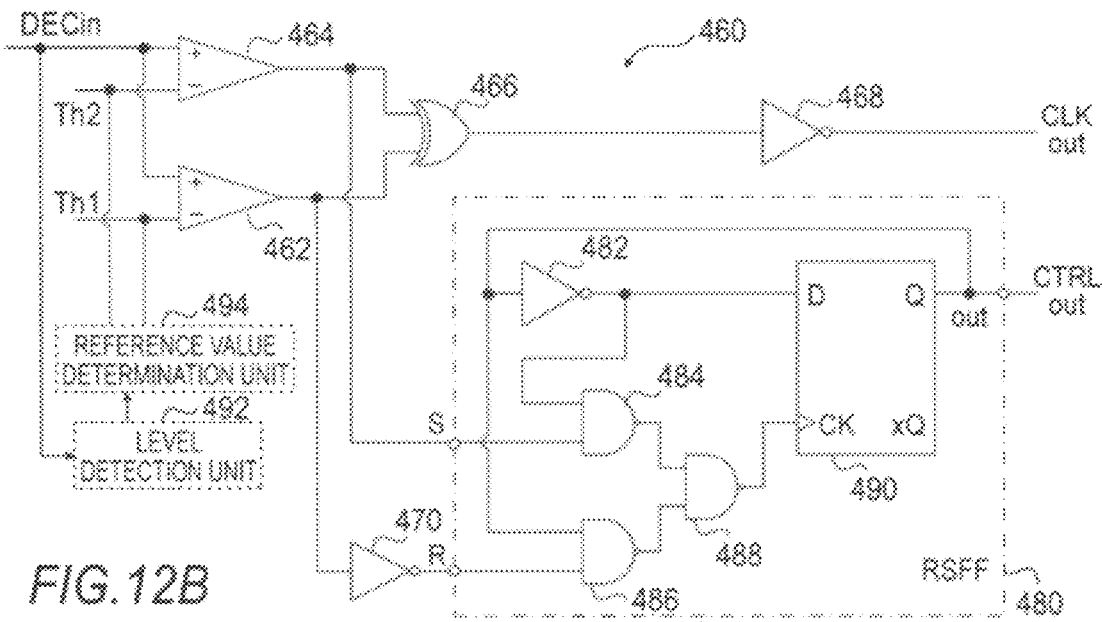
FIG. 12A <DEMODULATION UNIT> CIRCUIT DIAGRAM
FIG. 12B STATE TRANSITION DIAGRAM
| Freq | DECin | 470in =462 out | R in | S in= 464 out | 482 out | 484 out | 486 out | 488 out | CTRL out | CLK out |
|---|---|---|---|---|---|---|---|---|---|---|
| FH→FC | +1→0 | 1 | 0 | 1→0 | 1→0 | 0→1 | 1 | 1→0 | 0 | ⎍ |
| FC→FH | 0→+1 | 1 | 0 | 0→1 | 1→0 | 1→0 | 1 | 0→1 | 0→1 | ⎎ |
| FC→FL | 0→−1 | 1→0 | 0→1 | 0 | 0→1 | 1 | 1→0 | 0→1 | 0 1→0 | ⎎ |
| FL→FC | −1→0 | 0→1 | 1→0 | 0 | 1→0 | 1 | 1 0→1 | 0 1→0 | 0 | ⎍ |
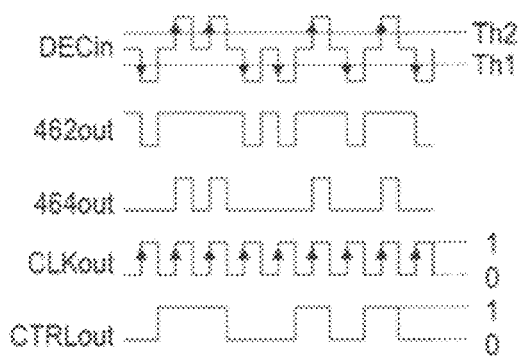
FIG. 12C WAVEFORM DIAGRAM

<ELECTRONIC DEVICE (FIRST EXAMPLE):
APPLICATION EXAMPLE TO IMAGING DEVICE 500>

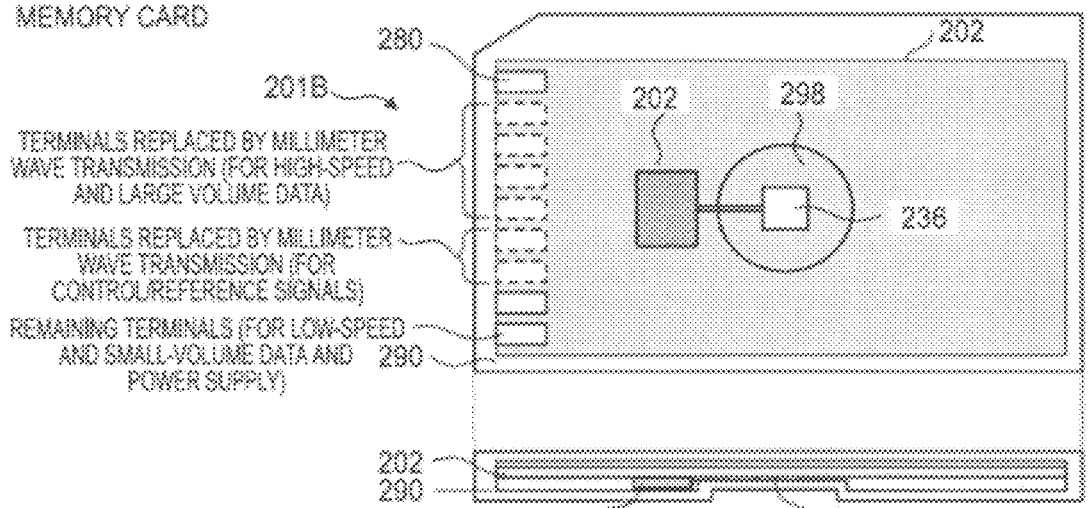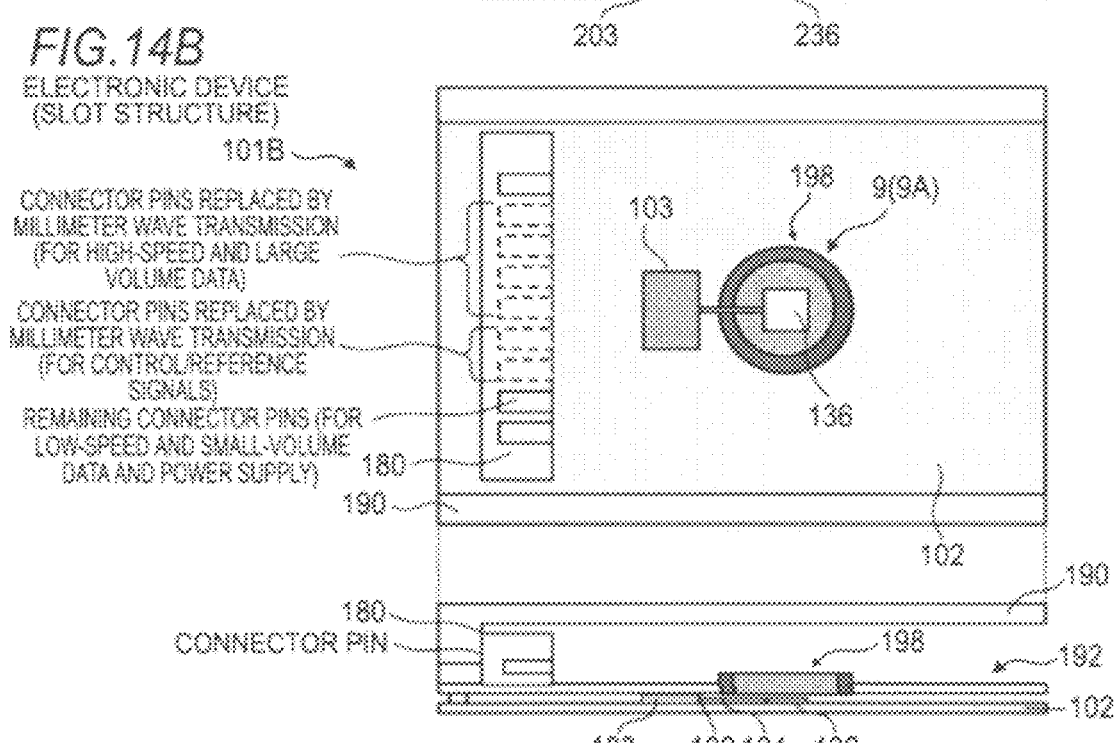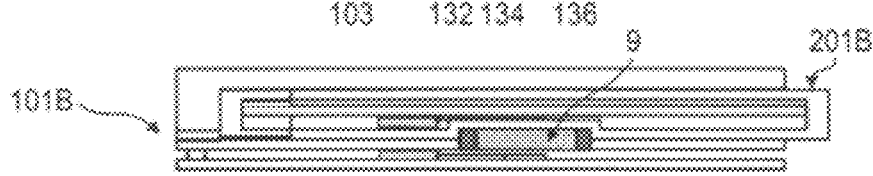

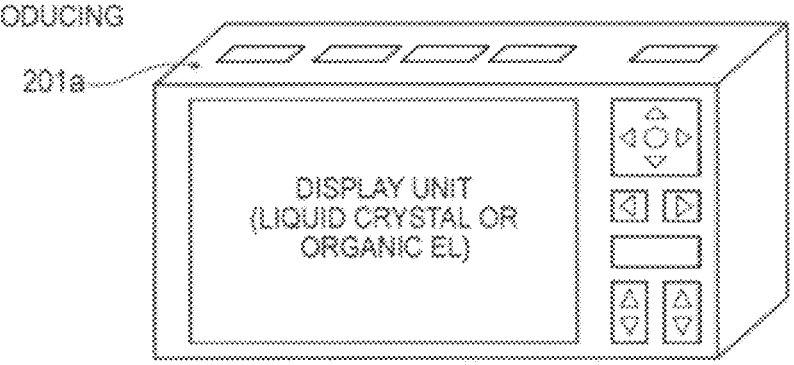
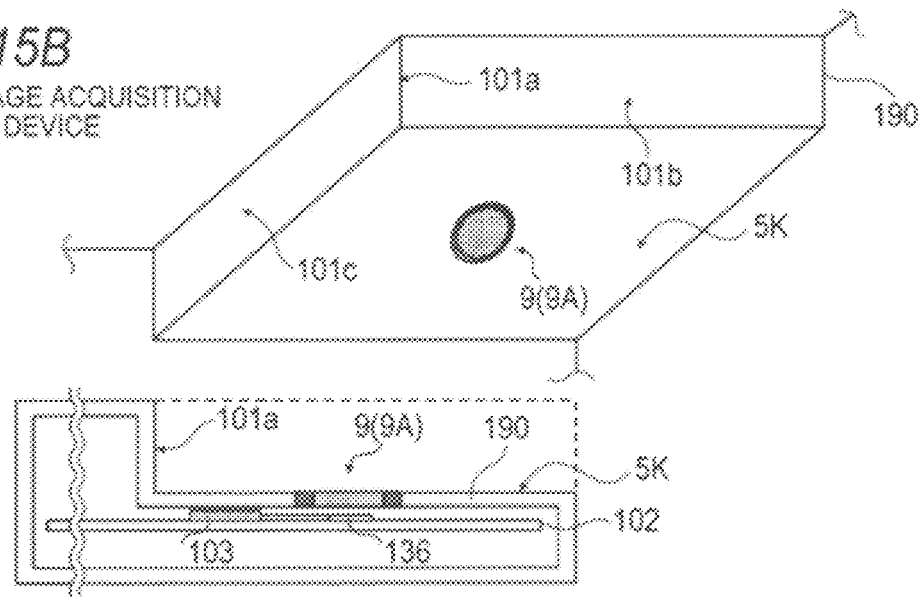
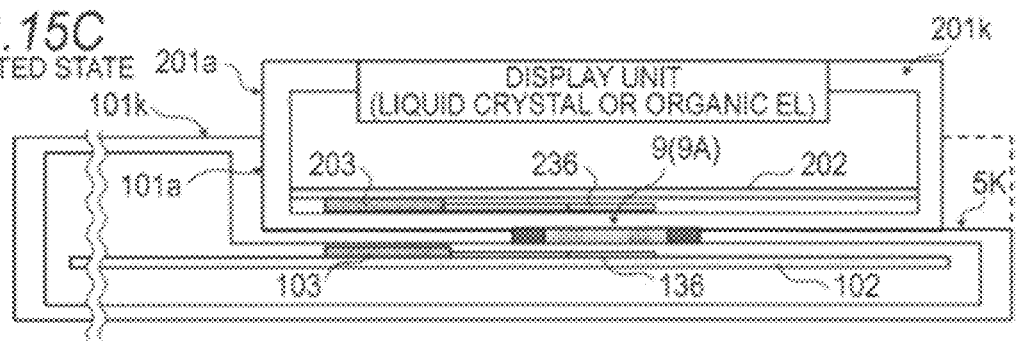

FIRST COMPARATIVE EXAMPLE (EXAMPLE 1)

FIRST COMPARATIVE EXAMPLE (EXAMPLE 2)

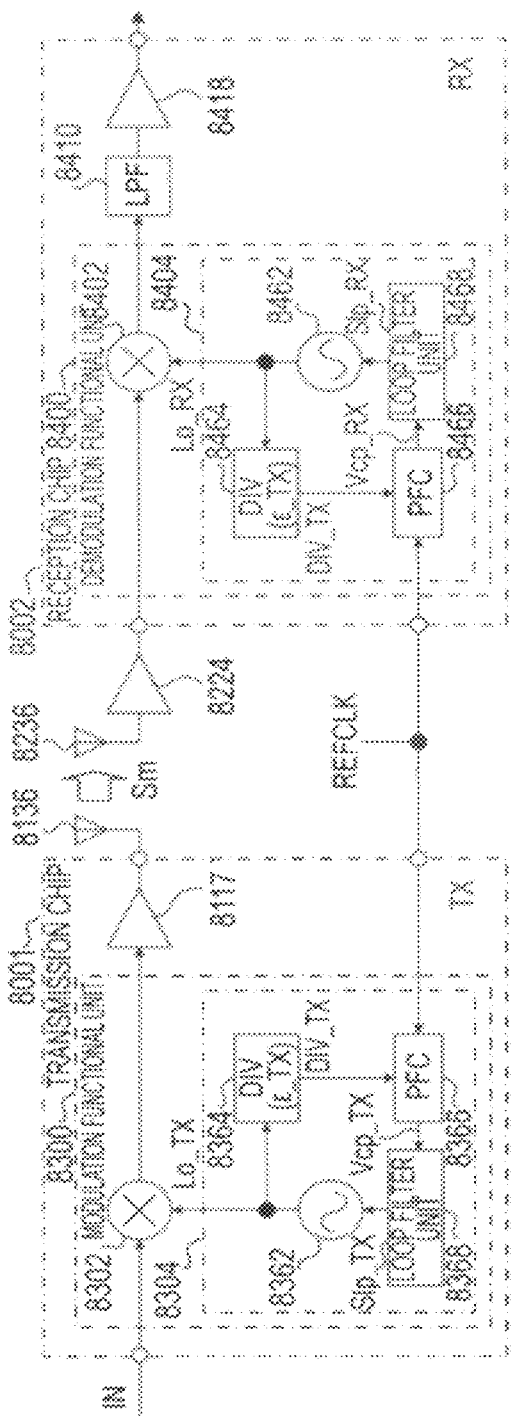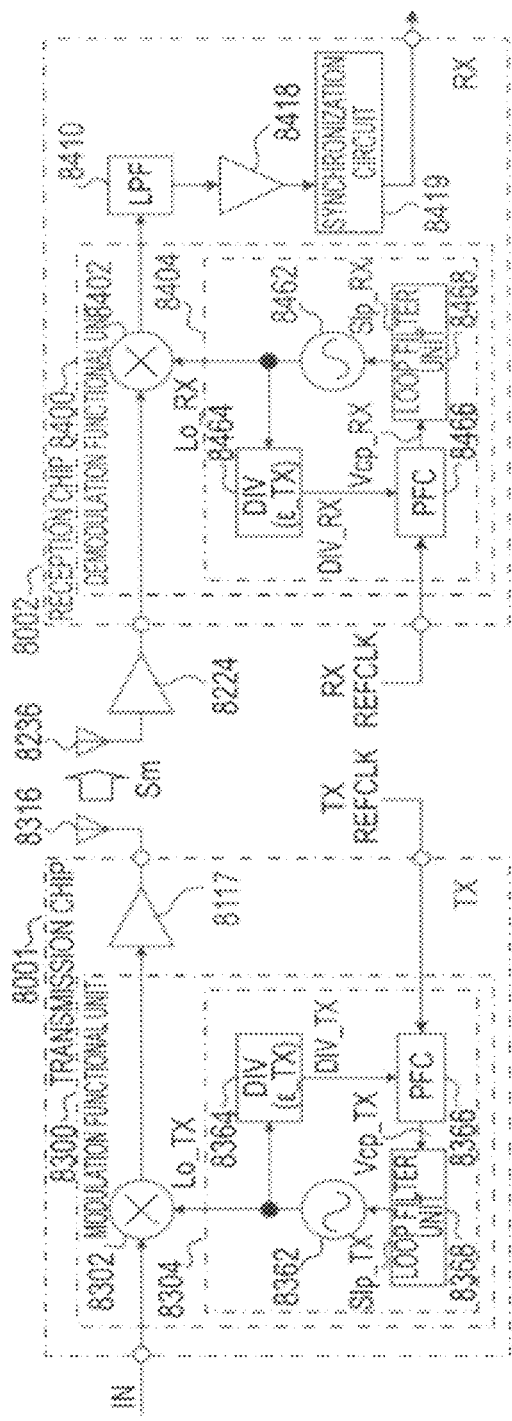
FIG. 17A SECOND COMPARATIVE EXAMPLE (EXAMPLE 1)
FIG. 17B SECOND COMPARATIVE EXAMPLE (EXAMPLE 2)

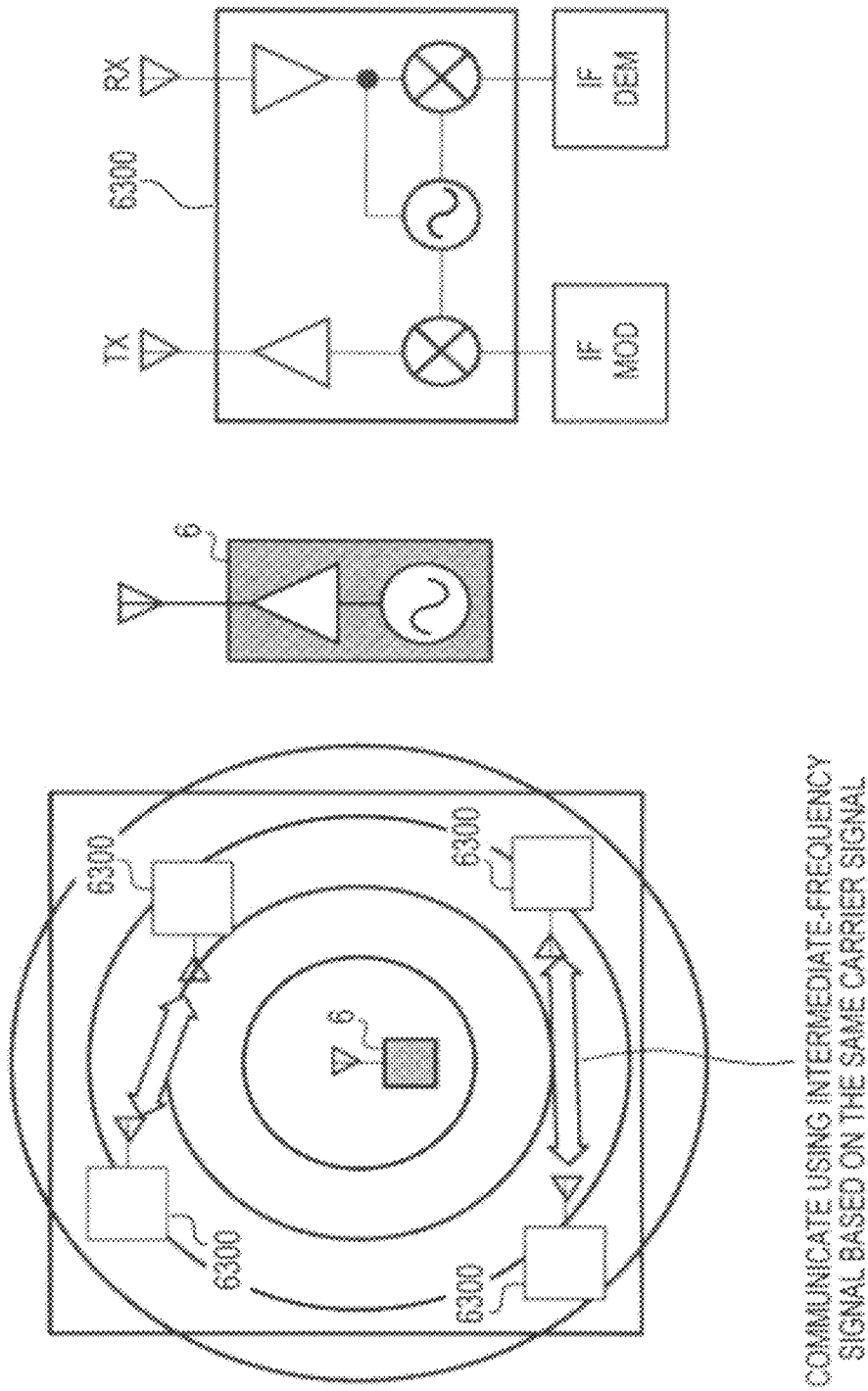

SIGNAL TRANSMISSION DEVICE, ELECTRONIC DEVICE, AND SIGNAL TRANSMISSION METHOD

FIELD

The present disclosure relates to a signal transmission device, an electronic device, and a signal transmission method. More specifically, the present disclosure relates to a technique of transmitting a control signal when performing signal processing using the control signal.

BACKGROUND

In electronic devices, signal processing is sometimes performed based on a control signal. In some cases, signal processing is performed using a reference signal. In such a case, how to provide (supply) the control signal or the reference signal to circuit functional units which require the signal becomes an issue.

JP-A-2003-244016 discloses a method in which a local oscillation signal of a millimeter band is transmitted as a reference signal to respective chips, and the respective chips transmit and receive an intermediate frequency-band signal by up-converting the frequency to the millimeter band using the common local oscillation signal received by the respective chips.

However, this method is restricted to communication which uses intermediate frequency-band signals, and signal processing circuits for processing signals subsequent to the intermediate frequency-band signals are required. In addition, since the local oscillation signal itself is shared, only one frequency can be used as the local oscillation signal. Although JP-A-2003-244016 discloses a technique of transmitting the local oscillation signal as a reference signal, there is no description of wireless transmission of a control signal.

SUMMARY

It is therefore desirable to provide a technique of wirelessly transmitting the control signal while achieving effective use of frequencies when wirelessly transmitting a transmission subject signal between signal processing units.

A signal transmission device according to a first embodiment of the present disclosure includes at least one of a first communication device that transmits a control signal as a wireless signal and a second communication device that receives the wireless signal transmitted from the first communication device to reproduce the control signal. The respective signal transmission devices disclosed in the dependent claims of the signal transmission device according to the first embodiment of the present disclosure define new advantageous specific examples of the signal transmission device according to the first embodiment of the present disclosure.

An electronic device according to a second embodiment of the present disclosure relates to so-called intra-device or inter-device signal transmission. In regard to intra-device signal transmission, the electronic device includes a first communication device that transmits a control signal as a wireless signal; a second communication device that receives the wireless signal transmitted from the first communication device to reproduce the control signal; a transmitting device that transmits a transmission subject signal; and a receiving device that receives a wireless signal transmitted from the transmitting device to reproduce the transmission subject signal, in which the first and second communication devices, the transmitting device, and the receiving device are included in one housing. In regard to inter-device signal transmission, the electronic device includes a first electronic device in which at least one of a transmitting device that transmits a transmission subject signal and a receiving device that receives a wireless signal transmitted from the transmitting device to reproduce the transmission subject signal, and a first communication device that transmits a control signal for controlling a communication counterpart of the transmitting device or the receiving device as a wireless signal are disposed in one housing; and a second electronic device in which a receiving device serving as a communication counterpart of the transmitting device in the first electronic device or a transmitting device serving as a communication counterpart of the receiving device in the first electronic device, and a second communication device that receives a wireless signal transmitted from the first communication device to reproduce the control signal are disposed in one housing, in which the transmission subject signal is transmitted as a wireless signal between the first and second electronic devices.

A signal transmission method according to a third embodiment of the present disclosure includes causing a transmitting device to transmit a transmission subject signal as a wireless signal; causing a receiving device to receive the wireless signal transmitted from the transmitting device to reproduce the transmission subject signal; causing a first communication device to transmit a control signal for controlling at least one of the transmitting device and the receiving device as a wireless signal separately from the wireless signal for the transmission subject signal which is transmitted between the transmitting device and the receiving device; and causing a second communication device to receive the wireless signal transmitted from the first communication device to reproduce the control signal and supply the reproduced control signal to the transmitting device or the receiving device.

In each of the signal transmission device according to the first embodiment, the electronic device according to the second embodiment, and the signal transmission method according to the third embodiment, the wireless signal for the control signal is transmitted separately from a wireless signal for a transmission subject signal which is transmitted between a third communication device (a transmitting device for the transmission subject signal) and a fourth communication device (a receiving device for the transmission subject signal).

When wirelessly transmitting the transmission subject signal, since the control signal is transmitted as a wireless signal different from that of the transmission subject signal, it is not necessary to convert a low data rate control signal to a high data rate control signal. Moreover, the utilization efficiency of frequencies is not decreased, and a dispersion processing circuit is not necessary. Accordingly, unnecessary power is not consumed.

According to the signal transmission device of the first embodiment, the electronic device of the second embodiment, and the signal transmission method of the third embodiment, it is possible to transmit a low data rate control signal and a high data rate transmission subject signal wirelessly while achieving efficient use of frequencies.

BRIEF DESCRIPTION OF THE DRAWINGS

FIGS. 3A to 3C are diagrams illustrating the configuration of the combination of a signal transmission device and a control signal transmitting device.

FIGS. 4A to 4C are diagrams illustrating the configuration of the combination of a signal transmission device and a control/reference signal transmission device.

FIGS. 5A and 5B are diagrams illustrating a basic configuration of the control signal transmitting device.

FIGS. 6A and 6B are diagrams illustrating a basic configuration of the control/reference signal transmission device.

FIG. 7 is a diagram illustrating a modulation functional unit and a demodulation functional unit of the signal transmission device.

FIGS. 8A and 8B are diagrams illustrating an electronic device according to a first exemplary embodiment.

FIGS. 9A and 9C are diagrams illustrating an electronic device according to a second exemplary embodiment.

FIGS. 10A to 10C are diagrams illustrating an electronic device according to a third exemplary embodiment.

FIGS. 11A to 11D are diagrams illustrating a configuration example of an encoding unit and the operation thereof.

FIGS. 12A to 12C are diagrams illustrating a configuration example of a decoding unit and the operation thereof.

FIGS. 14A to 14C are diagrams illustrating a second example of the electronic device according to the fourth exemplary embodiment.

FIGS. 15A to 15D are diagrams illustrating a third example of the electronic device according to the fourth exemplary embodiment.

FIGS. 17A and 17B are diagrams illustrating a second comparative example.

FIG. 18 is a diagram illustrating a third comparative example.

DETAILED DESCRIPTION

Figure 1:
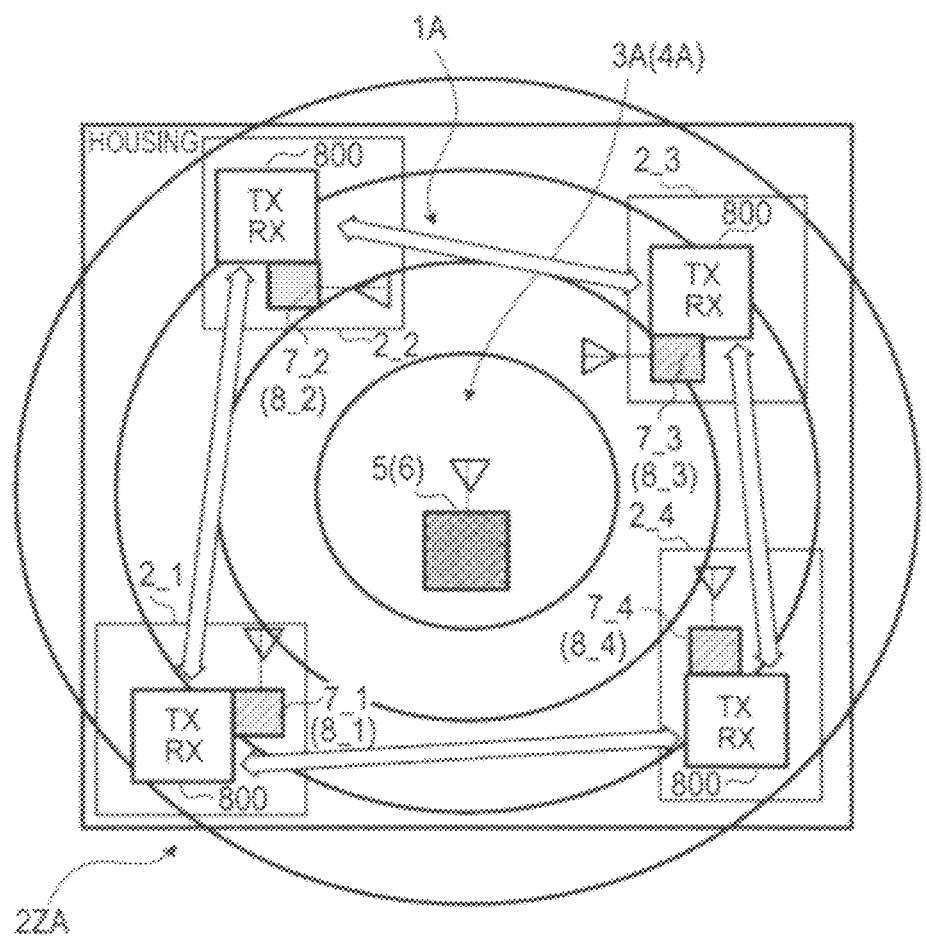
FIG. 1 is a diagram illustrating a basic configuration example (first example) of a signal transmission device according to the present embodiment.

The exemplary embodiments of the present disclosure will be described below with reference to the accompanying drawings. When a distinction is made between respective functional elements, such elements will be denoted by reference numerals such as a letter or "_@" (@ is a number). Where no particular distinction is made therebetween for description, such reference numerals will be omitted. The same holds true for the drawings.

The description will be given in the following order.
1. Overview
2. Transmission processing system: Basic
3. Combination of communication devices
4. Control signal transmission device
5. Control/reference signal transmission device
6. Signal transmission device
7. Specific application example
First exemplary embodiment: Wireless transmission of transmission subject signal and control signal
Second exemplary embodiment: Wireless transmission of transmission subject signal, control signal, and reference signal
Third exemplary embodiment: Second exemplary embodiment plus 3-valued FSK
Fourth exemplary embodiment: Specific application example to electronic device
8. Comparison with comparative example
<Overview>

In the following description, a communication device is sometimes appropriately referred to as a communication unit. Moreover, a signal transmission device (wireless transmission device) which does not include a control signal transmitting device or a control/reference signal transmission device is a narrowly defined signal transmission device, and a communication device which includes the narrowly defined signal transmission device and a control signal transmitting device or a control/reference signal transmission device is a broad-sense signal transmission device. That is, a signal transmission device of the present embodiment includes a transmission device that transmits a control signal or a control signal and a reference signal as well as a transmission device (the narrowly defined signal transmission device) that transmits a general transmission subject signal. Moreover, the signal transmission device includes a transmitting-side communication device and a receiving-side communication device. For example, the signal transmission device includes a control signal transmitting device and a control signal receiving device in regard to transmission of a control signal. Moreover, the signal transmission device includes a control/reference signal transmitting device and a control/reference signal receiving device in regard to transmission of a control signal and a reference signal. Each of the signal transmission devices may be provided as a semiconductor integrated circuit. Furthermore, the signal transmission device may be configured as an electronic device in which respective units are included in a housing. Alternatively, the signal transmission device may be configured as an electronic device which includes a first electronic device in which a part of the respective units is included in one housing and a second electronic device in which the remaining part of the respective units is included in the other housing. That is, respective devices and electronic devices may be configured as a single body or may be configured as a combination of a plurality of bodies. For example, a plurality of electronic devices may be integrated to form a whole electronic device.

In electronic devices, signal processing is sometimes performed based on a control signal. In some cases, signal processing is performed using a reference signal. In such a case, how to provide (supply) the control signal or the reference signal to circuit functional units which require the signal to become an issue. For example, when two signal processing units are separated from each other, and one signal processing unit wirelessly transmits a high data rate transmission subject signal such as an image signal to the other signal processing unit, a method of transmitting a control signal together with the transmission subject signal when transmitting the control signal to one signal processing unit or both can be considered. In this case, in order to wireless transmit the control signal which is low data rate information together with the high data rate transmission subject signal, a method of dispersing the low data rate information using a dispersion processing circuit to convert into high data rate information and then transmitting the high data rate control signal can be considered. However, with this method it is difficult to achieve effective use of frequencies. Therefore, in the present embodiment, a technique of wirelessly transmitting the control signal while achieving effective use of frequencies when wirelessly transmitting the transmission subject signal between signal processing units is proposed hereinbelow.

[Signal Transmission Device and Signal Transmission Method]

According to a configuration of the present embodiment corresponding to the first and third embodiments, a signal transmission method includes at least one of a first communication device (a transmitting device for a control signal, hereinafter also referred to as a "control signal transmitting device") and a second communication device (a receiving device for a control signal, hereinafter also referred to as a "control signal receiving device") that wirelessly transmit a control signal for controlling an operation of a communication device (communication unit) that wirelessly transmits a general transmission subject signal separately from a wireless signal for the transmission subject signal. The first communication device supplies the control signal to at least one of a third communication device that transmits a transmission subject signal as a wireless signal and a fourth communication device that receives the wireless signal transmitted from the third communication device to reproduce the transmission subject signal. The second communication device supplies the reproduced control signal to the third or fourth communication device. In a basic configuration of the signal transmission device according to the present embodiment corresponding to the first and third embodiments, the signal transmission device may not include the transmitting device and the receiving device for the transmission subject signal, for wirelessly transmitting the general transmission subject signal.

The signal transmission device for the transmission subject signal includes a transmitting-side (third) communication device (a transmitting device for the transmission subject signal) that transmits the general transmission subject signal as a wireless signal and a receiving-side (fourth) communication device (a receiving device for the transmission subject signal) that receives the wireless signal transmitted from the transmitting-side communication device to reproduce the transmission subject signal. A control signal transmitting device that wirelessly transmits a control signal for controlling at least one of the transmitting-side communication device and the receiving-side communication device includes a first communication device (control signal transmitting device) that transmits a control signal for controlling at least one of the transmitting-side communication device and the receiving-side communication device as a wireless signal and a second communication device (control signal receiving device) that receives the wireless signal transmitted from the control signal transmitting device to reproduce the control signal and supplies the control signal to the transmitting-side communication device or the receiving-side communication device.

The signal transmission device according to the present embodiment corresponding to the first and third embodiments may include at least one of the control signal transmitting device and the control signal receiving device. As will be described later, both the control signal transmitting device and the control signal receiving device may be included in one housing to form one electronic device, and alternatively, a first electronic device including the control signal transmitting device and a second electronic device including the control signal receiving device may form a whole electronic device.

As an embodiment of using the control signal, the control signal may be used for controlling the transmission state of the wireless signal for the transmission subject signal. For example, the control signal can be used for controlling various signal processing operations or controlling the transmission state of the wireless signal for the transmission subject signal. In the former case, the control signal may be used for performing control in accordance with the content of signal processing. In the latter case, for example, the control signal is used for setting a carrier frequency of the wireless signal for the transmission subject signal and setting the transmission power (transmission output level). By setting the carrier frequency or the transmission power appropriately, the quality of the transmission signal and the power consumption can be controlled appropriately.

The purpose of setting (managing) the transmission power (transmission signal level) appropriately lies in controlling the transmission power so as not to becomes excessively high or low or controlling the SNR (Signal Noise Ratio or S/N) so as not to become excessively low. By appropriately controlling the transmission output level based on transmission characteristics (communication environment) such as a transmission distance or the state of a transmission path associated with an arrangement of a transmitting device and a receiving device, it is possible to realize communication with low power consumption (preferably with less undesirable and unnecessary radiation) while maintaining the transmission signal level to be as low as necessary and maintaining a transmission signal quality to be at a constant level.

As a mechanism for controlling the transmission power, various methods may be used from the perspective of how to determine a setting level, for example, a method of using fixed setting (so-called preset setting) or a method of using automatic setting. When there is a plurality of communication channels, and the transmission characteristics of the respective communication channels are different (for example, the transmission distance between a transmitting device and a receiving device is different), the magnitudes of wireless signals transmitted from the transmission units of the respective transmission channels are set to be different.

For example, a first form adopts a method of presetting the transmission output level based on the transmission characteristics (communication environment) between a transmitting device and a receiving device. In this case, as a preferred embodiment, a transmission characteristic index detector may be provided so as to detect the state of transmission characteristics between a transmission chip which is a transmitting device and a reception chip which is a receiving device, and the transmission output level on the transmission chip side may be preset based on a transmission characteristic index signal which is the detection result. For example, the transmission characteristic index detector is provided on the reception chip side (in this case, the transmission characteristic index detector may not be incorporated into the reception chip) to detect the state of a received wireless signal, and the transmission output level on the transmission chip side is preset based on the state detection signal which is the detection result. The control signal transmitting device plays a role in this presetting. If the reception signal level has a certain correspondence to SNR in such a way that the SNR decreases when the reception signal level is excessively high or low, the use of the reception signal level as a determination index is equivalent to the use of SNR as the determination index. In a system configuration where the reception signal level and the SNR do not have a certain correspondence, the SNR-based level control may be performed, for example, using an error rate or the like as the determination index instead of the reception signal level. That is, in the first form, similarly to a second form described later, a detection mechanism (transmission characteristic index detector) for detecting a determination index reflecting the actual transmission characteristics such as a reception signal level or SNR is provided on the reception chip side, and the output level on the transmitting-side is manually set based on the detection result.

Although the first form does not adopt an automatic control mechanism unlike the second form, when presetting the transmission signal level, the reception signal level and the SNR on the receiving-side are referenced as the determination index. Since the reception signal level and the SNR change depending on the transmission characteristics such as a transmission distance or the state of a transmission path associated with an arrangement of a transmitting device and a receiving device, rather than directly determining the distance between a transmitting device and a receiving device, the transmission signal level is controlled using the reception signal level and the SNR reflecting the actual transmission characteristics as a determination index. That is, one of which the transmission output level is variable and of which the power consumption decreases by decreasing the transmission output level is used as the transmission chip, and the transmission output level is appropriately set so that the reception state is in an appropriate state by referencing the reception signal level and the SNR which change depending on the transmission characteristics such as a transmission distance or the state of a transmission path associated with an arrangement of a transmitting device and a receiving device. For example, by decreasing the transmission output level when the reception signal level (namely, the reception intensity) is high and increasing the transmission output level when the reception signal level is low, the transmission output level is set to be an optimal level so that the reception signal level does not become excessively high or low.

In the second form, a detection mechanism (transmission characteristic index detector) that detects the actual transmission characteristics such as the reception signal level or the SNR is provided on the reception chip side, the transmission output level on the transmission chip side is fed back by referencing the level detection signal which is the detection result. Although the control unit that performs feedback control may be disposed at an optional position, the control unit is preferably disposed on the transmission chip side. According to the second embodiment, a system is formed by a transmitter, a receiver, and a control unit, and the output level of the transmitter is automatically controlled so as to be an appropriate level based on the detection result by the transmission characteristic index detector. The control signal transmitting device performs the feedback control. Although the second form is different from the first form in that automatic control is realized through feedback, the purpose is the same as the first form. That is, in any of the first and second forms, the transmission output level is set to a level as low as necessary, so that an output amplifier is operated with low power consumption, and low-power consumption communication is realized. In the first form, since the feedback control is not performed, it cannot be said that the transmission output level is always controlled to be an appropriate level when the communication environment changes. In contrast, in the second form, since the feedback control is performed, even when the communication environment changes, it is possible to control the transmission output level to be always an appropriate level.

In any of the embodiments, by setting the output level of the transmitter to a level as low as necessary taking the communication environment (communication range or transmission path characteristics) into consideration, since the output of the transmitter can be decreased to the lowest level and used, it is possible to decrease the power consumption of the transmission output amplifier. By operating the transmission output amplifier with low power consumption, it is possible to realize low-power consumption communication. Since the input level to the receiver becomes constant, it is possible to relieve tolerance to strong input signals and also to decrease the power consumption of the receiver. Since the transmission output level is as low as necessary, radiation outside the device is also suppressed.

The third embodiment adopts a configuration that deals with bidirectional communication. In this case, as a mechanism for controlling the transmission power, the first and second forms may be employed solely or in combination. For example, the first form may be used to deal with any of the bidirectional communication, or the second form may be used to deal with any of the bidirectional communication. Alternatively, the first form may be used to deal with only one of the bidirectional communication and the second form may be used to deal with the other of the bidirectional communication. Preferably, the second form is used to deal with any of the bidirectional communication.

In a general communication system without being limited to the present embodiment, a communication range is a distance corresponding to the lowest reception sensitivity level on the receiving side. Thus, when constructing a signal transmission device in the present embodiment, in the case of a signal transmission device where a transmission chip and a reception chip are in a one-to-one correspondence, the transmission output level may be controlled based on the lowest reception sensitivity level of one reception chip.

On the other hand, when a plurality of reception chips are disposed with respect to one transmission chip, it is important to take the reception signal levels of the respective reception chips into consideration. In this case, various methods may be adopted in regard to how the output level of one transmission chip will be controlled. For example, there may be two contradictory methods: one is to control the transmission output level so as to correspond to a reception chip having the highest reception sensitivity (those reception chips having the reception signal level lower than the lowest reception sensitivity level are ignored, or cannot receive signals), and the other method is to control the transmission output level so as to correspond to a reception chip having the lowest reception sensitivity (reception chips having excessively high reception sensitivity are ignored). That is, even when "balance is achieved" on N receiving sides, if it is to be ensured that signals are received by all the assumed reception chips, the method of controlling the transmission output level so as to correspond to a reception chip having the highest reception sensitivity cannot be adopted. When the transmission output level is controlled so as to correspond to a reception chip having the lowest reception level, the other reception chips may have excessively high reception sensitivity. Although it is difficult to say which one is optimal, it is preferable to control the transmission output level so as to correspond to a reception chip having the lowest reception sensitivity so that all assumed reception chips can receive signals and then cause reception chips having excessively high reception sensitivity to attenuate the received signals and perform demodulation processing.

In this case, when the transmission signal level control described above is not applied, the output of the transmitter is maintained to be a high level, and the receiving side obtains a constant baseband signal by detecting the output signal and performing gain control in the receiver. However, when the communication range is short, the communication is performed with an unnecessarily high transmission output level, and the power consumption is also large. Thus, unnecessary power is consumed. Moreover, since the receiver needs to receive a strong input signal, a circuit with good linearity is required, and the power consumption of the receiver also increases. When the transmission power is large, external radiation increases.

In contrast, when the transmission signal level control as described above is applied, since the transmission output level is controlled to be an appropriate level in accordance with the transmission characteristic between a transmitting device and a receiving device, the above problems can be solved. In particular, in the case of intra-device or inter-device signal transmission, since signal transmission is performed between fixed positions or in known positional relationship in which the transmission characteristics such as a distance or the state of a transmission path between a transmitting device and a receiving device are specified, the following advantages are obtained.

1) It is easy to properly design a propagation channel (waveguide structure) between the transmitting side and the receiving side.

2) Excellent transmission with higher reliability than free space transmission can be realized by designing the dielectric structure of a transmission path coupling unit that seals the transmitting side and the receiving side and the propagation channel in conjunction with each other.

3) Since the control of a controller (for example, a gain control unit) that controls wireless transmission does not need to be performed dynamically, adaptively, and frequently unlike general wireless communication, control overhead can be reduced as compared to general wireless communication. As a result, miniaturization, lower power consumption, and higher speed can be achieved.

4) When wireless transmission characteristics are calibrated at the time of manufacturing or designing to understand individual fluctuations or the like, since the data can be referenced, the setting of the transmission output level can be easily realized through presetting or static control.

According to a configuration of the present embodiment corresponding to the first and third embodiments, preferably, the reference signal used by the communication device that wirelessly transmits the general transmission subject signal may be transmitted as a wireless signal separately from the wireless signal for the transmission subject signal. In this case, first, the wireless signal for the reference signal may be transmitted separately from the wireless signal for the control signal as well as the wireless signal for the transmission subject signal, and a wireless signal for a combined signal of the control signal and the reference signal may be transmitted separately from the wireless signal for the transmission subject signal.

In the former case, generally, a form in which the matters described in relation to the "control signal" are replaced with those related to the "reference signal" may be added. That is, a reference signal transmission device that wirelessly transmits a reference signal used in at least one of a transmitting-side communication device and a receiving-side communication device includes a communication device (reference signal transmitting device) that transmits a reference signal used in at least one of the transmitting-side communication device and the receiving-side communication device as a wireless signal and a communication device (reference signal receiving device) that receives the wireless signal transmitted from the reference signal transmitting device to reproduce the reference signal and supplies the reference signal to the transmitting-side communication device or the receiving-side communication device. In this case, the reference signal transmission device may also include at least one of the reference signal transmitting device and the reference signal receiving device. In this case, the control signal transmitting device and the reference signal transmission device form the control/reference signal transmission device, the control signal transmitting device and the reference signal transmitting device form the control/reference signal transmitting device that wirelessly transmits the control signal and the reference signal, and the control signal receiving device and the reference signal receiving device form the control/reference signal receiving device.

On the other hand, in the latter case, since one combined signal is transmitted as a wireless signal separately from the wireless signal for the transmission subject signal, substantially the wireless signal for the control signal and the wireless signal for the reference signal are transmitted separately from the wireless signal for the transmission subject signal. In this case, two embodiments can be adopted depending on where the combined signal of the control signal and the reference signal will be generated. According to a first embodiment, the signal transmission device includes a signal combination unit that generates one combined signal representing the control signal and the reference signal based on the control signal and the reference signal, and a signal separation unit that receives and reproduces a wireless signal to separate the control signal and the reference signal from the combined signal. In this case, the separated control signal and reference signal are supplied to the communication device that transmits the transmission subject signal as the wireless signal or the communication device that receives the wireless signal to reproduce the transmission subject signal. The signal combination unit and the signal separation unit may be disposed in a control signal communication device and may be disposed in the other communication device.

According to a second embodiment, the arrangement position of the signal combination unit and the signal separation unit is restricted to the control signal communication device. That is, the communication device that transmits the control signal as the wireless signal includes a signal combination unit that generates one combined signal representing the control signal and the reference signal based on the control signal and the reference signal, and transmits the generated combined signal as a wireless signal separately from the wireless signal for the transmission subject signal. The communication device that receives the wireless signal to reproduce the control signal includes a signal separation unit that receives and reproduces the wireless signal to separate the control signal and the reference signal from the reproduced combined signal, and supplies the separated control signal and reference signal to the communication device that transmits the transmission subject signal as the wireless signal or the communication device that receives the wireless signal to reproduce the transmission subject signal.

As an embodiment of using the reference signal, the reference signal may be used for defining the operation timing of signal processing. For example, the reference signal may be used for achieving synchronization of the respective signal processing operations between the transmitting side and the receiving side in relation to the transmission subject signal. For example, the reference signal is used for setting the timing of various signal processing operations, generating a modulation carrier signal when generating the wireless signal for the transmission subject signal, and generating a demodulation carrier signal when receiving the wireless signal for the transmission subject signal to reproduce the transmission subject signal. That is, the reference signal is used for achieving synchronization between the transmitting-side signal processing operation (including modulation processing) associated with the transmission subject signal and the receiving-side signal processing operation (including demodulation processing) associated with the transmission subject signal. By achieving synchronization between the transmission and reception operations, it is possible to obtain appropriate transmission signal quality.

The following matters may be taken into consideration in relation to wireless transmission of the reference signal. In electronic devices, signal processing is sometimes performed based on a reference signal (reference clock). In such a case, when there are a number of circuit functional units which require the reference signal, how to provide (supply) the reference signal to the respective circuit functional units becomes an issue. For example, when a plurality of chips (semiconductor integrated circuits) which require a reference signal generated by a crystal oscillator or the like as the clock of a digital circuit or the reference of a synthesize is required in an electronic device, an oscillator may be provided to each chip. However, in this case, a plurality of oscillation signals may interfere with each other, and noise countermeasures are required. When the same reference signal is shared and transmitted to respective destinations, no interference will occur, and noise countermeasures will not be required. However, in this case, wirings for sharing the reference signal and transmitting the same to respective destinations are required, and the influence of signal distortion due to reflection or the like may increase. When the reference signal level increases, the problem of unnecessary radiation may occur. For example, LVDS (Low Voltage Differential Signaling) is known as a method of realizing high-speed signal transmission between electronic devices disposed at a relatively short distance (for example, several centimeters to between 10 and 20 centimeters) or within an electronic device. The reference signal may be transmitted using the LVDS method. However, the LVDS method has reached its limit since the problem of signal distortion or unnecessary radiation occurs when the frequency of the reference signal increases.

Moreover, in a communication field, when performing communication using synchronous detection, the local oscillation frequencies of a transmitting device and a receiving device (also collectively referred to a transceiver) need to be synchronized. To achieve synchronization, the local oscillation signal may be generated based on the same reference signal. In this case, although synchronization of the local oscillation frequency is achieved, as described above, wirings for sharing the reference signal and transmitting the same to the transmitting device and the receiving device are required, and when the level of the reference signal increases, the problem of unnecessary radiation may occur. As another method, although synchronization may be achieved using a received baseband signal while using a local oscillation signal that is not synchronized, the circuit size and the power consumption may increase. Although JP-A-2003-244016 discloses a method in which a local oscillation signal is wirelessly transmitted as a reference signal, this method is restricted to communication which uses intermediate frequency-band signals, and signal processing circuits for processing signals subsequent to the intermediate frequency-band signals are required. In addition, since the local oscillation signal itself is shared, only one frequency can be used as the local oscillation signal. As above, it is desirable to provide a method of supplying a reference signal to respective destinations while solving the problems associated with interference, noise, signal distortion, unnecessary radiation, and usable frequencies when there are a number of circuit functional units which require the reference signal. However, such a method has not yet been developed.

As countermeasures, a configuration capable of supplying the reference signal to respective destinations while solving the problems of interference and noise may be desirable. Preferably, a configuration capable of supplying the reference signal to respective destinations while solving the problems of signal distortion and unnecessary radiation may be desirable. Furthermore, a configuration capable of enabling a plurality of frequencies to be used as the reference signal may be desirable. More preferably, a configuration capable of concurrently solving the above problems by combining the above three configurations may be desirable.

For example, the signal transmission device includes a high-frequency reference signal generation unit that generates a high-frequency reference signal having a frequency higher than an original reference signal in synchronization with the original reference signal, a low-frequency reference signal generation unit that generates a low-frequency reference signal having a frequency lower than the high-frequency reference signal in synchronization with the high-frequency reference signal, and a signal processing unit that performs signal processing based on the low-frequency reference signal. In this case, a transmitting-side communication device that wirelessly transmits the high-frequency reference signal and a receiving-side communication device that receives the wireless signal are included as a function for wirelessly transmitting the high-frequency reference signal. For example, the reference signal transmitting device includes a high-frequency reference signal generation unit that generates a high-frequency reference signal having a frequency higher than that synchronized with the original reference signal. Preferably, the reference signal transmitting device may include a high-frequency reference signal having a frequency higher than that synchronized with the original reference signal and a signal processing unit that performs signal processing based on a low-frequency reference signal having a frequency lower than that synchronized with the high-frequency reference signal. The reference signal receiving device includes a low-frequency reference signal generation unit that generates a low-frequency reference signal having a frequency lower than that synchronized with a high-frequency reference signal based on the high-frequency reference signal having a frequency higher than that synchronized with the original reference signal. Preferably, the reference signal receiving device may include a low-frequency reference signal generation unit that generates a low-frequency reference signal having a frequency lower than that synchronized with a high-frequency reference signal based on the high-frequency reference signal having a frequency higher than that synchronized with the original reference signal and a signal processing unit that performs signal processing based on the low-frequency reference signal generated by the low-frequency reference signal generation unit.

From the perspective of wirelessly transmitting the reference signal to a plurality of destinations, a plurality of low-frequency reference signal generation units and a plurality of signal processing units may be provided with respect to one high-frequency reference signal generation unit. The respective frequencies of the reference signals on the receiving sides may be different from each other. That is, the low-frequency reference signal generation unit may generate a low-frequency reference signal having a different frequency than that of the other low-frequency reference signal generation unit. The signal processing unit that uses the reference signal may include a second high-frequency reference signal generation unit that generates a second high-frequency reference signal having a frequency higher than that synchronized with the low-frequency reference signal generated by the low-frequency reference signal generation unit. For example, although a case of generating a modulation or demodulation carrier signal in regard to the wireless signal for the transmission subject signal is a typical example, the present disclosure is not limited to this. When generating a modulation or demodulation carrier signal in regard to the wireless signal for the transmission subject signal, a plurality of low-frequency reference signal generation units and a plurality of signal processing units may be provided with respect to one high-frequency reference signal generation unit, and the second high-frequency reference signal generation unit may generate a second high-frequency reference signal having a different frequency than that of the other second high-frequency reference signal unit. The signal processing unit performs communication processing in regard to the transmission subject signal using the second high-frequency reference signal generated by the second high-frequency reference signal generation unit. By providing a phase mismatch countermeasuring functional unit for suppressing the effect of a mismatch between the phase of one second high-frequency reference signal used for first signal processing and the phase of the other second high-frequency reference signal used for second signal processing corresponding to the first signal processing, the effect of the mismatch between the phases of the carrier signals on the transmitting and receiving sides may be suppressed.

The wireless signals for the control signal and the reference signal or the combined signal may be preferably modulated by a frequency shift keying (FSK) method. The FSK method only requires frequency synchronization and can be realized with a simpler circuit configuration than the other methods and is superior in power efficiency. Preferably, the frequency variation range on the transmitting side (a frequency modulation unit) may be set to be narrower than the frequency capturing range in the receiving side (a frequency demodulation unit). By doing so, it is possible to realize reliable wireless transmission of the control signal and the reference signal or the combined signal even when frequency adjustment is not performed.

When the wireless signal for the combined signal is modulated by the frequency shift keying method, the signal combination unit and the signal separation unit may be preferably configured as follows. First, it is assumed that the control signal and the reference signal are 2-valued signals. A differential amplification circuit is provided in the signal combination unit, the control signal is input to one differential input terminal thereof, and an exclusive OR signal of the control signal and the reference signal is input to the other differential input terminal. By doing so, a 3-valued combined signal is output from the output terminal of the differential amplification circuit. When the combined signal is modulated by the frequency shift keying method, a 3-valued FSK signal is obtained. The signal separation unit includes a comparing unit that compares the combined signal obtained by demodulating and reproducing the 3-valued FSK signal on the receiving side with a determination reference value and a logical circuit unit that generates the control signal and the reference signal based on the comparison result by the comparing unit. With such a simple configuration, the transmitting side can easily generate the 3-valued FSK signal serving as the wireless signal for the combined signal, and the receiving side can easily separate the control signal and the reference signal from the reproduced combined signal.

Preferably, the signal separation unit can perform separation processing appropriately regardless of the DC level of the reproduced combined signal (that is, the signal separation unit can dynamically determine the determination reference value). To realize this, the signal separation unit may include a level detection unit that receives the wireless signal modulated by the frequency shift keying method to detect a predetermined level of the reproduced combined signal and a reference value determination unit that determines the determination reference value based on the detection result by the level detection unit and a predetermined equation. The relationship between the minimum value, the maximum value, the intermediate value, and the amplitude (maximum value-minimum value) of the reproduced 3-valued combined signal (referred to as decoding data) is determined using two determination reference values: one has a value between the minimum value and the intermediate value (preferably, "minimum value+amplitude/4" or "intermediate value-amplitude/4") and the other has a value between the maximum value and the intermediate value (preferably, "maximum value-amplitude/4" or "intermediate value+amplitude/4"). When determining the respective reference values, the respective information of all of the minimum value, the maximum value, and the intermediate value may be detected. Alternatively, since the amplitude can be predicted to some extent, any one of the minimum value, the maximum value, and the intermediate value may be detected. In any case, the reference value determination unit determines the respective reference values based on the detection result and an equation corresponding to the detection result.

The wireless signals for the control signal, and the reference signal or the combined signal may be transmitted separately from the wireless signal for the transmission subject signal. The frequency of the modulation or demodulation carrier signal for wirelessly transmitting the control signal, and the reference signal or the combined signal may be the same as or different from the frequency of the modulation or demodulation carrier signal for wirelessly transmitting the transmission subject signal. Preferably, in order to reliably prevent communication disorders such as cross-modulation between the wireless signals for the control signal and the reference signal or the combined signal and the wireless signal for the transmission subject signal, these wireless signals may be modulated with a carrier frequency different from that of the wireless signal for the transmission subject signal.

According to a configuration of the present embodiment corresponding to the first and third embodiments, preferably, the wireless signal for the transmission subject signal and the wireless signals for the control signal, and the reference signal or the combined signal may have a frequency in the millimeter band. The advantages of using the millimeter band will be described later.

According to a configuration of the present embodiment corresponding to the first and third embodiments, preferably, the signal transmission device may include at least one of a transmitting-side (third) communication device (transmission subject signal transmitting device, hereinafter sometimes referred to as a "data transmitting device") that transmits the transmission subject signal as a wireless signal and a receiving-side (fourth) communication device (transmission subject signal receiving device, hereinafter sometimes referred to as a "data receiving device") that receives the wireless signal to reproduce the transmission subject signal. In this case, the following three representative embodiments are adopted as the combination of the data transmitting device and the data receiving device which form the signal transmission device for the general transmission subject signal, and the control signal transmitting device and the control signal receiving device which form the control signal transmitting device for the control signal. In the following, elements surrounded by quotation marks ("and") are disposed on the same substrate (including the substrate of a semiconductor integrated circuit) or within the same housing. 1) "data transmitting device and control signal transmitting device" and "data receiving device and control signal receiving device"; 2) "data transmitting device and control signal receiving device" and "data receiving device and control signal transmitting device"; and 3) "first data transmitting device, second data receiving device, and control signal transmitting device" and "first data receiving device, second data transmitting device, and control signal receiving device." In this case, a first transmission subject signal is wirelessly transmitted between the first data transmitting device and the first data receiving device, and a second transmission subject signal is wirelessly transmitted between the second data transmitting device and the second data receiving device.

The following three representative embodiments are adopted as the combination of the data transmitting device and the data receiving device which form the signal transmission device for the general transmission subject signal, and the transmitting-side communication device (hereinafter sometimes referred to as a "control/reference signal transmitting device") and the receiving-side communication device (hereinafter sometimes referred to as a "control/reference signal receiving device") which form the control/reference signal transmission device for the control signal and the reference signal. In the following, elements surrounded by quotation marks ("and") are disposed on the same substrate (including the substrate of a semiconductor integrated circuit) or within the same housing. 1) "data transmitting device and control/reference signal transmitting device" and "data receiving device and control/reference signal receiving device"; 2) "data transmitting device and control/reference signal receiving device" and "data receiving device and control/reference signal transmitting device"; and 3) "first data transmitting device, second data receiving device, and control/reference signal transmitting device" and "first data receiving device, second data transmitting device, and control/reference signal receiving device." In this case, a first transmission subject signal is wirelessly transmitted between the first data transmitting device and the first data receiving device, and a second transmission subject signal is wirelessly transmitted between the second data transmitting device and the second data receiving device.

According to a configuration of the present embodiment corresponding to the first and third embodiments, preferably, the transmission characteristics between a transmitting device and a receiving device may be known, and at least one of the transmitting-side communication device for the transmission subject signal and the receiving-side communication device for the transmission subject signal may include a signal processing unit that performs predetermined signal processing based on setting values and a setting value processing unit that inputs setting values for the predetermined signal processing to the signal processing unit. The signal processing includes modulation processing or demodulation processing and signal amplification processing for the wireless signal. When determining the setting values, the transmitting-side or receiving-side communication device may be controlled using the control signal from the control signal transmitting device. For example, when the arrangement positions of the transmitting-side (third) communication device and the receiving-side (fourth) communication device within one housing are not changed (in the case of intra-device communication), or when the arrangement positions of the transmitting-side communication device and the receiving-side communication device under the using state are in the predetermined state even if the transmitting-side communication device and the receiving-side communication device are disposed in different housings (in the case of inter-device wireless transmission at a relatively short distance), the transmission conditions between a transmitting device and a receiving device are not substantially changed (that is, the conditions are fixed). In this case, it is possible to understand the transmission characteristic between the transmitting-side communication device and the receiving-side communication device in advance.

In an environment where the transmission conditions between a transmitting device and a receiving device are not substantially changed (that is, the conditions are fixed), even when the setting value for defining the operation of the signal processing unit is treated as a fixed value, that is, the parameter settings are fixed, it is possible to operate the signal processing unit without any problem. By using a predetermined value (that is, a fixed value) as the setting value for the signal processing, since it is not necessary to dynamically change the parameter settings, it is possible to decrease the number of parameter calculation circuits and to reduce power consumption. Since the communication environment in the intra-device wireless transmission or the inter-device wireless transmission at a relatively short distance is fixed, it is possible to determine various circuit parameters which depend on the communication environment in advance. In an environment where the transmission conditions are fixed, even when the setting value for defining the operation of the signal processing unit is treated as a fixed value, that is, the parameter settings are fixed, it is possible to operate the signal processing unit without any problem. For example, by calculating the optimal parameters at the time of factory shipment and storing the parameters in the device, it is possible to decrease the number of parameter calculation circuits and to reduce power consumption.

There are various signal processing parameter settings. For example, when the wireless signal for the transmission subject signal and the wireless signal for the control signal are transmitted separately, the carrier frequency of the wireless signal for the transmission subject signal and the carrier frequency of the wireless signal for the control signal are set. As another example of the signal processing parameter settings, the gain (signal amplitude), the phase adjustment amount, and the frequency characteristics of a signal amplification circuit (amplitude adjustment unit) are set. The gain setting is used for setting the transmission power, the reception signal level input to the demodulation functional unit, automatic gain control (AGC), and the like. The setting of the phase adjustment amount is used for adjusting the phase so as to correspond to the delay amount of a transmission signal between the systems that transmit the control signal and the reference signal separately. The frequency characteristic setting is used when enhancing the amplitude of low-frequency components or high-frequency components in advance on the transmitting side.

For example, as a first configuration, a setting value processing unit which includes a setting value determination unit, a setting value storage unit, and an operation control unit is provided on a substrate. The setting value determining unit determines "signal processing setting values" (variables and parameters) for designating the operations of the respective functional units of a semiconductor chip. The process of determining the setting values is performed at the time of shipping a product at a factory, for example. The setting value storage unit stores the setting values determined by the setting value determination unit. The operation control unit operates the respective functional units (for example, a modulation unit or a demodulation unit, a frequency converter, a wireless signal amplification unit, or the like) of the semiconductor chip on which the signal processing unit is formed based on the setting values read from the setting value storage unit. Although the substrate in which the setting value processing unit is disposed is preferably the same as the semiconductor chip substrate, the substrate may be different from the semiconductor chip substrate. In addition, although the setting value processing unit may be provided outside the semiconductor chip, the setting value processing unit is preferably included in the semiconductor chip. In this case, the setting value processing unit is mounted on the same substrate as the substrate on which the respective functional units (a modulation unit or a demodulation unit, a frequency converter, an amplification unit, or the like) serving as the control subjects are mounted.

Moreover, as a second configuration, setting values determined at the outside of the device may be stored. In this case, an input-output interface unit is provided instead of the setting value determination unit. The input-output interface unit is an example of a setting value receiving unit that receives the setting values from the outside. The input-output interface unit performs the function of an interface to the setting value storage unit and stores the setting values supplied from the outside and reads the setting values stored in the setting value storage unit to output the same to the outside. In the case of the second configuration, the setting values are not determined by the setting value processing unit but are determined at the outside. For example, the setting values may be determined based on design parameters and an actual device state, and the setting values may be determined based on an actual working test of the device. In any case, rather than determining individual setting values for each device, common setting values may be used for the respective devices. When determining the setting values based on design parameters, common setting values are generally used. Moreover, when determining the setting values based on an actual working test on a standard device, common setting values are also used.

[Electronic Device]

In the electronic device of the present embodiment corresponding to the second embodiment, a device in which respective units are included in one housing may form one electronic device, and a plurality of devices (electronic devices) may be combined to form one whole electronic device. The signal transmission device of the present embodiment is used, for example, in an electronic device such as a digital recording and reproducing device, a terrestrial television receiver, a mobile phone, a game machine, or a computer.

When a device in which respective units are included in one housing forms one electronic device, a first communication device that receives a control signal as a wireless signal; a second communication device that receives the wireless signal transmitted from the first communication device to reproduce the control signal; a transmitting device that transmits a transmission subject signal; and a receiving device that receives a wireless signal transmitted from the transmitting device to reproduce the transmission subject signal, in which the first and second communication devices, the transmitting device, and the receiving device are included in one housing. Alternatively, when a plurality of devices (electronic devices) are combined to form one whole electronic device, a first electronic device in which at least one of a transmitting device that transmits a transmission subject signal and a receiving device that receives a wireless signal transmitted from the transmitting device to reproduce the transmission subject signal, and a first communication device that transmits a control signal for controlling a communication counterpart of the transmitting device or the receiving device as a wireless signal are disposed in one housing; and a second electronic device in which a receiving device serving as a communication counterpart of the transmitting device in the first electronic device or a transmitting device serving as a communication counterpart of the receiving device in the first electronic device, and a second communication device that receives a wireless signal transmitted from the first communication device to reproduce the control signal are disposed in one housing. In this case, the transmission subject signal is transmitted as a wireless signal between the first and second electronic devices. In any configuration of the electronic device, the transmitting-side (first) communication device for the control signal supplies the control signal to at least one of the third communication device that transmits the transmission subject signal as the wireless signal and the fourth communication device that receives the wireless signal transmitted from the third communication device to reproduce the transmission subject signal, and the receiving-side (second) communication device for the control signal supplies the reproduced control signal to the third or fourth communication device. Moreover, in this case, the wireless signal for the control signal is transmitted separately from the wireless signal for the transmission subject signal which is transmitted between the transmitting device and the receiving device.

In the signal transmission device and the electronic device of the present embodiment described hereinafter, although a carrier frequency in the millimeter band (having a wavelength of 1 to 10 millimeters) is mainly used, the present disclosure is not limited to the millimeter band but can be applied when using a carrier frequency near the millimeter band such as a submillimeter band (having a wavelength of 0.1 to 1 millimeters) or a centimeter band (having a wavelength of 1 to 10 centimeters) having longer wavelength. For example, since it is difficult to secure a required communication band just with the millimeter band, a frequency band between the submillimeter band and the millimeter band, between the millimeter band and the centimeter band, or between the submillimeter band and the centimeter band is used.

When configuring a communication device, there may be a case where the communication device includes only a transmitting-side communication device, a case where the communication device includes only a receiving-side communication device, and a case where the communication device includes both the transmitting-side communication device and the receiving-side communication device. The transmitting side and the receiving side are coupled by a wireless signal transmission path (for example, a millimeter-wave signal transmission path) so that signal transmission is performed in the millimeter band. The transmission subject signal is frequency-converted into a signal of the millimeter band which is ideal for wide-band transmission. However, in any case, the transmitting-side communication device and the receiving-side communication device are paired with each other to form the signal transmission device. Moreover, between the transmitting-side communication device and the receiving-side communication device which are disposed at a relatively short distance, the transmission subject signal is first converted into a millimeter-wave signal, and then, the millimeter-wave signal is transmitted through the millimeter-wave signal transmission path. The term "wireless transmission" in the present embodiment means transmission of signals wirelessly (through radio waves: in this example, millimeter waves) rather than through general electric wirings (simple wire lines).

The term "relatively short distance" means a distance shorter than the distance between communication devices in a field or outdoors used for broadcasting or general wireless communication, and may be a distance in which the transmission range can be substantially specified as a closed space. The term "closed space" means a space in which leakage of radio waves to the outside from the inner side of the space is small, and conversely, entrance (penetration) of radio waves into the inner side of the space from the outside is small. Typically, the term "closed space" is in a state where the entire space is surrounded by a housing (casing) having a shielding effect against radio waves. For example, the wireless transmission may be inter-substrate communication within the housing of one electronic device, inter-chip communication on the same substrate, and inter-device communication in a state where a plurality of electronic devices are integrated as in a case where one electronic device is mounted on the other electronic device. While the term "integrated" typically means a state wherein both electronic devices are completely in contact with each other by attachment, it may be a state where a transmission range between both electronic devices can be substantially specified as a closed space. Moreover, the integrated state may also include a case where both electronic devices are disposed at determined positions in a state of being separated from each other at a relatively short distance such as, for example, within several centimeters or between 10 and 20 centimeters, and thus, the electronic devices can be considered to be "substantially" integrated with each other. That is, the integrated state may be a state where leakage of radio waves to the outside from the inner side of the space which is formed by both electronic devices and in which radio waves can propagate is small, and conversely, entrance (penetration) of radio waves into the inner side of the space from the outside is small.

Signal transmission in a housing of one electronic device is referred to as intra-device (or intra-housing) signal transmission, and signal transmission in a state where a plurality of electronic devices are integrated (including "substantially integrated" in the following description) is referred to as inter-device signal transmission. In the case of the intra-housing signal transmission, a signal transmission device in which a transmitting-side communication device (communication unit or transmitting unit) and a receiving-side communication device (communication unit or receiving unit) are included in the same housing, and a wireless signal transmission path is formed between the communication units (the transmitting unit and the receiving unit) may become the electronic device itself. On the other hand, in the case of the inter-device signal transmission, a transmitting-side communication device (communication unit or transmitting unit) and a receiving-side communication device (communication unit or receiving unit) are included in the housings of different electronic devices, and when both electronic devices are disposed at determined positions and are integrated with each other, a wireless signal transmission path is formed between the communication units (the transmitting unit and the receiving unit) in both electronic devices, whereby a signal transmission device is constructed.

In the respective communication devices arranged with the millimeter-wave signal transmission path therebetween, a transmitting system and a receiving system are disposed in a paired and coupled manner with each other. By providing both the transmitting system and the receiving system in the respective communication devices, bidirectional communication can be realized. When both the transmitting system and the receiving system are provided in the respective communication devices, signal transmission between one communication device and the other communication device may be unidirectional (that is, in one direction) or bidirectional. For example, when the first communication device serves as a transmitting side and the second communication device serves as a receiving side, a first communication unit that performs the transmitting function is disposed in the first communication device, and a second communication unit that performs the receiving function is disposed in the second communication device. When the second communication device serves as a transmitting side and the first communication device serves as a receiving side, a first communication unit that performs the transmitting function is disposed in the second communication device, and a second communication unit that performs the receiving function is disposed in the first communication device.

The transmitting unit of the first communication unit includes, for example, a transmitting-side signal generation unit (a signal conversion unit that converts a transmission subject electrical signal into an electrical signal of the millimeter band) that processes the transmission subject signal to an electrical signal of the millimeter band and a transmitting-side signal coupling unit that couples the electrical signal of the millimeter band generated by the transmitting-side signal generation unit to the wireless signal transmission path (for example, the millimeter-wave signal transmission path) for transmitting the wireless signal of the millimeter band. Preferably, the transmitting-side signal generation unit may be integrated with a function that generates the transmission subject signal.

For example, the transmitting-side signal generation unit has a modulation circuit (modulation unit), and the modulation circuit modulates the transmission subject signal (baseband signal). The transmitting-side signal generation unit generates an electrical signal of the millimeter band by frequency-converting a modulated signal modulated by the modulation circuit. In principle, the transmission subject signal may be directly converted into the electrical signal of the millimeter band. The transmitting-side signal coupling unit converts the electrical signal of the millimeter band generated by the transmitting-side signal generation unit into a wireless signal (electromagnetic waves or radio waves) and supplies the wireless signal to the millimeter-wave signal transmission path serving as the wireless signal transmission path.

The receiving unit of the second communication unit includes, for example, a receiving-side signal coupling unit that receives the wireless signal of the millimeter band transmitted through the millimeter-wave signal transmission path serving as the wireless signal transmission path and converts the wireless signal into an electrical signal and a receiving-side signal generation unit (a signal conversion unit that converts the millimeter-wave signal into a transmission subject electrical signal) that processes the electrical signal (input signal) of the millimeter band received by the receiving-side signal coupling unit and converted into the electrical signal to generate (recover or reproduce) a general electrical signal (transmission subject signal or baseband signal). Preferably, the receiving-side signal generation unit may be integrated with a functional unit that receives the transmission subject signal. For example, the receiving-side signal generation unit has a demodulation circuit (demodulation unit) and generates an output signal by frequency-converting the electrical signal of the millimeter band. Then, the demodulation circuit demodulates the output signal to thereby generate the transmission subject signal. In principle, the electrical signal of the millimeter band may be directly converted into the transmission subject signal.

That is, when providing a signal interface, the transmission subject signal is transmitted as a wireless signal in a contactless or cableless manner (that is, the transmission subject signal is not transmitted through electric wirings). Preferably, at least signals (particularly, video signals which require high-speed, large-volume transmission, and high-speed clock signals) are transmitted as a wireless signal of the millimeter band or the like. That is, in the present embodiment, signal transmission which was performed through electric wirings is performed through a wireless signal (radio waves). By transmitting signals through the wireless signal of the millimeter band or the like, it is possible to realize high-speed signal transmission with a data rate of the order of gigabits per second (Gbps), making it possible to easily restrict the area the millimeter wave signal can cover. Moreover, the effects arising from the properties thereof can be obtained.

Here, the respective signal coupling units may be configured such that the first communication unit and the second communication unit can transmit a wireless signal (in this example, a wireless signal of the millimeter band) through the wireless signal transmission path (for example, the millimeter-wave signal transmission path). For example, the signal coupling units may include an antenna structure (antenna coupling unit) and may achieve coupling without including an antenna structure. The wireless signal transmission path such as "the millimeter-wave signal transmission path for transmitting the millimeter-wave signal" may be air (so-called free space). However, preferably, the wireless signal transmission path may have a structure (wireless signal confining structure, for example, a millimeter wave confining structure) that transmits a wireless signal while confining the wireless signal (electromagnetic waves or radio waves) in the transmission path. By actively utilizing the wireless signal confining structure, the layout of the wireless signal transmission path can be determined arbitrarily, for example, as in the case of electric wirings. Although a so-called waveguide is a typical example of the wireless signal confining structure, the present disclosure is not limited to this. For example, a structure formed of a dielectric material capable of transmitting a wireless signal (this structure will be referred to as a dielectric transmission path or a wireless signal intra-dielectric transmission path) or a hollow waveguide which forms a transmission path and in which a shielding material for suppressing external radiation of a wireless signal is provided so as to surround the transmission path and the inside of the shielding material is hollow may be used. By making the dielectric material or the shielding material flexible, the wireless signal transmission path can be laid out. In the case of the air (so-called free space), the respective signal coupling units employ an antenna structure, and signals are transmitted within a short range space by the antenna structure. On the other hand, when the wireless signal transmission path is formed of a dielectric material, although the respective signal coupling units may employ an antenna structure, this is not essential.

[Comparison Between Signal Transmission Through Electric Wirings and Wireless Transmission]

Signal transmission through electric wirings has the following problems.

i) In spite of need for data transmission in a larger volume and at a higher speed, electric wirings have their limitations in transmission speed and volume.

ii) A possible approach to increasing the data transmission speed would be to provide parallel signals by increasing the number of wirings and reduce the transmission speed of each signal line. However, this approach leads to an increase in the number of input and output terminals. As a result, more complicated printed circuit substrates and cabling are required. Moreover, the physical size of the connectors and electrical interface must be increased. This leads to more complicated geometries of the connectors and electrical interface, resulting in degraded reliability and increased cost.

iii) As a result of enormous expansion in the amount of information including movie pictures and computer graphics, the baseband signal bandwidth expands, causing the EMC (electromagnetic compatibility) problem to manifest itself. For example, when an electric wiring is used, the wiring acts as an antenna, interfering with the signals corresponding to the tuning frequency of the antenna. Moreover, reflection and resonance resulting from unmatched wiring impedance may cause unnecessary radiation. In order to address these problems, the electronic device becomes more complex in configuration.

iv) In addition to EMC, reflection may cause transmission errors due to interference between symbols at the receiving side and intrusion of jamming wave.

In contrast, when signal transmission is performed wirelessly (for example, using the millimeter band) rather than through electric wirings, since there is no need to be concerned about wiring geometries or connector positions, there are not many restrictions in layout. Since the wirings and terminals can be omitted for those signals that are transmitted with a millimeter-wave signal, the EMC problems are solved. In general, there are no other functional units which use frequencies in the millimeter band in the communication device, countermeasures against the EMC problems are easily realized. The wireless transmission takes place between the transmitting-side communication device and the receiving-side communication device in proximity to each other, and signals are transmitted between fixed positions or in a known positional relationship. As a result, the following advantages are obtained. 1) It is easy to properly design a propagation channel (waveguide structure) between the transmitting side and the receiving side. 2) Excellent transmission with higher reliability than free space transmission can be realized by designing the dielectric structure of a transmission path coupling unit that seals the transmitting side and the receiving side and the propagation channel (waveguide structure of the millimeter-wave signal transmission path) in conjunction with each other. 3) Since the control of a controller that controls wireless transmission does not need to be performed dynamically, adaptively, and frequently unlike general wireless communication, control overhead can be reduced as compared to general wireless communication. As a result, the setting values (so-called parameters) used by control circuits and calculation circuits can be set to constant values (so-called fixed values), and thus, downsizing, reduction in power consumption and faster transmission can be realized. For example, when wireless transmission characteristics are calibrated at the time of manufacturing or designing to understand individual fluctuations or the like, since the data can be referenced, the setting of the transmission output level can be easily realized through presetting or static control. Since the setting values generally define the operation of the signal processing unit properly, high-quality communication can be performed with a simple configuration and at a low cost.

In addition, millimeter wave communication using short wavelength provides the following advantages.

a) Since millimeter wave communication provides a wide communication band, a high data rate can be achieved easily.

b) Since the transmission frequency can be separated from the frequencies used for processing other baseband signals, interference rarely occurs between the millimeter wave and baseband signals.

c) Since the millimeter band has a short wavelength, it is possible to decrease the size of the antenna and the waveguide structure, which are determined by the wavelength. In addition, electromagnetic shielding is easy to achieve due to large distance attenuation and small diffraction.

d) The carrier stability is strictly regulated to prevent interference in the ordinary wireless communication in a field. In order to achieve such a highly stable carrier, highly stable external frequency reference components, frequency multiplier circuits, and a PLL (phase locked loop circuit) are used, which increases the circuit size. However, millimeter waves can be easily shielded to prevent external leaks (particularly when used in combination with signal transmission between fixed positions or in a known positional relationship). Injection locking is preferred to demodulate a signal transmitted on a less stable carrier with a small circuit at the receiving side.

For example, LVDS (Low Voltage Differential Signaling) is known as a method for achieving high-speed signal transmission between electronic devices disposed at a relatively short distance (for example, between 10 to 20 centimeters) or within an electronic device. However, a recent further increase in volume and speed of transmission data incurs problems such as an increase in power consumption, an increase in effect of signal distortion due to reflection or the like, and an increase in unnecessary radiation (so-called EMI problems). For example, LVDS has reached its limit in high-speed (real-time) transmission of video signals (including image signals) and signals of computer images and the like within a device or between devices. A possible approach to increasing the data transmission speed would be to provide parallel signals by increasing the number of wirings and reduce the transmission speed of each signal line. However, this approach leads to an increase in the number of input and output terminals. As a result, more complicated printed circuit substrates and cabling are required. Moreover, the physical size of the connectors and electrical interface must be increased. Furthermore, transmitting large-volume data through wirings at high speed may cause a so-called electromagnetic field interference problem.

All problems involved in the LVDS or the technique of increasing the number of wirings are caused by signal transmission through electric wirings. Therefore, as a method for solving the problems caused by signal transmission through electric wirings, there is a method of eliminating the electric wirings for signal transmission (particularly, a method of transmitting signals through radio waves). Examples of the method of eliminating electric wirings for signal transmission include a method (first method) of wirelessly transmitting signals within a housing and applying the UWB (Ultra Wide Band) communication method and a method (second method) of using a carrier frequency of the millimeter band having a short wavelength (1 to 10 millimeters). However, the UWB communication method according to the first method uses a low carrier frequency and is not ideal for high-speed communication, for example, for transmission of video signals, and therefore, incurs problems associated with an antenna size or the like. Furthermore, since the transmission frequency is close to the frequency used for processing other baseband signals, interference is likely to occur between the wireless signal and the baseband signal. In addition, when the carrier frequency is low, it is likely to be affected by noise generated in the driving system in a device, and countermeasures against the noise are required. In contrast, as in the case of the second method, when a carrier frequency of the millimeter band having a shorter wavelength is used, it is possible to solve the problems associated with an antenna size and interference.

In the embodiments of the present disclosure, although wireless communication is performed in the millimeter band, the application range thereof is not limited to performing communication in the millimeter band. Communication in a frequency band (centimeter band) lower than the millimeter band and communication in a frequency band (submillimeter band) higher than the millimeter band may be applied. However, in regard to intra-device signal transmission and inter-device signal transmission, it is ideal to use mainly the millimeter band in which the wavelength is not excessively long or short.

Hereinafter, a signal transmission device and an electronic device according to the present embodiment will be described in detail. Although an example in which a large number of functional units are formed on a semiconductor integrated circuit (chip, for example, the CMOS IC) will be described as the most preferred embodiment, the present disclosure is not limited to this. Although the technique disclosed in the present specification will described by way of embodiments or exemplary embodiments, the technical scope of the present disclosure is not limited to the range disclosed in the embodiments and exemplary embodiments described below. Various modifications or improvements can be made to the embodiments and exemplary embodiments without departing from the spirit of the present disclosure, and such modifications or improvements are also included in the technical scope of the present disclosure. Moreover, the embodiments and exemplary embodiments described below do not restrict the technique according to the appended claims, and not all of the combinations of features described in the embodiments and exemplary embodiments are said to be indispensable to the technical solving means proposed in the present disclosure. Various steps of techniques are included in the embodiments and exemplary embodiments described below, and various modified techniques can be extracted by an appropriate combination of a plurality of constituent elements disclosed in the embodiments and exemplary embodiments. The embodiments and exemplary embodiments described below are not limited to being applied solely but may be applied in optional combinations within a possible range. Several constituent elements may be removed from the whole constituent elements illustrated in the embodiments and exemplary embodiments, and as long as the effects to be achieved by the present disclosure are achieved, the configuration in which several constituent elements are removed can be extracted as the technique proposed by the present disclosure.

<Transmission Processing System: Basic>

Figure 2:
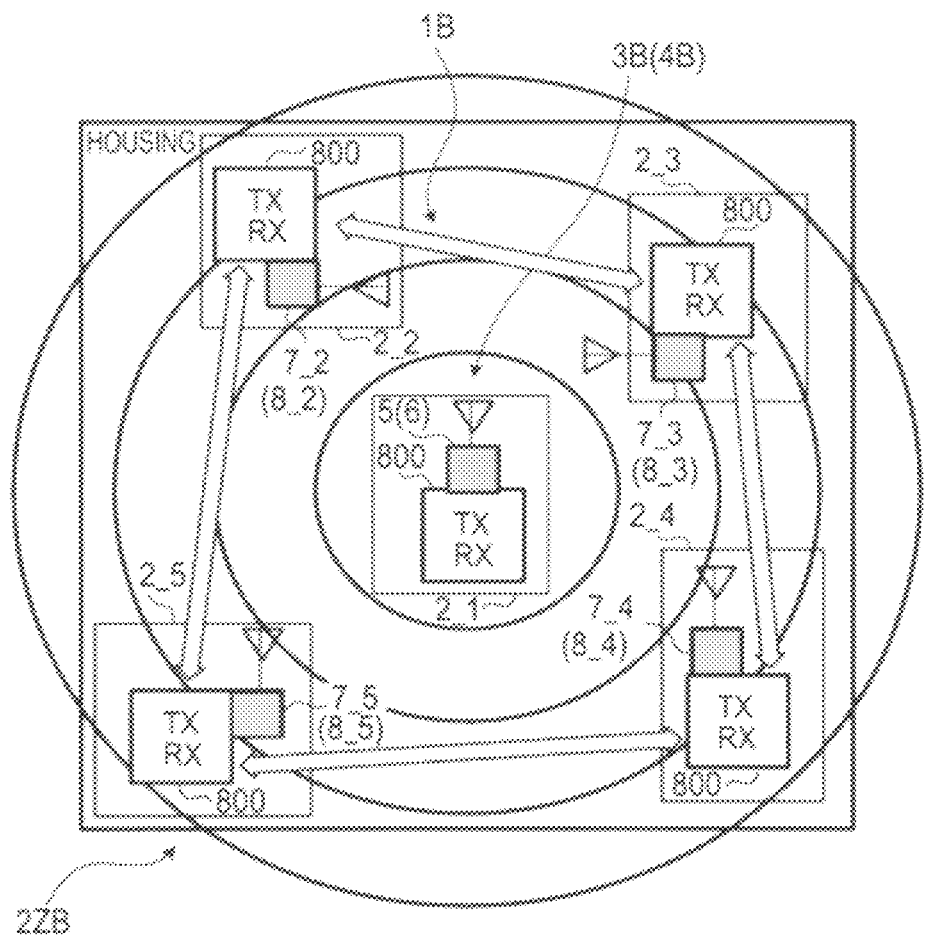
FIG. 2 is a diagram illustrating a basic configuration example (second example) of the signal transmission device according to the present embodiment.

FIGS. 1 and 2 are diagrams illustrating a basic configuration example of a signal transmission device according to the present embodiment. The signal transmission device is an example when a combination of a plurality of communication devices (communication units) form a whole communication device.

[First Example]

A communication device 2ZA of the first example shown in FIG. 1 includes a signal transmission device 1A including a plurality of communication devices 2 that wirelessly transmit a transmission subject signal and a control/reference signal transmission device 3A. A transmitting-side communication device 2 (or a transmitting-side communication unit) is referred to as a transmitter (transmitting device), a receiving-side communication device 2 (or a receiving-side communication unit) is referred to as a receiver (receiving device), and the transmitter and the receiver are also collectively referred to as a transceiver. Each communication device 2 includes a communication chip 800. The communication chip 800 may be one of a transmission chip 801 (TX: transmitter) and a reception chip 802 (RX: receiver) described later in regard to wireless transmission of a general transmission subject signal and may be one in which the functions of both the transmission chip 801 and the reception chip 802 are included in one chip to correspond to bidirectional communication. The transmission chip 801 is an example of a communication unit that transmits the transmission subject signal as a wireless signal, and the reception chip 802 is an example of a communication unit that receives the wireless signal transmitted from the communication unit (the transmission chip 801) that transmits the transmission subject signal as the wireless signal to reproduce the transmission subject signal.

The communication chip 800 of the first example includes the function of a reception chip 807 (RX: receiver) for wireless transmission (in particular, for reception) of a control signal and a reference signal described later as well as the function of a communication chip for wireless transmission of the general transmission subject signal. A transmission chip 806 is an example of a communication unit that transmits a control signal for controlling at least one of the communication unit (the transmission chip 801) that transmits the transmission subject signal as a wireless signal and the communication unit (the reception chip 802) that reproduces the transmission subject signal and a reference signal used by these communication units as a wireless signal. The reception chip 807 is an example of a communication unit that receives the wireless signal transmitted from the communication unit (the transmission chip 806) that transmits the control signal and the reference signal as the wireless signal to reproduce the control signal and the reference signal and supplies the transmission subject signal to the communication unit (the transmission chip 801) that transmits the transmission subject signal as the wireless signal or the communication unit (the reception chip 802) that reproduces the transmission subject signal.

In a preferred embodiment, although the communication chip 800 and a control/reference signal receiving device 7 are incorporated into the communication device 2 as shown in the drawing, the present disclosure is not limited to this. In the example shown in the drawing, although the communication chip 800 and the control/reference signal receiving device 7 are illustrated as separate functional units, the communication chip 800 may include all or a part of the functional units of the control/reference signal receiving device 7.

A control/reference signal transmission device 3A of the first embodiment includes a control/reference signal transmitting device 5 that wirelessly transmits the control signal and the reference signal used by the communication device 2 and the control/reference signal receiving device 7 which is provided in each communication device 2. The control/reference signal transmission device 3A of the first example wirelessly transmits the control signal and the reference signal separately from the general transmission subject signal (preferably with a different carrier frequency). Unlike the second example described later, the control/reference signal transmitting device 5 is provided separately from the respective communication devices 2.

Although the control signal and the reference signal used by the communication device 2 are described to be wirelessly transmitted or received, the present disclosure is not limited to this, and at least the control signal used by the communication device 2 may be wirelessly transmitted or received. In this case, the control/reference signal transmission device 3A is substituted with a control signal transmitting device 4A, and similarly, the control/reference signal transmitting device 5 with a control signal transmitting device 6, and the control/reference signal receiving device 7 with a control signal receiving device 8. In this case, the transmission chip 806 is an example of a communication unit that transmits a control signal for controlling at least one of the communication unit (the transmission chip 801) that transmits the transmission subject signal as the wireless signal and the communication unit (the reception chip 802) that reproduces the transmission subject signal as a wireless signal. The reception chip 807 is an example of a communication unit that receives the wireless signal transmitted from the communication unit (the transmission chip 806) that transmits the control signal as the wireless signal to reproduce the control signal and supplies the control signal to the communication unit (the transmission chip 801) that transmits the transmission subject signal as the wireless signal or the communication unit (the reception chip 802) that reproduces the transmission subject signal.

Preferably, both the band of a carrier frequency used for transmission of general signals (wireless transmission of the transmission subject signal) by the respective communication devices 2 and the band of a carrier frequency used for transmission of the control signal and the reference signal between the control/reference signal transmitting device 5 and the respective control/reference signal receiving devices 7 are in the millimeter band. Moreover, preferably, by using a carrier frequency such that the transmission subject signal, the control signal, and the reference signal can be transmitted or transmitted by one antenna, it is possible to transmit or receive the transmission subject signal, the control signal, and the reference signal using the same antenna as shown in the drawing and to simplify the configuration of the communication device 2.

In the example shown in the drawing, although four communication devices 2_1 to 2_4, one control/reference signal transmitting device 5, and four control/reference signal receiving devices 7_1 to 7_4 are included in the housing of one electronic device, the number of communication devices 2 and control/reference signal receiving devices 7 is not limited to four. Moreover, it is not necessary for these devices to be included in the housing of one electronic device.

In the example shown in the drawing, although one antenna is shared by the communication device 2, the control/reference signal transmitting device 5, and the control/reference signal receiving device 7 which use frequencies (that is, frequencies close to each other) in the same millimeter band. For example, the communication devices 2 may perform communication using a frequency in the millimeter band, and the control/reference signal transmitting device 5 and the control/reference signal receiving device 7 may perform communication using a frequency in a band lower than the millimeter band. Conversely, the communication devices 2 may perform communication using a frequency in a band lower than the millimeter band, and the control/reference signal transmitting device 5 and the control/reference signal receiving device 7 may perform communication using a frequency in the millimeter band. When the communication bands used by the devices are different, separate antennas suitable for the respective devices may be used. Even when the communication bands used by the devices are different, if one carrier frequency is an integer multiple of another carrier frequency, one antenna can be shared by the devices.

[Second Example]

A control/reference signal transmission device 3B of the second example shown in FIG. 2 is also an example of application to a communication device 2ZB. The difference from the first example will be described briefly. A signal transmission device 1B and a communication device 2 of the second example are the same as those described in the first example.

The control/reference signal transmission device 3B of the second example includes a control/reference signal transmitting device 5 that wirelessly transmits a control signal and a reference signal used by the communication devices 2 and a control/reference signal receiving device 7 which is provided in each communication device 2. Unlike the first example described above, the control/reference signal transmitting device 5 is incorporated into one of the communication devices 2. In the example shown in the drawing, the control/reference signal transmitting device 5 is incorporated into one communication device 2_1 of five communication devices 2_1 to 2_5. The communication device 2 including the control/reference signal transmitting device 5 may use the control signal and the reference signal which are wirelessly transmitted to the other communication devices 2 and may not need to include the control/reference signal receiving device 7. The control/reference signal transmitting device 5 and the control/reference signal receiving device 7 of the second example are the same as those described in the first example. A communication chip 800 of the communication device 2_1 including the control/reference signal transmitting device 5 includes the function of a transmission chip 806 (TX: transmitter) for wireless transmission (in particular, for transmission) of the control signal and the reference signal described later as well as the function of a communication chip for wireless transmission of the general transmission subject signal.

<Combination of Communication Devices>

FIGS. 3A to 4C are diagrams illustrating a combination configuration (that is, a configuration example of an electronic device) of the signal transmission device 1 in regard to wireless transmission of the transmission subject signal and the control signal transmitting device 4 in regard to wireless transmission of the control signal or the control/reference signal transmission device 3 in regard to wireless transmission of the control signal and the reference signal. When both first and second circuit substrates are disposed in one housing of an electronic device, intra-housing (intra-device) signal transmission is performed. When the first circuit substrate is disposed in the housing of a first electronic device, the second circuit substrate is disposed in the housing of a second electronic device, a wireless signal transmission path that enables transmission of a wireless signal is formed when the first and second electronic devices are disposed in predetermined positions, signal transmission is performed between the devices.

In the first to third combination configurations shown in FIGS. 3A to 3C, a control signal transmitting device 4 which includes the transmission chip 806 that forms the transmission unit of the control signal transmitting device 6 and the reception chip 807 that forms the reception unit of the control signal receiving device 8 and a signal transmission device 1 which includes the transmission chip 801 that forms the transmission unit of a transmission signal transmitting device 902 and the reception chip 802 that forms the reception unit of a transmission signal receiving device 904 are combined to each to form a whole communication device 2Z. An LSI functional unit 702 having the functions of a signal processing unit, a control unit, and the like is provided in the transmission signal transmitting device 902, and an LSI functional unit 707 having the functions of a signal processing unit, a control unit, and the like is provided in the transmission signal receiving device 904. In a configuration which includes both the transmission chip 801 and the reception chip 802 and which corresponds to bidirectional communication, any one of the transmission signal transmitting device 902 and the transmission signal receiving device 904 is substituted with a transmission signal transceiving device 906. A wireless signal Sc for a control signal CTRL is transmitted from the transmission chip 806 that forms the control signal transmitting device 6 to the reception chip 807 that forms the control signal receiving device 8.

The first combination configuration shown in FIG. 3A includes a first communication device 2a_1 and a second communication device 2a_2. The transmission chip 801 that transmits a transmission subject signal DATA as a wireless signal Sm, the transmission chip 806 that transmits a control signal CTRL as a wireless signal Sc, and the LSI functional unit 702 are mounted on the first communication device 2a_1. The reception chip 802 that receives the transmission subject signal DATA as the wireless signal Sm, the reception chip 807 that receives the control signal CTRL as the wireless signal Sc, and the LSI functional unit 707 are mounted on the second communication device 2a_2. The LSI functional unit 702 and the LSI functional unit 707 perform major application control of the communication device 2. For example, the LSI functional unit 702 also includes a circuit that processes various kinds of signals (image data or audio data) to be transmitted to a counterpart device and a control circuit that performs, for example, control of the transmission signal level and logical control such as data read/write control with respect to requests from the external or internal functional units thereof. The LSI functional unit 707 pairs up with the LSI functional unit 702 to perform reverse processing, and in this example, also includes a circuit that processes various kinds of received signals (image data or audio data) and a control circuit that performs, for example, control of the reception gain and logical control such as data read/write control with respect to requests from a counterpart device and from the external or internal functional units thereof. The reception chip 807 receives the wireless signal Sc transmitted from the transmission chip 806 to reproduce the control signal and supplies the control signal to the reception chip 802 or the LSI functional unit 707. Preferably, the transmission chip 801, the transmission chip 806, and the LSI functional unit 702 are mounted on the same first circuit substrate, and the reception chip 802, the reception chip 807, and the LSI functional unit 707 are mounted on the same second circuit substrate.

The second combination configuration shown in FIG. 3B includes a first communication device 2b_1 and a second communication device 2b_2. The transmission chip 801 that transmits a transmission subject signal DATA as a wireless signal Sm, the reception chip 807 that receives the control signal CTRL as a wireless signal Sc, and the LSI functional unit 702 are mounted on a first communication device 2b_1. The reception chip 802 that receives the transmission subject signal DATA as the wireless signal Sm, the transmission chip 806 that transmits the control signal CTRL as the wireless signal Sc, and the LSI functional unit 707 are mounted on a second communication device 2b_2. The reception chip 807 receives the wireless signal Sc transmitted from the transmission chip 806 to reproduce the control signal CTRL and supplies the control signal to the transmission chip 801 or the LSI functional unit 702. Preferably, the transmission chip 801, the reception chip 807, and the LSI functional unit 702 are mounted on the same first circuit substrate, and the reception chip 802, the transmission chip 806, and the LSI functional unit 707 are mounted on the same second circuit substrate.

The third combination configuration shown in FIG. 3C includes a first communication device 2c_1 and a second communication device 2c_2. A transmission chip 801_1 that transmits a first transmission subject signal DATA_1 as a wireless signal Sm1, a reception chip 802_2 that receives a second transmission subject signal DATA_2 as a wireless signal Sm2, a transmission chip 806 that transmits a control signal CTRL as a wireless signal Sc, and the LSI functional unit 702 are mounted on the first communication device 2c_1. A transmission chip 801_2 that transmits a second transmission subject signal DATA_2 as a wireless signal Sm2, a reception chip 802_1 that receives the first transmission subject signal DATA_1 as the wireless signal Sm1, a reception chip 807 that receives the control signal CTRL as the wireless signal Sc, and the LSI functional unit 707 are mounted on the second communication device 2c_2. The reception chip 807 receives the wireless signal Sc transmitted from the transmission chip 806 to reproduce the control signal CTRL and supplies the control signal to the reception chip 802_1 and the transmission chip 801_2 or the LSI functional unit 707. Preferably, the transmission chip 801_1, the reception chip 802_2, the transmission chip 806, and the LSI functional unit 702 are mounted on the same first circuit substrate, and the reception chip 802_1, the transmission chip 801_2, the reception chip 807, and the LSI functional unit 707 are mounted on the same second circuit substrate.

In the fourth to sixth combination configurations shown in FIGS. 4A to 4C, a control/reference signal transmission device 3 which includes the transmission chip 806 that forms the transmission unit of the control signal transmitting device 5 and the reception chip 807 that forms the reception unit of the control/reference signal receiving device 7 and a signal transmission device 1 which includes the transmission chip 801 that forms the transmission unit of a transmission signal transmitting device and the reception chip 802 that forms the reception unit of a transmission signal receiving device are combined to each to form a whole communication device 2Z. The fourth to sixth combination configurations are substantially the same as the first to third combination configurations, except that a wireless signal Scj for one control/reference signal CTRL•J (an example of a combined signal) which is a combination of a control signal CTRL and a reference signal J is transmitted from the transmission chip 806 that forms the control/reference signal transmitting device 5 to the reception chip 807 that forms the control/reference signal receiving device 7.

The control/reference signal CTRL•J on the transmitting side may be generated by the transmission chip 806 which receives the control signal and the reference signal J and may be generated by the LSI functional unit 702 which is a preceding-stage circuit of the transmission chip 806 and which generates and supplies the control/reference signal CTRL•J to the transmission chip 806. The latter case is illustrated in the drawings. The control/reference signal CTRL•J on the receiving side may be separated by the reception chip 807 which reproduces the control/reference signal CTRL•J and separates the same into the control signal CTRL and the reference signal J and may be separated by the LSI functional unit 707 which is a subsequent-stage circuit of the reception chip 807 and which receives the control/reference signal CTRL•J and separates the same into the control signal CTRL and the reference signal J. The latter case is illustrated in the drawings.

The fourth combination configuration shown in FIG. 4A includes a first communication device 2d_1 and a second communication device 2d_2. The transmission chip 801 that transmits a transmission subject signal DATA as a wireless signal Sm, the transmission chip 806 that transmits a control/reference signal CTRL•J as a wireless signal Scj, and the LSI functional unit 702 are mounted on the first communication device 2d_1. The reception chip 802 that receives the transmission subject signal DATA as the wireless signal Sm, the reception chip 807 that receives the control/reference signal CTRL•J as the wireless signal Scj, and the LSI functional unit 707 are mounted on the second communication device 2d_2. Preferably, the transmission chip 801, the transmission chip 806, and the LSI functional unit 702 are mounted on the same first circuit substrate, and the reception chip 802, the reception chip 807, and the LSI functional unit 707 are mounted on the same second circuit substrate. The reception chip 807 receives the wireless signal Scj transmitted from the transmission chip 806 to reproduce the control/reference signal CTRL•J and supplies the control/reference signal to the LSI functional unit 707. The LSI functional unit 707 separates the control/reference signal CTRL•J into the control signal CTRL and the reference signal J, uses these signals in controlling the internal functional units thereof and timing control, and supplies the same to the reception chip 802.

The fifth combination configuration shown in FIG. 4B includes a first communication device 2e_1 and a second communication device 2e_2. The transmission chip 801 that transmits a transmission subject signal DATA as a wireless signal Sm, the reception chip 807 that receives the control/reference signal CTRL•J as a wireless signal Scj, and the LSI functional unit 702 are mounted on a first communication device 2e_1. The reception chip 802 that receives the transmission subject signal DATA as the wireless signal Sm, the transmission chip 806 that transmits the control signal CTRL as the wireless signal Sc, and the LSI functional unit 707 are mounted on a second communication device 2e_2. Preferably, the transmission chip 801, the reception chip 807, and the LSI functional unit 702 are mounted on the same first circuit substrate, and the reception chip 802, the transmission chip 806, and the LSI functional unit 707 are mounted on the same second circuit substrate. The reception chip 807 receives the wireless signal Scj transmitted from the transmission chip 806 to reproduce the control/reference signal CTRL•J and supplies the control/reference signal to the LSI functional unit 702. The LSI functional unit 702 separates the control/reference signal CTRL•J into the control signal CTRL and the reference signal J, uses these signals in controlling the internal functional units thereof and timing control, and supplies the same to the transmission chip 801.

The sixth combination configuration shown in FIG. 4C includes a first communication device 2f_1 and a second communication device 2f_2. A transmission chip 801_1 that transmits a first transmission subject signal DATA_1 as a wireless signal Sm1, a reception chip 802_2 that receives a second transmission subject signal DATA_2 as a wireless signal Sm2, a transmission chip 806 that transmits a control/reference signal CTRL•J as a wireless signal Scj, and the LSI functional unit 702 are mounted on the first communication device 2f_1. A transmission chip 801_2 that transmits a second transmission subject signal DATA_2 as a wireless signal Sm2, a reception chip 802_1 that receives the first transmission subject signal DATA_1 as the wireless signal Sm1, a reception chip 807 that receives the control/reference signal CTRL•J as the wireless signal Scj, and the LSI functional unit 707 are mounted on the second communication device 2f_2. Preferably, the transmission chip 801_1, the reception chip 802_2, the transmission chip 806, and the LSI functional unit 702 are mounted on the same first circuit substrate, and the reception chip 802_1, the transmission chip 801_2, the reception chip 807, and the LSI functional unit 707 are mounted on the same second circuit substrate. The reception chip 807 receives the wireless signal Scj transmitted from the transmission chip 806 to reproduce the control/reference signal CTRL•J and supplies the control/reference signal to the LSI functional unit 707. The LSI functional unit 707 separates the control/reference signal CTRL•J into the control signal CTRL and the reference signal J, uses these signals in controlling the internal functional units thereof and timing control, and supplies the same to the reception chip 802_1 and the transmission chip 801_2.

<Control Signal Transmission Device>

FIGS. 5A and 5B are diagrams illustrating a basic configuration of a control signal transmitting device. Here, FIG. 5A illustrates the configuration of a control signal transmitting device 3PA of the first example, and FIG. 5B illustrates the configuration of a control signal transmitting device 3PB of the second example.

[First Example]

The control signal transmitting device 3PA of the first example shown in FIG. 5A includes a control signal transmitting device 4A (CTRL-TX) and a control signal receiving device 7PA (CTRL-RX). The first example is a general-purpose configuration which does not care about the modulation method of the control signal. The control signal transmitting device 3PA includes a control signal output unit 5600, a transmission control signal generation unit 5700, and a transmission amplification unit 5800, and an antenna 5900 serving as an electromagnetic wave output device is connected to the output terminal of the transmission amplification unit 5800.

The control signal output unit 5600 generates a control signal CTRL_0 used for signal processing by the respective communication devices 2 (see FIG. 1). Preferably, the control signal CTRL_0 is encoded based on a plurality of control signals CTRL. The transmission control signal generation unit 5700 generates a transmission control signal CTRL_1 (high-frequency control signal) by modulating a carrier signal with the control signal CTRL_0 generated by the control signal output unit 5600. That is, the control signal CTRL_0 is converted into the control signal CTRL_1 of a higher frequency. The transmission amplification unit 5800 amplifies the modulated control signal CTRL_1 and supplies the amplified control signal to a transmission path coupling unit 5810 (for example, a microstrip line) connected to the antenna 5900. The control signal CTRL_1 is an example of a high-frequency control signal, and the transmission control signal generation unit 5700 is an example of a high-frequency control signal output unit that generates the control signal CTRL_1 of a higher frequency based on the control signal CTRL_0 generated by the control signal output unit 5600. The transmission control signal generation unit 5700 may adopt various circuit configurations as long as it can generate the control signal CTRL_1 having a higher frequency than the control signal CTRL_0, and the modulation method may be any of amplitude modulation, phase modulation, frequency modulation, and the like, for example. In the case of modulating digital signals, the amplitude modulation is called an amplitude shift keying (ASK), the phase modulation is called a phase shift keying (PSK), and the frequency modulation is called a frequency shift keying (FSK). Regardless of the modulation method used, preferably, by transmitting the control signal CTRL at a data rate lower than the general transmission subject signal, it is possible to achieve effective use of frequency bands. The ASK method requires linearity and also requires high-performance modulation and demodulation circuits and is inferior in power efficiency, and the PSK method requires phase synchronization and has a complex configuration although the power efficiency thereof is superior to the ASK method. In contrast, the FSK method only requires frequency synchronization and can be realized with a simpler circuit configuration than the PSK method and is superior to the ASK method in the power efficiency.

The control signal receiving device 7PA (CTRL-RX) includes a reception amplification unit 7700 and a control signal reproduction unit 7900, and an antenna 7600 serving as an electromagnetic wave input device is connected to the input terminal of the reception amplification unit 7700. The control signal CTRL_1 received by the antenna 7600 is supplied to the reception amplification unit 7700 through a transmission path coupling unit 7710 (for example, a microstrip line). The reception amplification unit 7700 amplifies the control signal CTRL_1 and supplies the amplified control signal to the control signal reproduction unit 7900. The control signal reproduction unit 7900 reproduces a control signal CTRL_2 which is exactly the same as the transmitting-side control signal CTRL_0. The control signal CTRL_2 reproduced by the control signal reproduction unit 7900 is used for controlling the operation of various signal processing units (a modulation unit, a preceding signal processing circuit, and a subsequent output amplification circuit; or a demodulation unit, a subsequent signal processing circuit, and a preceding reception amplification circuit) mounted on the communication device 2 (not shown).

In this configuration, since the control signal CTRL_1 is wirelessly transmitted to respective destinations, the transmission of the control signal CTRL_1 does not require electric wirings, and it is possible to supply the control signal CTRL_1 to respective destinations while solving the problems of signal distortion and unnecessary radiation. When the control signal CTRL_1 (specifically, the control signal CTRL_0 which is the original signal thereof) is encoded, it is possible to control a plurality of functional units by a functional unit (decoding unit) decoding one control signal CTRL_1. For example, a decoding unit 7990 may be provided in the control signal receiving device 7PA as indicated by a broken line in the drawing, and a decoding unit may be provided to the side of the communication device 2 that includes the respective functional units which use the decoded control signal. When the decoding unit 7990 is provided in the control signal receiving device 7PA, since it is not necessary to redundantly provide the decoding unit, it is possible to simplify the device configuration as a whole. When the decoding unit 7990 is provided in the control signal receiving device 7PA, a plurality of wirings may be used for transmitting the decoded respective control signals to the respective communication devices 2.

[Second Example]

A control signal transmitting device 3PB of the second example shown in FIG. 5B includes a control signal transmitting device 4B (CTRL-TX) and a control signal receiving device 7PB (CTRL-RX). The second example is a configuration example which is particularly ideal when the modulation method of the control signal is the FSK method. The difference from the first example will mainly be described.

The transmission control signal generation unit 5700 of the second example includes a frequency modulation unit 5710. The frequency modulation unit 5710 is supplied with a 2-valued control signal CTRL_0 from the control signal output unit 5600 regardless of whether the control signal CTRL_0 is generated by encoding a plurality of control signals CTRL. The frequency modulation unit 5710 includes an oscillation circuit (not shown), and the frequency control input terminal thereof is controlled by the control signal CTRL_0, whereby the frequency of the oscillation signal output from the oscillation circuit is changed. The oscillation circuit may be, for example, any of a voltage-controlled oscillation circuit (VCO) and a current-controlled oscillation circuit (CCO) as long as it can generate a high-frequency signal of a predetermined frequency band (for example, a millimeter band). Since the 2-valued control signal CTRL_0 is supplied from the control signal output unit 5600, a 2-valued FSK output signal is output from the frequency modulation unit 5710 as a control signal CTRL_1. The output (namely, the 2-valued FSK control signal CTRL_1) of the frequency modulation unit 5710 is amplified by the transmission amplification unit 5800 and output by the electromagnetic wave output device of the antenna 5900 as radio waves.

The control signal reproduction unit 7900 of the second example includes a frequency demodulation unit 7910. The frequency demodulation unit 7910 includes a frequency discrimination circuit (not shown). The frequency discrimination circuit can employ various existing configurations. From the frequency demodulation unit 7910, a signal value corresponding to "0" components of the 2-valued FSK control signal CTRL_1 and a signal value corresponding to "1" components are discriminated and output.

<Control/Reference Signal Transmission Device>

FIGS. 6A and 6B are diagrams illustrating a basic configuration of a control/reference signal transmission device. FIG. 6A illustrates the configuration of the control/reference signal transmission device 3A of the first example, and FIG. 6B illustrates the configuration of the control/reference signal transmission device 3B of the second example.

[First Example]

The control/reference signal transmission device 3A of the first example shown in FIG. 6A includes a control/reference signal transmitting device 5A (CTRL•CW-TX) and a control/reference signal receiving device 7A (CTRL•CW-RX). The first example is a general-purpose configuration which does not care about the modulation method of the control signal and the reference signal. The control/reference signal transmission device 3A includes an original signal generation unit 5100, a signal combination unit 5160, a transmission signal generation unit 5200, and a transmission amplification unit 5300, and an antenna 5400 serving as an electromagnetic wave output device is connected to the output terminal of the transmission amplification unit 5300.

The original signal generation unit 5100 includes the control signal output unit 5600 and an original reference signal generation unit 5110 that generates a timing signal (called an original reference signal J_0) which becomes the reference of the whole signal transmission device 1. The original reference signal generation unit 5110 generates the original reference signal J_0 of a frequency fck using a crystal oscillator (XTAL), for example. The signal combination unit 5160 combines the control signal CTRL_0 generated by the control signal output unit 5600 and the original reference signal J_0 generated by the original reference signal generation unit 5110 to generate one control/reference signal CTRL•J_0 (an example of a combined signal) and supplies the same to the transmission signal generation unit 5200. The transmission signal generation unit 5200 is the same functional unit as the transmission control signal generation unit 5700, and generates a transmission control/reference signal CTRL•J_1 (high-frequency control/reference signal) by modulating a carrier signal with the control/reference signal CTRL•J_0 generated by the signal combination unit 5160. That is, the control/reference signal CTRL•J_0 is converted into the control/reference signal CTRL•J_1 of a higher frequency. The transmission amplification unit 5300 amplifies the modulated control/reference signal CTRL•J_1 and supplies the amplified control/reference signal to a transmission path coupling unit 5310 (for example, a microstrip line) connected to the antenna 5400.

The control/reference signal receiving device 7A (CTRL•CW-RX) includes a reception amplification unit 7200, a control/reference signal reproduction unit 7400, and a signal separation unit 7460, and an antenna 7100 serving as an electromagnetic wave input device is connected to the input terminal of the reception amplification unit 7200. A decoding unit 7990 may be provided as indicated by a broken line in the drawing as necessary. The control/reference signal CTRL•J_1 received by the antenna 7100 is supplied to the reception amplification unit 7200 through a transmission path coupling unit 7210 (for example, a microstrip line). The reception amplification unit 7200 amplifies the control/reference signal CTRL•J_1 and supplies the amplified control/reference signal to the control/reference signal reproduction unit 7400. The control/reference signal reproduction unit 7400 reproduces a control/reference signal CTRL•J_2 which is exactly the same as the transmitting-side control/reference signal CTRL•J_0. The signal separation unit 7460 separates one control/reference signal CTRL•J_2 reproduced by the control/reference signal reproduction unit 7400 into a control signal CTRL_2 and a reference signal J_2. The control signal CTRL_2 and the reference signal J-2 separated by the signal separation unit 7460 are used for controlling the operation of various signal processing units (a modulation unit, a preceding signal processing circuit, and a subsequent output amplification circuit; or a demodulation unit, a subsequent signal processing circuit, and a preceding reception amplification circuit) mounted on the communication device 2 (not shown).

Although the reference signal J-2 may be delivered as it is as a transmitting-side reference signal REFCLK_TX and a receiving-side reference signal REFCLK_RX, a frequency divider 7992 may be provided in the control/reference signal receiving device 7A as indicated by a broken line in the drawing, for example, as necessary, so that the frequency of the reference signal is divided by a ratio of 1/ξ, and the reference signal REFCLK (the reference signal REFCLK_TX or the reference signal REFCLK_RX) is supplied to the respective functional units. In this case, the frequency of the reference signal REFCLK_TX supplied to the transmitting side may be different from the frequency of the reference signal REFCLK_RX supplied to the receiving side.

In this configuration, by wirelessly transmitting the reference signal and the control signal necessary for the signal processing (including modulation and demodulation processing and reception or reception signal amplification) in the respective communication devices 2 (see FIG. 1), it is possible to transmit these signals without using electric wirings. Moreover, by combining the control signal CTRL_0 and the original reference signal J_0 into one signal using the signal combination unit 5160, it is possible to transmit these signals in an integrated manner. Thus, it is possible to reduce the circuit size, the costs, and the power consumption, and achieve the effective use of transmission bands as compared to when the signals are transmitted separately.

[Second Example]

The control/reference signal transmission device 3B of the second example shown in FIG. 6B includes a control/reference signal transmitting device 5AB (CTRL•CW-TX) and a control/reference signal receiving device 7AB (CTRL•CW-RX). The second example is a configuration example which is particularly ideal when the modulation method of the control signal and the reference signal is the FSK method. The difference from the first example will mainly be described.

The transmission control signal generation unit 5200 of the second example includes a frequency modulation unit 5210. The frequency modulation unit 5210 is supplied with a 3-valued control signal CTRL•J_0 from the control signal output unit 5160 regardless of whether the control signal CTRL_0 is generated by encoding a plurality of control signals CTRL. The frequency modulation unit 5210 includes an oscillation unit 5214 (oscillation circuit), and the frequency control input terminal thereof is controlled by the reference signal CTRL•J_0, whereby the frequency of the oscillation signal output from the oscillation unit 5214 is changed. The oscillation unit 5214 may be, for example, any of a voltage-controlled oscillation circuit (VCO) and a current-controlled oscillation circuit (CCO) as long as it can generate a high-frequency signal of a predetermined frequency band (for example, a millimeter band). Since the 3-valued control/reference signal CTRL•J_0 is supplied from the signal combination unit 5160, a 3-valued FSK output signal is output from the frequency modulation unit 5210 as a control signal CTRL•J_1. The output (namely, the 3-valued FSK control signal CTRL•J_1) of the frequency modulation unit 5210 is amplified by the transmission amplification unit 5300 and output by the electromagnetic wave output device of the antenna 5400 as radio waves.

The control signal reproduction unit 7400 of the second example includes a frequency demodulation unit 7410. The frequency demodulation unit 7410 includes a 2-input frequency mixing unit 7412 (mixer circuit and multiplier), an oscillation unit 7414 (oscillation circuit), and a filter processing unit 7416. The frequency mixing unit 7412 is supplied with the received control/reference signal CTRL•J_1 from the reception amplification unit 7200 and an oscillation output signal OSC from the oscillation unit 7414. The oscillation unit 7414 may be, for example, any of a voltage-controlled oscillation circuit (VCO) and a current-controlled oscillation circuit (CCO) as long as it can generate a high-frequency signal of a predetermined frequency band (for example, a millimeter band). A low-pass filter (LPF) is used as the filter processing unit 7416.

The received control/reference signal CTRL•J_1 and the oscillation output signal OSC are multiplied by the frequency mixing unit 7412, and high-frequency components included in the multiplied output signal are removed by the filter processing unit 7416, whereby a frequency error signal is generated. The frequency error signal is fed back as a frequency control signal of the oscillation unit 7414, whereby the oscillation frequency of the oscillation unit 7414 is synchronized to be the same frequency as the carrier frequency FC of a wireless signal F2 for the received control/reference signal CTRL•J_1. In this case, the frequency error signal becomes a demodulation signal (the control/reference signal CTRL•J_2), which is separated into a control signal CTRL_2 and a reference signal J_2 by the signal separation unit 7460. Preferably, by setting the frequency variation range in the frequency modulation unit 5210 to be narrower than the frequency capturing range in the frequency demodulation unit 7410, it is possible to realize transmission of the control signal and the reference signal which does not require frequency adjustment.

<Signal Transmission Device>

FIG. 7 is a diagram illustrating a modulation functional unit and a demodulation functional unit of the signal transmission device 1 that transmits a transmission subject signal. The signal transmission device 1 has a basic configuration including the transmission chip 801 (TX) and the reception chip 802 (RX) which require a reference signal REFCLK. The transmission chip 801 includes a modulation functional unit 8300 and a transmission amplification unit 8117. The reception chip 802 includes a reception amplification unit 8224, a demodulation functional unit 8400, a filter processing unit 8410, and a buffer unit 8418.

[Modulation Functional Unit]

A transmission subject signal (baseband signal: for example, a 12-bit image signal) is converted into a high-speed serial data sequence by a signal generation unit (not shown) and supplied to the modulation functional unit 8300. The modulation functional unit 8300 is an example of a signal processing unit that performs signal processing based on the reference signal REFCLK_TX (low-frequency reference signal), and modulates a signal supplied from a parallel-serial converter as a modulation signal into a signal of the millimeter band in accordance with a predetermined modulation method. Although the modulation functional unit 8300 may adopt various circuit configurations in accordance with the modulation method, if an amplitude modulation method is used, the modulation functional unit 8300 may include a two-input frequency mixing unit 8302 (mixer circuit and multiplier) and a transmitting-side local oscillation unit 8304.

The transmitting-side local oscillation unit 8304 (first carrier signal generation unit) generates a carrier signal Lo_TX (modulation carrier signal) used for modulation. The transmitting-side local oscillation unit 8304 is an example of a second high-frequency reference signal generation unit that generates a carrier signal (an example of a second high-frequency reference signal) of a higher frequency than that synchronized with the reference signal REFCLK_TX (for example, one generated by the control/reference signal reproduction unit 7400). The frequency mixing unit 8302 (first frequency converter) multiplies a signal supplied from a parallel-serial converter with the carrier signal Lo_TX in the millimeter band generated by the transmitting-side local oscillation unit 8304 to generate a transmission signal (modulation signal) and supplies the transmission signal to the transmission amplification unit 8117. The transmission signal is amplified by the transmission amplification unit 8117 and radiated from an antenna 8136 as a wireless signal Sm in the millimeter band.

Although the transmitting-side local oscillation unit 8304 may adopt various circuit configurations as long as it generates the carrier signal Lo_TX based on the reference signal REFCLK_TX, the transmitting-side local oscillation unit 8304 is preferably configured as a PLL or a DLL, for example. In the following description, the PLL configuration will be described. The transmitting-side local oscillation unit 8304 having the PLL configuration includes an oscillation unit 8362 (OSC), a frequency divider 8364 (DIV: feedback frequency divider), a phase frequency comparing unit 8366 (PFD), and a loop filter unit 8368. The oscillation unit 8362 may be, for example, any of a voltage-controlled oscillation circuit (VCO) and a current-controlled oscillation circuit (CCO) as long as it can generate a high-frequency signal of a predetermined frequency band (without being limited to the millimeter band). The frequency divider 8364 is provided to realize a frequency multiplying function and divides the frequency Fo of the carrier signal Lo_TX output from the oscillation unit 8362 by a ratio of $1/\in\_TX$ to acquire a divided oscillation signal DIV_TX which is an example of a comparison clock signal. The "∈_TX" is a PLL multiplication factor (also called a frequency division ratio) which is a positive integer of 1 or more, and may be variable so that the frequency Fo of the carrier signal Lo_TX which is the PLL output clock can be changed. The phase frequency comparing unit 8366 compares the phase and frequency of the reference signal REFCLK_TX supplied from the control/reference signal receiving device 7 with the phase and frequency of the divided oscillation signal DIV_TX supplied from the frequency divider 8364 and generates a comparison result signal Vcp_TX serving as an error signal representing a phase difference and a frequency difference which are the comparison results. The phase frequency comparing unit 8366 is equivalent to a phase frequency comparing unit 5230. The loop filter unit 8368 is an example of a smoothing unit that smoothes the comparison signal output from the phase frequency comparing unit 8366 through a charge pump unit and is equivalent to a loop filter unit 5250. The loop filter unit 8368 includes a low-pass filter LPF as a filter circuit, for example, and integrates a charge pump current Icp_TX generated by the charge pump unit using the filter circuit and generates a loop filter output signal Slp_TX for controlling the oscillation frequency Fo of the oscillation unit 8362.

[Demodulation Functional Unit]

Although the demodulation functional unit 8400 may adopt various circuit configurations within a range corresponding to the transmitting-side modulation method, in this example, it is assumed that the demodulation functional unit 8400 adopts the amplitude modulation method so as to correspond to the above description of the modulation functional unit 8300.

The demodulation functional unit 8400 is an example of a signal processing unit that performs signal processing based on a reference signal REFCLK_RX (low-frequency reference signal). The demodulation functional unit 8400 includes a 2-input frequency mixing unit 8402 (mixer circuit and multiplier) and a receiving-side local oscillation unit 8404, and demodulates a signal from the reception signal received by an antenna 8236 by a so-called synchronous detection method. As a synchronous detection method, carrier waves are reproduced by the receiving-side local oscillation unit 8404 which is separated from the frequency mixing unit 8402, and demodulation is performed using the reproduced carrier waves. In the case of communication using synchronous detection, frequency and phase synchronization is achieved in the transmission and reception carrier signals. In the example shown in the drawing, a filter processing unit 8450 and a buffer unit 8418 are provided at the subsequent stage of the frequency mixing unit 8402. A low-pass filter (LPF), for example, is provided in the filter processing unit 8410 so as to remove high-frequency components included in the multiplied output. The buffer unit 8418 performs the function of an interface to a subsequent-stage circuit (not shown) (a signal generation unit and a signal reproduction unit). As the subsequent-stage circuit, a clock reproduction unit (CDR: Clock Data Recovery) and a serial-parallel converter are provided, for example.

The reception signal received by the antenna 8236 is input to a variable-gain and low-noise reception amplification unit 8224 (LNA) and supplied to the demodulation functional unit 8400 after amplitude adjustment is performed on the reception signal. The amplitude-adjusted reception signal is input to the frequency mixing unit 8402, and a multiplication signal is generated by the frequency mixing unit 8402 by synchronous detection and supplied to the filter processing unit 8410. High-frequency components of the multiplication signal generated by the frequency mixing unit 8402 are removed by the low-pass filter of the filter processing unit 8410, whereby the waveform (baseband signal) of the input signal transmitted from the transmitting side is generated and supplied to the clock reproduction unit (not shown) through the buffer unit 8418. The clock reproduction unit reproduces a sampling clock based on the baseband signal and samples the baseband signal with the reproduced sampling clock to thereby generate a reception data sequence. The generated reception data sequence is supplied to the serial-parallel converter (not shown), and a parallel signal (for example, a 12-bit image signal) is reproduced. Although various methods can be used as the clock reproduction method, a symbol synchronization method is adopted, for example.

The receiving-side local oscillation unit 8404 is an example of a second high-frequency reference signal generation unit that generates a carrier signal (an example of a second high-frequency reference signal) of a higher frequency than that synchronized with the reference signal REFCLK_RX generated by the control/reference signal reproduction unit 7400. Although the receiving-side local oscillation unit 8404 may adopt various circuit configurations as long as it generates the carrier signal based on the reference signal REFCLK_RX, the receiving-side local oscillation unit 8404 is preferably configured as a PLL or a DLL, for example. In the following description, the PLL configuration will be described. The receiving-side local oscillation unit 8404 extracts a carrier signal for demodulation (demodulation carrier signal: called a reproduction carrier signal Lo_RX) of which the frequency and phase are exactly the same as (synchronized with) those of the transmitting-side carrier signal Lo_TX and supplies the reproduction carrier signal to the frequency mixing unit 8402. The frequency mixing unit 8402 multiplies the reproduction carrier signal Lo_RX with the reception signal. The multiplied output contains a modulation signal component (baseband signal) which is the transmission subject signal component, and high-frequency components (in some cases, including DC components).

The receiving-side local oscillation unit 8404 having the PLL configuration includes an oscillation unit 8462 (OSC), a frequency divider 8464 (DIV: feedback frequency divider), a phase frequency comparing unit 8466 (PFD), and a loop filter unit 8468. The oscillation unit 8462 may be, for example, any of a voltage-controlled oscillation circuit (VCO) and a current-controlled oscillation circuit (CCO) as long as it can generate a high-frequency signal of the same frequency as the transmitting-side carrier signal Lo_TX. The frequency divider 8464 is provided to realize a frequency multiplying function and divides the frequency Fo of the carrier signal Lo_RX output from the oscillation unit 8462 by a ratio of $1/\in\_RX$ to acquire a divided oscillation signal DIV_RX which is an example of a comparison clock signal. The "∈_RX" is a PLL multiplication factor (also called a frequency division ratio) which is a positive integer of 1 or more, and may be variable so that the frequency Fo of the carrier signal Lo_TX which is the PLL output clock can be changed (but be identical to that of the transmitting side). The phase frequency comparing unit 8466 compares the phase and frequency of the reference signal REFCLK_TX supplied from the control/reference signal receiving device 7 with the phase and frequency of the divided oscillation signal DIV_RX supplied from the frequency divider 8464 and generates a comparison result signal Vcp_RX serving as an error signal representing a phase difference and a frequency difference which are the comparison results. The phase frequency comparing unit 8466 is equivalent to the phase frequency comparing unit 8366 and the phase frequency comparing unit 5230. The loop filter unit 8468 is an example of a smoothing unit that smoothes the comparison signal output from the phase frequency comparing unit 8466 through a charge pump unit and is equivalent to the loop filter unit 8368 and the loop filter unit 5250. The loop filter unit 8468 includes a low-pass filter LPF as a filter circuit, for example, and integrates a charge pump current Icp_RX generated by the charge pump unit using the filter circuit and generates a loop filter output signal Slp_RX_ for controlling the oscillation frequency Fo of the oscillation unit 8462.

<Specific Application Example>

Hereinafter, exemplary embodiments of an electronic device which is an application example of the technique disclosed in the present specification using a combination of the control signal transmitting device, the control/reference signal transmission device, and the signal transmission device described above will be described.

[First Exemplary Embodiment]

FIGS. 8A and 8B are diagrams illustrating an electronic device of the first exemplary embodiment. FIG. 8A illustrates a configuration example of the electronic device of the first exemplary embodiment, and FIG. 8B illustrates an example of a frequency arrangement of a wireless signal in the electronic device of the first exemplary embodiment.

An electronic device 700A of the first exemplary embodiment includes a circuit substrate 701 and a circuit substrate 706. An LSI functional unit 702 which is the transmission source of the transmission subject signal, a transmission chip 801 having the function of a transmission subject signal transmitter, and a reception chip 807 having the function of a control signal receiver are mounted on the circuit substrate 701. An LSI functional unit 707 which is a transmission destination of the transmission subject signal, a reception chip 802 having the function of a transmission subject signal receiver and a transmission chip 806 having the function of a control signal transmitter are mounted on the circuit substrate 706.

The control signal CTRL is used for controlling various signal processing operations of the LSI functional units 702 and 707 and controlling the transmission state of the wireless signal for the transmission subject signal. In the latter case, for example, the control signal CTRL is used for setting a carrier frequency of the wireless signal for the transmission subject signal and setting the transmission power (transmission output level).

The LSI functional unit 702 and the LSI functional unit 707 perform major application control of a device (the electronic device 700). For example, the LSI functional units 702 and 707 include a circuit that processes various kinds of signals (image data or audio data) to be transmitted to a counterpart device and a circuit that processes various kinds of signals (image data or audio data) received from the counterpart device. Furthermore, the LSI functional units 702 and 707 include a control circuit that performs, for example, logical control such as data read/write control with respect to requests from the external or internal functional units thereof. Here, a control signal output unit 5600 is provided in the LSI functional unit 707.

As a product form, the circuit substrate 701 and the circuit substrate 706 may be included in the same housing to form one electronic device 700. Alternatively, as indicated by a one-dot chain line in the drawing, a first electronic device 700_1 in which the circuit substrate 701 is included in one housing and a second electronic device 700_2 in which the circuit substrate 706 is included in one housing are combined to form one electronic device 700A.

The transmission chip 801 of the first exemplary embodiment includes a modulation subject signal processing unit 712, a signal amplification unit 713, a modulation functional unit 8300, and a transmission amplification unit 8117. The transmission chip 801 is one in which power consumption decreases when the level (amplitude) of a wireless signal transmitted from the transmission amplification unit 8117 is low and increases when the level is high. A transmission subject signal DATA is supplied from the LSI functional unit 702 to the modulation subject signal processing unit 712. The modulation subject signal processing unit 712 includes a low-pass filter, for example, and limits the reception bandwidth of a modulation signal (the transmission subject signal DATA). The signal amplification unit 713 amplifies the amplitude of the signal output from the modulation subject signal processing unit 712 by a factor of its gain and supplies the amplified signal to a frequency mixing unit 8302 of the modulation functional unit 8300. The frequency mixing unit 8302 converts the transmission subject signal DATA into a high-frequency signal of a millimeter wave or the like, for example, and the converted signal is output as radio waves F1 of the carrier frequency Fo by the antenna 8136 serving as the electromagnetic wave output device. The transmission subject signal DATA is demodulated by the demodulation functional unit 8400 of the reception chip 802 based on the input from the antenna 8236 serving as the electromagnetic wave input device. The demodulated transmission subject signal DATA is supplied to the LSI functional unit 707 of a transmission destination through the filter processing unit 8410 and the buffer unit 8418.

The transmission chip 806 of the first exemplary embodiment includes a transmission control signal generation unit 5700 which includes the frequency modulation unit 5710, and the transmission amplification unit 5800. The frequency modulation unit 5710 includes an oscillation unit 5714 which is the same functional unit as the oscillation unit 5214. In this configuration, although the configuration of the control signal transmitting device 4B employing the FSK method is used, the configuration of the general-purpose control signal transmitting device 4A may be used. The reception chip 807 of the first exemplary embodiment includes the reception amplification unit 7700 and the control signal reproduction unit 7900 which includes the frequency demodulation unit 7910. In this configuration, although the configuration of the control signal receiving device 7PB employing the FSK method is used, the configuration of the general-purpose control signal receiving device 7PA may be used. The control signal CTRL is input from the control signal output unit 5600 of the LSI functional unit 707 to the reception chip 802 and the transmission chip 806. In the transmission chip 806, the control signal CTRL is converted into a high-frequency signal of the millimeter wave or the like and output as radio waves F2 of the carrier frequency FC by the antenna 5900 serving as the electromagnetic wave output device. As shown in FIG. 8B, preferably, the carrier frequency Fo of the radio waves F1 is different from the carrier frequency FC of the radio waves F2, so that crosstalk can be prevented even when space division multiplexing is not applied. In this case, the relationship between the carrier frequency Fo of the radio waves F1 and the carrier frequency FC of the radio waves F2 can be optionally set. When the carrier frequencies Fo and Fc are arranged in a band (for example, the millimeter band) where signals can be transmitted and received with one antenna, it is possible to use the same antenna and to reduce the device size. The control signal CTRL is demodulated by the reception chip 807 based on the input from the antenna 7600 serving as the electromagnetic wave input device. The demodulated control signal CTRL is transmitted to the LSI functional unit 702 and the transmission chip 801.

The control signal CTRL is used for dynamically controlling various signal processing operations of the LSI functional unit 702 and the gain setting (signal amplitude setting) of the transmission amplification unit 8117 and the reception amplification unit 8224 and setting the carrier frequencies Fo and FC. By using the control signal CTRL which is transmitted with a frequency different from the transmission subject signal DATA, it is possible to control the transmission state of the transmission chip 801 to realize optimal data transmission. The control signal CTRL has a lower data rate than the transmission subject signal DATA, and by transmitting the control signal CTRL at a low data rate, it is possible to achieve effective use of frequency bands.

In general communication, a communication range is a distance corresponding to the lowest reception sensitivity level of a receiver when the output level (transmission output level) of a transmitter is at its maximum. In this case, the output of the transmitter is maintained to be a high level, and the receiving side obtains a constant baseband signal by detecting the output signal and performing gain control in the receiver. However, when the communication range is short, the communication is performed with an unnecessarily high transmission output level, and the power consumption is also large. Moreover, since the receiver needs to receive a strong input signal, a circuit with good linearity is required, and the power consumption of the receiver also increases. When the transmission power is large, external radiation increases. On the other hand, when the transmission output level is set to a level as low as necessary based on the actual transmission characteristic when performing communication, it is possible to suppress unnecessary power consumption and to suppress unnecessary radiation. Moreover, when the transmission output level is determined and the reception signal level deviates from an intended range, the signal quality may be adjusted appropriately by controlling the reception amplification unit 8224 so that the signal level input to the demodulation functional unit 8400 is in a constant range.

In the case of intra-device communication when the circuit substrates 701 and 706 are included in the housing of one electronic device 700, rather than performing dynamic control using the control signal CTRL, a setting value processing unit that inputs a setting value defining the operations of the respective functional units to the respective functional units may be provided to fix setting parameters. Moreover, in the case of communication between devices when the circuit substrate 701 is included in the housing of the first electronic device 700_1, the circuit substrate 706 is included in the housing of the second electronic device 700_2, and the first and second electronic devices 700_1 and 700_2 are disposed at a relatively short distance, rather than performing dynamic control using the control signal CTRL, a setting value processing unit that inputs a setting value defining the operations of the respective functional units to the respective functional units may be provided in at least one of the first and second electronic devices 700_1 and 700_2 to fix setting parameters.

[Second Exemplary Embodiment]

FIGS. 9A to 9C are diagrams illustrating an electronic device of the second exemplary embodiment. FIG. 9A illustrates a configuration example of the electronic device of the second exemplary embodiment, and FIGS. 9B and 9C illustrate an example of a frequency arrangement of a wireless signal in the electronic device of the second exemplary embodiment.

An LSI functional unit 702, a transmission chip 801, and a reception chip 807 having the function of a control/reference signal receiver are mounted on a circuit substrate 701 of an electronic device 700B of the second exemplary embodiment. An LSI functional unit 707, a reception chip 802, and a transmission chip 806 having the function of a control/reference signal transmitter are mounted on a circuit substrate 706 of the electronic device 700B of the second exemplary embodiment. The LSI functional unit 707 includes an original signal generation unit 5100. The transmission chip 801 and the reception chip 802 associated with wireless transmission of the transmission subject signal are the same as the first exemplary embodiment.

The utilization form of the control signal CTRL is the same as the first exemplary embodiment. The reference signal J is used for setting the timing of various signal processing operations of the LSI functional units 702 and 707, generating a modulation carrier signal when generating the wireless signal for the transmission subject signal, and generating a demodulation carrier signal when receiving the wireless signal for the transmission subject signal to reproduce the transmission subject signal. The true purpose of using the control signal lies in achieving synchronization between the transmitting-side signal processing operation (including modulation processing) associated with the transmission subject signal and the receiving-side signal processing operation (including demodulation processing) associated with the transmission subject signal. By achieving synchronization between the transmission and reception operations, it is possible to obtain appropriate transmission signal quality.

The transmission chip 806 of the second exemplary embodiment includes the signal combination unit 5160, the transmission signal generation unit 5200, and the transmission amplification unit 5300. In this configuration, the configuration of the general-purpose control/reference signal transmitting device 5A is used. The reception chip 807 of the second exemplary embodiment includes the reception amplification unit 7200, the control/reference signal reproduction unit 7400, and the signal separation unit 7460. In this configuration, the configuration of the general-purpose control/reference signal receiving device 7A is used. The control signal CTRL and the reference signal J are input from the original signal generation unit 5100 of the LSI functional unit 707 to the reception chip 802 and the transmission chip 806. In the transmission chip 806, the signal combination unit 5160 combines the signals to generate the control/reference signal CTRL•J. The control/reference signal is converted into a high-frequency signal of the millimeter wave or the like by the transmission signal generation unit 5200 and output as radio waves F2 of the carrier frequency FC by the antenna 5400 serving as the electromagnetic wave output device. The use of a very high frequency like the millimeter-band frequency when wirelessly transmitting the control/reference signal CTRL•J enables small transmission and reception antennas to be used. The control/reference signal CTRL•J is demodulated by the reception chip 807 based on the input from the antenna 7100 serving as the electromagnetic wave input device. The signal separation unit 7460 separates the control/reference signal into the control signal CTRL and the reference J and transmits the signals to the LSI functional unit 702. The reference signal J can be used as the reference that determines the timing of various signal processing operations of the LSI functional unit 702 and also used for generating the carrier signal. In this way, various processes can be performed in synchronization with the reference signal J.

The frequency-synchronized reference signal REFCLK can be reproduced within a range where the control/reference signal CTRL•J_1 output from the control/reference signal transmitting device 5A can be received. Thus, the respective communication chips do not need to have a reference signal generation unit such as a crystal oscillator. Communication can be performed by reproducing the reference signal (in this example, the reference signal REFCLK) which is frequency-synchronized on the transmission and receiving sides and performing synchronous detection with a PLL or the like using the frequency-synchronized carrier signal. Since it is not necessary to use a plurality of crystal oscillators, interference is suppressed. Even if the frequency of the reference signal REFCLK_TX supplied from the control/reference signal receiving device 7A to the transmission chip 801 is different from the frequency of the reference signal REFCLK_RX used by the reception chip 802, since synchronization is achieved, interference is suppressed. In the signal transmission device 1 that performs communication, since the reference signal REFCLK transmitted by the control/reference signal transmission device 3 is used for generating the carrier signal, no particular functional element for achieving frequency synchronization is necessary other than the constituent elements shown in the drawing, and it is possible to simplify the device and circuit.

Since the carrier signal used for communication can be generated by the respective communication devices 2 based on the reference signal REFCLK, by using the different multiplication factors ∈ of the respective transmitter-receiver pairs, communication can be performed in a plurality of frequency bands. A plurality of frequencies can be used as carrier signals for the respective transmitter-receiver pairs. Although the circuit size increases since the control/reference signal transmitting device 5 and the control/reference signal receiving device 7 are required, the application to intra-device or inter-device signal transmission is ideal as one implementation method of intra-device or inter-device clock distribution.

In the second exemplary embodiment, by wirelessly transmitting the reference signal J and the control signal CTRL necessary for various signal processing in the LSI functional unit 702 and the transmission chip 801, it is possible to transmit these signals without using electric wirings. Moreover, since the control signal CTRL and the reference signal J are combined into one control/reference signal CTRL•J by the signal combination unit 5160 and transmitted as the wireless signal F2 in an integrated manner, it is possible to reduce the circuit size, the costs, and the power consumption, and achieve the effective use of transmission bands as compared to when the signals are transmitted separately.

As a modified example, rather than providing the signal combination unit 5160 and the signal separation unit 7460, for example, as shown in FIG. 9C, a wireless signal F3 (having a carrier frequency FJ) for the reference signal J may be used separately from the wireless signal F2 (having a carrier frequency FC) for the control signal CTRL, and they may be wirelessly transmitted separately. In this case, preferably, the wireless signal F1 for the transmission subject signal DATA, the wireless signal F2 for the control signal CTRL, and the wireless signal F3 for the reference signal J are in the millimeter band.

[Third Exemplary Embodiment]

FIGS. 10A to 10C are diagrams illustrating an electronic device of the third exemplary embodiment. FIG. 10A illustrates a configuration example of the electronic device of the third exemplary embodiment, and FIGS. 10B and 10C illustrate an example of a frequency arrangement of a wireless signal in the electronic device of the third exemplary embodiment.

An electronic device 700C of the third exemplary embodiment has a configuration in which the transmission signal generation unit 5200 and the control/reference signal reproduction unit 7400 of the second exemplary embodiment adopt the FSK method. That is, a transmission chip 806 of the third exemplary embodiment includes a signal combination unit 5160, a transmission signal generation unit 5200 which includes a frequency modulation unit 5210, and a transmission amplification unit 5300. A reception chip 807 of the third exemplary embodiment includes a reception amplification unit 7200, a control/reference signal reproduction unit 7400 having a frequency demodulation unit 7410, and a signal separation unit 7460.

The signal combination unit 5160 includes an encoding unit 410 that encodes a 2-valued control signal CTRL and a 2-valued clock signal CLK (an example of the reference signal J) to generate a 3-valued encoding data ENCout (an example of the control/reference signal CTRL•J which is a combined signal). The signal separation unit 7460 includes a decoding unit 460 decodes 3-valued decoding data DECin (an example of a decoded CTRL•J) to separate the data into the 2-valued control signal CTRL and the 2-valued clock signal CLK (an example of the reference signal). The other configurations are the same as the second exemplary embodiment. The decoding data DECin (the control signal CTRL and the clock signal CLK which are the original signals thereof) has a lower data rate than the transmission subject signal data, and by transmitting the decoding data DECin at a low data rate of FSK, it is possible to achieve effective use of frequency bands.

In the transmission chip 806, the control signal CTRL and the clock signal CLK are input to the encoding unit 410, whereby encoding data ENCout is generated. The encoding data ENCout is input to the oscillation unit 5214 of the frequency modulation unit 5210 as a frequency control signal, and the oscillation frequency thereof is changed based on the encoded value. The output of the frequency modulation unit 5210 is amplified by the transmission amplification unit 5300 (high-frequency amplifier) and output as radio waves by the antenna 5400 serving as the electromagnetic wave output device.

In the reception chip 807, the input from the antenna 7100 serving as the electromagnetic wave input device is amplified by the reception amplification unit 7200 (high-frequency amplifier) and is multiplied with the output of the oscillation unit 7414 by the frequency mixing unit 7412 (multiplier) of the frequency demodulation unit 7410. The high-frequency components included in the output signal are removed by the filter processing unit 7416, whereby a frequency error signal is output. The frequency error signal is fed back as a frequency control signal of the oscillation unit 7414, whereby the oscillation frequency of the oscillation unit 7414 is synchronized to be the same frequency as the carrier frequency FC of a wireless signal F2 for the received encoding data ENCout. In this case, the frequency error signal becomes decoding data DECin, which is decoded by the decoding unit 460 and separated into the control signal CTRL and the clock signal CLK.

Preferably, by setting the frequency variation range in the frequency modulation unit 5210 to be narrower than the frequency capturing range in the frequency demodulation unit 7410, it is possible to realize transmission of the control signal and the reference signal which does not require frequency adjustment. In this way, by performing transmission by controlling the operations of the LSI functional unit 702 and the transmission chip 801 for high data rate transmission using the control signal CTRL_2 and the reference signal J_2 decoded by the control/reference signal transmitting device 5AB, it is possible to optimize the signal quality and the power consumption of the high data rate transmission.

[Encoding Unit]

FIGS. 11A to 11D are diagrams illustrating a configuration example of the encoding unit 410 and the operation thereof. FIG. 11A illustrates a circuit configuration example of the encoding unit 410. FIG. 11B is a state transition diagram illustrating the operation states of the respective functional units of the encoding unit 410. FIG. 11C is a waveform diagram (timing chart) illustrating the operation of the encoding unit 410. FIG. 11D is a frequency arrangement diagram illustrating the relationship between the encoding output and frequencies.

As shown in FIG. 11A, the encoding unit 410 includes an inverter 412 and an EX-OR gate 414 (exclusive OR circuit) serving as a gate circuit, and a differential amplification circuit 420. The control signal CTRL is input to the inverter 412. The control signal CTRL is input to one input terminal of the EX-OR gate 414 and the clock signal CLK is input to the other input terminal thereof. The output of the inverter 412 is connected to one input terminal in_1 (an inverting input terminal) of the differential amplification circuit 420, and the output of the EX-OR gate 414 is connected to the other input terminal in_2 (a non-inverting input terminal) of the differential amplification circuit 420. The state of the control signal CTRL is changed in synchronization with the falling edges between the falling edges (negedge) and the rising edges (posedge) of the clock signal CLK. To achieve this, for example, the control signal CTRL may be latched to the falling edges of the clock signal CLK.

The differential amplification circuit 420 includes an N-channel MOS transistor (NMOS), a current source, and a load. Specifically, the differential amplification circuit 420 includes a NMOS 422, a NMOS 424, a current source 426, a current source 428, and a load resistor 430. The NMOS 422 has a control input terminal (the gate) which is connected to the input terminal in_1 and one main electrode terminal (one of the source and drain: in this example, the source) which is grounded through the current source 426. The NMOS 424 has a control input terminal which is connected to the input terminal in_2 and one main electrode terminal (one of the source and drain: in this example, the source) which is grounded through the current source 428. The other main electrode terminals (the other of the source and drain: in this example, the drain) of the NMOSs 422 and 424 are connected in common to a power line 432 through the load resistor 430. A power voltage Vdd is supplied to the power line 432. The connection point node between the other main electrode terminals of the NMOSs 422 and 424 and one terminal of the load resistor 430 is connected to the output terminal out of the encoding unit 410, and the encoding data ENCout is output from the output terminal out. The encoding data ENCout takes "+1" when both NMOSs 422 and 424 are turned off so that the potential of the connection point node is at the highest voltage (approximately the power voltage Vdd), takes "−1" when both NMOSs 422 and 424 are turned on so that the potential of the connection point node is at the lowest voltage (approximately the ground voltage), and takes "0" when only one of the NMOSs 422 and 424 is turned on so that the potential of the connection point node is at an intermediate voltage.

FIG. 11B illustrates the clock signal CLK, the control signal CTRL, the control input terminals of the NMOSs 422 and 424, the encoding data ENCout, and the frequency corresponding to the encoding data ENCout. FIG. 11C is the timing chart illustrating the operation of the encoding unit 410. When the control signal CTRL is "1" (H: high level) in a period (from the rising edge to the falling edge) where the clock signal CLK is "1" (H: high level), the control input terminal (the output of the inverter 412) of the NMOS 422 becomes "0" (L: low level), the control input terminal (the output of the EX-OR gate 414) of the NMOS 424 also becomes "0" (L: low level), and the NMOSs 422 and 424 are turned off, whereby the encoding data ENCout takes "+1." When the control signal CTRL is "0" in the period where the clock signal CLK is "1," the control input terminal (the output of the inverter 412) of the NMOS 422 becomes "1," the control input terminal (the output of the EX-OR gate 414) of the NMOS 424 also becomes "1," and the NMOSs 422 and 424 are turned on, whereby the encoding data ENCout takes "−1."

When the control signal CTRL is "0" in a period (from the falling edge to the rising edge) where the clock signal CLK is "0," the control input terminal (the output of the inverter 412) of the NMOS 422 becomes "1," the control input terminal (the output of the EX-OR gate 414) of the NMOS 424 also becomes "0," and the NMOS 422 is turned on and the NMOS 424 is turned off, whereby the encoding data ENCout takes "0." Moreover, when the control signal CTRL is "1" in a period (from the falling edge to the rising edge) where the clock signal CLK is "0," the control input terminal (the output of the inverter 412) of the NMOS 422 becomes "0," the control input terminal (the output of the EX-OR gate 414) of the NMOS 424 also becomes "1," and the NMOS 422 is turned off and the NMOS 424 is turned on, whereby the encoding data ENCout takes "0." That is, when the clock signal CLK is "0," only one of the NMOSs 422 and 424 is turned on regardless of whether the control signal CTRL is "0" or "1," whereby the encoding data ENCout takes "0."

The FSK modulation frequency is set so that the modulation frequency is "FH" when the encoding data ENCout is "+1," is "FC" when the encoding data ENCout is "0," and is "FL" when the encoding data ENCout is "−1." As shown in FIG. 11D, the respective frequencies are arranged so as to satisfy the relationship of FL<FC<FH. In this way, by performing FSK modulation with the encoding data ENCout obtained from a combination of the control signal CTRL and the clock signal CLK, a 3-valued frequency modulation signal is generated.

[Decoding Unit]

FIGS. 12A to 12C are diagrams illustrating a configuration example of the decoding unit 460 and the operation thereof. FIG. 12A illustrates a circuit configuration example of the decoding unit 460. FIG. 12B is a state transition diagram illustrating the operation states of the respective functional units of the decoding unit 460. FIG. 12C is a waveform diagram (timing chart) illustrating the operation of the decoding unit 460.

As shown in FIG. 12A, the decoding unit 460 includes a comparator 462, a comparator 464, an EX-OR gate 466 (exclusive OR circuit), an inverter 468, an inverter 470, and an RSFF 480 (RS flip-flop). The comparators 462 and 464 are an example of a comparing unit that compares the decoding data DECin which is the reproduced output of the wireless signal modulated by the FSK method with a determination reference value. The EX-OR gate 466, the inverters 468 and 470, and the RSFF 480 form a logical circuit unit that generates the control signal CTRL and the clock signal CLK which is the reference signal based on the comparison result by the comparing unit.

The output of the comparator 462 is input to one input terminal of the EX-OR gate 466, the output of the comparator 464 is input to the other input terminal, and the output of the EX-OR gate 466 is input to the inverter 468. The output signal of the inverter 468 is used as the clock signal CLK. The output of the comparator 462 is supplied to the reset input terminal R of the RSFF 480 through the inverter 470, and the output of the comparator 464 is supplied to the set input terminal S of the RSFF 480. The non-inverting output terminal Q of the RSFF 480 is connected to the output terminal out of the RSFF 480, and the control signal CTRL is output from the output terminal out. The decoding data DECin is input in common to one set of input terminals (+: non-inverting input terminals) of the comparators 462 and 464. A first reference voltage Th1 is input to the other input terminal (−: inverting input terminal) of the comparator 462 as the determination reference value, and a second reference voltage Th2 (Th1<Th2) is input to the other input terminal (−: inverting input terminal) of the comparator 464 as a determination reference value. The comparator 462 outputs "1" when the decoding data DECin is larger than the reference voltage Th1 and outputs "0" when the decoding data DECin is smaller than the reference voltage Th1. The comparator 462 outputs "1" when the decoding data DECin is larger than the reference voltage Th2 and outputs "0" when the decoding data DECin is smaller than the reference voltage Th2.

When the minimum value of the decoding data DECin is "Min," the maximum value is "Max," the intermediate value is "Mid," and the amplitude W is "Max-Min," the reference voltages Th1 and Th2 are ideally determined as follows. In a first determination method, Th1 is about "Mid-W/4" and Th2 is about "Mid+W/4." In a second determination method, Th1 is about "Min+W/4" and Th2 is about "Min+3W/4." In a third determination method, Th1 is about "Max-3W/4" and Th2 is about "Max-W/4." It is preferable to provide a level detection unit 492 and a reference value determination unit 494 as indicated by a broken line in the drawing as a circuit configuration that such setting to be realized without being affected by the DC level (DC voltage level) of the decoding data DECin which is the decoded output. The level detection unit 492 receives the wireless signal Scj modulated by the FSK method to detect a predetermined level of the reproduced combined signal (in this example, the decoding data DECin). The reference value determination unit 494 determines a determination reference value (in this example, the first and second reference voltages Th1 and Th2) based on the detection result by the level detection unit 492 and a predetermined equation. For example, when the first determination method is adopted, a detector that detects the minimum value Min, the maximum value Max, and the intermediate value Mid is provided in the level detection unit 492, and the reference value determination unit 494 determines the first and second reference voltages Th1 and Th2 based on the above equation using the detection result. When the second and third determination methods are adopted, a detector that detects the minimum value Min and the maximum value Max is provided in the level detection unit 492, and the reference value determination unit 494 determines the first and second reference voltages Th1 and Th2 based on the above equation using the detection result. Since the amplitude W is a value that can be predicted to some extent, a detector that detects any one of the minimum value Min, the maximum value Max, and the intermediate value Mid may be provided in the level detection unit 492, and the reference value determination unit 494 may determine the first and second reference voltages Th1 and Th2 based on the above equation using the detection result and the predicted amplitude W.

The RSFF 480 outputs "0" from its non-inverting output terminal if the reset input terminal R becomes "1" when the set input terminal S is "0" and outputs "1" from its non-inverting output terminal if the set input terminal S becomes "1" when the reset input terminal R is "0." To allow the RSFF 480 to perform such an operation, as an example, the RSFF 480 includes an inverter 482, a NAND gate 484, a NAND gate 486, a NAND gate 488, and a DFF 490 (D-type flip-flop circuit). The NAND gates 484, 486, and 488 are 2-input and 1-output NAND gates. The non-inverting output terminal Q of the DFF 490 is connected to the output terminal out of the RSFF 480 and is also connected to the input terminal of the inverter 482 and one input terminal of the NAND gate 486. The output terminal of the inverter 482 is connected to the data input terminal D of the DFF 490 and is also connected to one input terminal of the NAND gate 484. Rather than using the inverter 482, the inverting output terminal xQ of the DFF 490 may be connected to the data input terminal D of the DFF 490 and one input terminal of the NAND gate 484. The other input terminal of the NAND gate 484 is connected to the set input terminal S of the RSFF 480, and the other input terminal of the NAND gate 486 is connected to the reset input terminal R of the RSFF 480. The NAND gate 488 has one input terminal connected to the output terminal of the NAND gate 484, the other input terminal connected to the output terminal of the NAND gate 486, and the output terminal connected to the clock input terminal CK of the DFF 490. The DFF 490 takes in and holds the state of the data input terminal D at the rising edge of the signal (that is, the output signal of the NAND gate 488) of the clock input terminal CK.

FIG. 12B illustrates the decoding data DECin input to the decoding unit 460, the operation states of the main functional units of the decoding unit 460, and the operation states of the clock signal CLK and the control signal CTRL recovered by the decoding unit 460. FIG. 12C is a timing chart illustrating the operation of the decoding unit 460. When the frequency changes from "FH" to "FC," the decoding data DECin changes from "+1" to "0." In this case, since the output of the comparator 462 is at "1" and the output of the comparator 464 changes from "1" to "0," the set input terminal S of the RSFF 480 changes from "1" to "0" with the reset input terminal R being at "0." In this case, if the previous control signal CTRL is "0," since the output of the NAND gate 486 is "1" and the output (one input of the NAND gate 484) of the inverter 482 is "1," the output of the NAND gate 484 changes from "0" to "1," and the output of the NAND gate 488 changes from "1" to "0." Since this is the falling edge in relation to the clock input terminal CK of the DFF 490, the output of the DFF 490 does not change. Moreover, if the previous control signal CTRL is "1," since the output (one input of the NAND gate 484) of the inverter 482 is "0," the output of the NAND gate 484 is "1," the output of the NAND gate 486 is "1," and the output of the NAND gate 488 is "0," the output of the DFF 490 does not change.

When the frequency changes from "FL" to "FC," the decoding data DECin changes from "−1" to "0." In this case, since the output of the comparator 464 is at "0," and the output of the comparator 462 changes from "0" to "1," the reset input terminal R of the RSFF 480 changes from "1" to "0" with the set input terminal S being at "0." In this case, if the previous control signal CTRL is "1," the output (one input of the NAND gate 484) of the inverter 482 is "0," the output of the NAND gate is "1," the output of the NAND gate 484 is "0," and the output of the NAND gate 486 changes from "0" to "1," the output of the NAND gate 488 changes from "1" to "0." Since this is a falling edge in relation to the clock input terminal CK of the DFF 490, the output of the DFF 490 does not change. Moreover, if the previous control signal CTRL is "0," the output of the NAND gate 486 is "1," the output of the NAND gate 484 is "1," and the output of the NAND gate 488 is "0," the output of the DFF 490 does not change.

When the frequency changes from "FC" to "FH," the decoding data DECin changes from "0" to "+1." In this case, since the output of the comparator 462 is at "1," and the output of the comparator 464 changes from "0" to "1," the set input terminal S of the RSFF 480 changes from "0" to "1" with the reset input terminal R being at "0." In this case, if the previous control signal CTRL is "0," since the output (one input of the NAND gate 484) of the inverter 482 is "1," the output of the NAND gate 484 changes from "1" to "0," the output of the NAND gate 486 is "1," and the output of the NAND gate 488 changes from "0" to "1." Since this is a rising edge in relation to the clock input terminal CK of the DFF 490, the DFF 490 takes in and holds the state (that is, the output "1" of the inverter 482) of the data input terminal D, and the output of the DFF 490 changes from "0" to "1." Moreover, if the previous control signal CTRL is "1," since the output (one input of the NAND gate 484) of the inverter 482 is "0," the output of the NAND gate 486 is "1," the output of the NAND gate 484 is "1," and the output of the NAND gate 488 is "0," the output of the DFF 490 does not change.

When the frequency changes from "FC" to "FL," the decoding data DECin changes from "0" to "−1." In this case, since the output of the comparator 464 is at "0," and the output of the comparator 462 changes from "1" to "0," the reset input terminal R of the RSFF 480 changes from "0" to "1" with the set input terminal S being at "0." In this case, if the previous control signal CTRL is "1," since the output (one input of the NAND gate 484) of the inverter 482 is "0," the output of the NAND gate 484 is "1," the output of the NAND gate 486 changes from "1" to "0," and the output of the NAND gate 488 changes from "0" to "1." Since this is a rising edge in relation to the clock input terminal CK of the DFF 490, the DFF 490 takes in and holds the state (that is, the output "0" of the inverter 482) of the data input terminal D, and the output of the DFF 490 changes from "1" to "0." Moreover, if the previous control signal CTRL is "0," since the output of the NAND gate 486 is "1," the output of the NAND gate 484 is "1," and the output of the NAND gate 488 is "0," the output of the DFF 490 does not change.

When the respective outputs of the comparators 462 and 464 are "0" or "1," since the output of the EX-OR gate 466 becomes "0," the clock signal CLK (that is, the output signal of the inverter 468) becomes "1." When only one of the outputs of the comparators 462 and 464 is "1," since the output of the EX-OR gate 466 becomes "1," the clock signal CLK (that is, the output signal of the inverter 468) becomes "0."

As above, the changes in frequency "FC→→FH" and "FC→FL" are detected with the comparators 464 and 464, and the control signal CTRL is changed in a manner of "0→1" and "1→0" and is recovered. On the other hand, a rising edge occurs in the clock signal CLK when the frequency changes in a manner of "FC→FH" and "FC→FL," and a falling edge occurs in the clock signal CLK when the frequency changes in a manner of "FH→FC" and "FL→FC."

With the above configuration, it is possible to easily combine the control signal CTRL and the clock signal CLK to obtain a 3-valued FSK modulation signal. Moreover, by transmitting and decoding the 3-valued FSK modulation signal, it is possible to recover the control signal CTRL and the clock signal CLK. In this way, it is possible to transmit the control signal CTRL and the clock signal CLK in an integrated manner and to reduce the circuit size, the costs, and the power consumption, and achieve the effective use of transmission bands as compared to when the signals are transmitted separately.

[Fourth Exemplary Embodiment]

The fourth exemplary embodiment illustrates application examples of the first to third exemplary embodiments to a more specific electronic device. Three representative examples are shown below.

[First Example]

FIGS. 13A to 13D are diagrams illustrating the first example of an electronic device of the fourth exemplary embodiment. The first example is an application example in which wireless signal transmission is performed within the housing of one electronic device. An application example to an imaging device including a solid-state imaging device is illustrated as the electronic device. Imaging devices of this type are available on the market, for example, as a digital camera, a video camera (camcorder), or a camera (Web camera) of a computer device.

The first communication device is mounted on a main substrate on which a control circuit, an image processing circuit, and the like are mounted, and the second communication device is mounted on an imaging substrate (camera substrate) on which a solid-state imaging device is mounted. In the following description, a case where data are wirelessly transmitted in the millimeter band and the control signal and the reference signal are wirelessly transmitted in the millimeter band will be described.

An imaging substrate 502 and a main substrate 602 are disposed in a housing 590 of an imaging device 500. A solid-state imaging device 505 is mounted on the imaging substrate 502. For example, the solid-state imaging device 505 is a CCD (Charge Coupled Device). The solid-state imaging device 505 may be mounted on the imaging substrate 502 together with the driving unit thereof (vertical and horizontal drivers), and the solid-state imaging device 505 may be a CMOS (Complementary Metal-Oxide Semiconductor). The semiconductor chip 103 is mounted on the main substrate 602, and a semiconductor chip 203 is mounted on the imaging substrate 502. Although not shown, a peripheral circuit such as an imaging driving unit as well as the solid-state imaging device 505 is also mounted on the imaging substrate 502, and an image processing engine 605, an operation unit, and various sensors are mounted on the main substrate 602. The function of the control/reference signal transmitting device 5 is incorporated into any one of a semiconductor chip 103 and a semiconductor chip 203. The function of the control/reference signal receiving device 7 is incorporated into each of the semiconductor chips 103 and 203 (excluding one having the function of the control/reference signal transmitting device 5). For example, the function equivalent to the transmission chip 806 as well as the transmission chip 801 and the reception chip 802 is incorporated into the semiconductor chip 103, and the function equivalent to the reception chip 807 as well as the transmission chip 801 and the reception chip 802 is incorporated into the semiconductor chip 203. By incorporating the functions of both the transmission chip 801 and the reception chip 802 into each of the semiconductor chips 103 and 203, it is possible to perform bidirectional communication.

The solid-state imaging device 505 and the imaging driving unit correspond to the LSI functional unit on the first communication device side. The LSI functional unit is connected to the transmitting-side signal generation unit and is also connected to an antenna 236 (transmitting position) through a transmission path coupling unit. The signal generation unit and the transmission path coupling unit are included in the semiconductor chip 203 which is different from the solid-state imaging device 505 and mounted on the imaging substrate 502. The image processing engine, the operation unit, and various sensors correspond to the application functional unit of the LSI functional unit on the second communication device side, and an image processing unit that processes the image signals obtained by the solid-state imaging device 505 is included. The LSI functional unit is connected to the receiving-side signal generation unit and is also connected to an antenna 136 (receiving position) through a transmission path coupling unit. The signal generation unit and the transmission path coupling unit are included in the semiconductor chip 103 which is different from the inner groove portion and mounted on the main substrate 602. The transmitting-side signal generation unit includes, for example, a multiplexing processing unit, a parallel-serial converter, a modulation unit, a frequency converter, and an amplification unit, and the receiving-side signal generation unit includes, for example, an amplification unit, a frequency converter, a demodulation unit, a serial-parallel converter, and a unification processing unit. The same holds true for the other application examples described later. Wireless communication is performed between the antennas 136 and 236, whereby the image signals acquired by the solid-state imaging device 505 are transmitted to the main substrate 602 through the wireless signal transmission path 9 between the antennas. Bidirectional communication may be performed. In this case, the reference signal and various control signals for controlling the solid-state imaging device 505, for example, are transmitted to the imaging substrate 502 through the wireless signal transmission path 9 between the antennas.

Figure 13A:
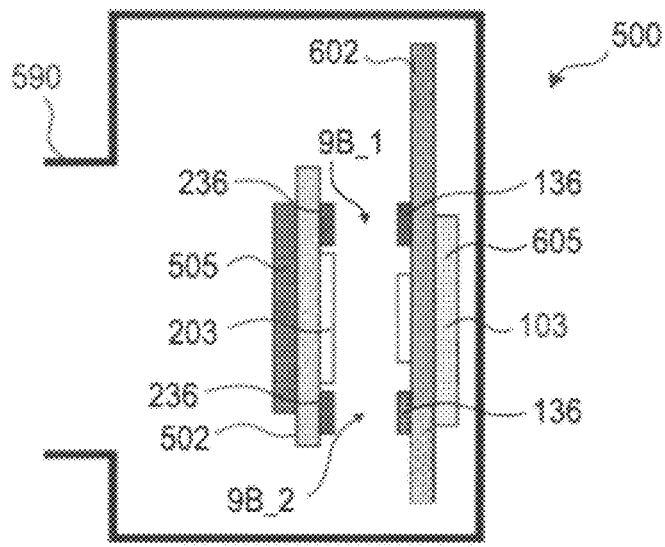
FIGS. 13A to 13D are diagrams illustrating a first example of an electronic device according to a fourth exemplary embodiment.
Figure 13C:
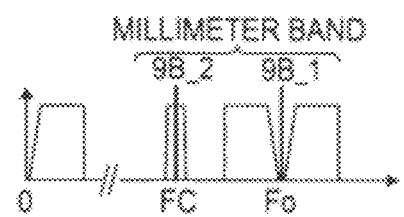
Figure 13B:
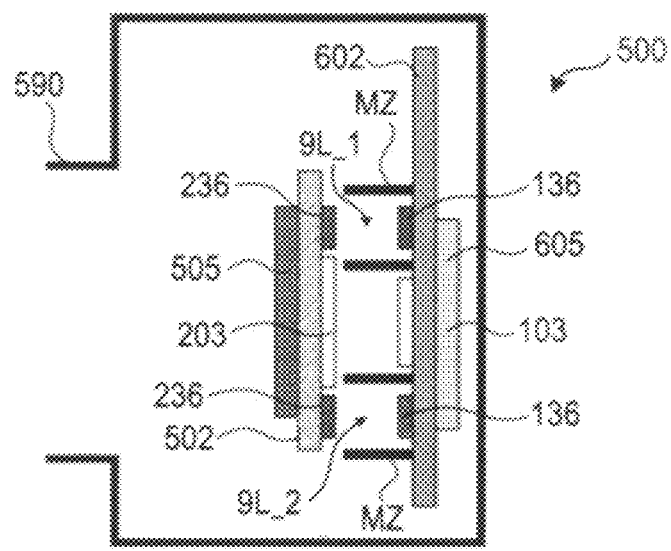
Figure 13D:
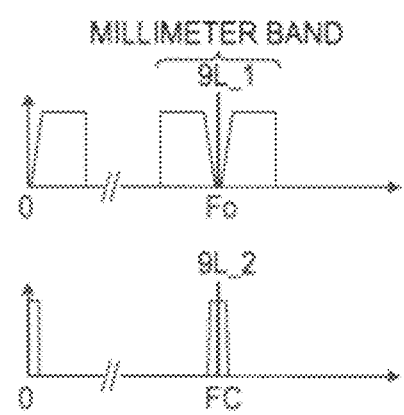

Two systems of wireless signal transmission paths 9 are provided in any of FIGS. 13A and 13B so that one wireless signal transmission path is used for data communication, and the other is used for transmitting the reference signal and various control signals. For example, in the example shown in FIG. 13A, a free space transmission path 9B is used as the wireless signal transmission path 9. In this case, as the distance between systems (inter-channel distance: corresponding to the distance between two transmitting-side antennas in this example) decreases, the respective wireless signal transmission paths 9 are disposed closer to each other. Thus, when the respective systems perform communication simultaneously using the same carrier frequency, interference and crosstalk on the receiver side may cause problems. When it is difficult to adjust the arrangement of the transmitting-side antenna (aerial line), the electromagnetic wave output intensity of the transmitting-side antenna, and the arrangement of the receiving-side antenna and the inter-channel distance is short so that it is difficult to avoid interference and crosstalk of the electromagnetic transmission path, the free space transmission paths 9B_1 and 9B_2 use different carrier frequencies. For example, as shown in FIG. 13C, the carrier frequency Fo at the free space transmission path 9B_1 for data transmission and the carrier frequency FC at the free space transmission path 9B_2 for the reference signal and various control signals are separated to an extent such that no interference occurs. In FIG. 13B, a hollow waveguide 9L which is surrounded by a shielding member MZ and which has a hollow structure is used as the wireless signal transmission path 9, so that space division multiplexing is applied. When space division multiplexing is applied, as shown in FIG. 13D, no interference occurs even when the carrier frequency Fo for data transmission is identical to the carrier frequency FC for the reference signal and various control signal. For example, the wall of an electromagnetic wave shielding member (conductor MZ: metal or the like) is formed on the main substrate 602 so as to surround the antenna 136 so that the hollow waveguide 9L_1 for data communication and the hollow waveguide 9L_2 for the reference signal and various control signals are separated from each other in terms of communication space. The antenna 236 on the imaging substrate 502 side is disposed at a position facing the antenna 136. Since the hollow waveguide 9L has the conductor MZ which is hollow, it is possible to form the wireless signal transmission path 9 easily and at a low cost without using a dielectric material.

[Second Example]

FIGS. 14A to 14C are diagrams illustrating the second example of the electronic device of the fourth exemplary embodiment. The second example is an application example in which wireless signal transmission is performed between electronic devices when a plurality of electronic devices are integrated with each other. In particular, an application example in which signals are transmitted between electronic devices when one electronic device is attached to the other electronic device is illustrated. In the following description, a case where data are wirelessly transmitted in the millimeter band and the control signal and the reference signal are wirelessly transmitted in the millimeter band will be described.

For example, a card-type information processing device generally represented by a so-called IC card or a so-called memory card in which a central processing unit (CPU) and a nonvolatile storage device (for example, a flash memory) are included is configured to be attached (removably attached) to a body-side electronic device. The card-type information processing device which is an example of one (first) electronic device will also be referred to as a "card-type device." The other (second) electronic device on the body side will be simply referred to as an "electronic device."

An exemplary structure (planar and sectional perspective view) of a memory card 201B is illustrated in FIG. 14A. An exemplary structure (planar and sectional perspective view) of an electronic device 101B is illustrated in FIG. 14B. An exemplary structure (sectional perspective view) when the memory card 201B is inserted into a slot structure 4 (in particular, an opening 192) of the electronic device 101B is illustrated in FIG. 14C.

The slot structure 4 has a configuration such that the memory card 201B (a housing 290 thereof) is inserted from the opening 192 to be fixed to a frame 190 of the electronic device 101B. A receiving-side connector 180 is formed at a position of the slot structure 4 contacting the terminals of the memory card 201B. As for signals which are wirelessly transmitted, connector terminals (connector pins) are not required.

As shown in FIG. 14A, a cylindrical concave structure 298 (depression) is formed in the housing 290 of the memory card 201B. As shown in FIG. 14B, a cylindrical convex structure 198 (protrusion) is formed on the frame 190 of the electronic device 101B. The memory card 201B includes the semiconductor chip 203 on one surface of a substrate 202, and the antenna 236 is formed on one surface of the substrate 202. The function equivalent to the reception chip 807 as well as the transmission chip 801 and the reception chip 802 is incorporated into the semiconductor chip 203. The concave structure 298 is formed on the same surface of the housing 290 as the antenna 236, and the portion of the concave structure 298 is formed of a dielectric resin including a dielectric material capable of wirelessly transmitting signals. On one side of the substrate 202, connection terminals 280 for connecting to the electronic device 101B at a determined position of the housing 290 are formed at a determined position. As for the terminal structure of the memory card 201B, the existing terminals for those (data, the control signal, and the reference signal) which can be the subjects of signal transmission in the millimeter wave are removed as indicated by the broken lines in the drawing, and the existing terminal structures for low-speed, small-volume signals and power supply excluding the above terminals are provided in a part of the memory card 201B.

As shown in FIG. 14B, the electronic device 101B includes the semiconductor chip 103 on a surface of the substrate 102 close to the opening 192, and the antenna 236 is formed on one surface of the substrate 102. The function equivalent to the transmission chip 806 as well as the transmission chip 801 and the reception chip 802 is incorporated into the semiconductor chip 103. The frame 190 has the slot structure 4 in which the opening 192 is formed so that the memory card 201B is inserted into and removed from the opening 192. The convex structure 198 having a millimeter wave confining structure (waveguide structure) is formed in a portion of the frame 190 corresponding to the position of the concave structure 298 when the memory card 201B is inserted into the opening 192 so that a dielectric transmission path 9A is formed.

As shown in FIG. 14C, the frame 190 of the slot structure 4 has a mechanical structure such that the convex structure 198 (the dielectric transmission path 9A) and the concave structure 298 make concave-convex contact when the memory card 201B is inserted from the opening 192. When the concave and convex structures engage with each other, the antenna 136 faces the antenna 236, and the dielectric transmission path 9A serving as the wireless signal transmission path 9 is disposed between the antennas. In this way, data, the control signal, and the reference signal can be wirelessly transmitted between the antenna 136 and the antenna 236. In this case, the carrier frequency Fo for data communication and the carrier frequency FC for the control signal and the reference signal are separated from each other to an extent such that no interference occurs within a range where the same antennas 136 and 236 can be shared (see FIG. 15D described later). Although the housing 290 of the memory card 201B is disposed between the dielectric transmission path 9A and the antenna 236, since the portion of the concave structure 298 is formed of a dielectric material, there is no great influence on the wireless transmission in the millimeter band.

[Third Example]

FIGS. 15A to 15D are diagrams illustrating the third example of the electronic device of the fourth exemplary embodiment. The signal transmission device 1 includes a portable image reproduction device 201K as an example of a first electronic device and also includes an image acquisition device 101K as an example of a second (body-side) electronic device on which the image reproduction device 201K is mounted. In the image acquisition device 101K, amount 5K on which the image reproduction device 201K is mounted is formed in a part of the housing 190 thereof. Similarly to the second example, the slot structure 4 may be formed instead of the mount 5K. Similarly to the second example, signals are wirelessly transmitted between both electronic devices when one electronic device is mounted on the other electronic device. In the following description, only the difference from the second example will be described.

The image acquisition device 101K has an approximately rectangular (box) shape and thus cannot be said to be a card type. As an example of the image acquisition device 101K, a digital recording and reproducing device and a terrestrial television receiver may be used as long as it acquires movie data, for example. As an application function, the image reproduction device 201K includes a storage device that stores movie data transmitted from the image acquisition device 101K and a functional unit that reads the movie data from the storage device to reproduce movie on a display unit (for example, a liquid crystal display device or an organic EL display device). Comparing the structures, it can be said that the memory card 201B is substituted with the image reproduction device 201K, and the electronic device 101B is substituted with the image acquisition device 101K.

Inside the frame 190 under the mount 5K, similarly to the second example, the antenna 136 is formed at a position where the semiconductor chip 103 is included. The dielectric transmission path 9A formed of a dielectric material is formed in a portion of the frame 190 facing the antenna 136 as the wireless signal transmission path 9. Inside the frame 290 of the image reproduction device 201K mounted on the mount 5K, similarly to the second example, for example, the semiconductor chip 203 is included, and the antenna 236 is formed so as to correspond to the semiconductor chip 203. The wireless signal transmission path 9 (the dielectric transmission path 9A) formed of a dielectric material is formed in a portion of the frame 290 facing the antenna 236. These configurations are the same as those of the second example described above.

The third example employs a wall bumping structure rather than an engaging structure. When the image acquisition device 101K is placed so as to bump into the corner 101a of the mount 5K, the antenna 136 faces the antenna 236, and the dielectric transmission path 9A serving as the wireless signal transmission path 9 is disposed between the antennas. Thus, it is possible to reliably eliminate the influence of misalignment. With this configuration, when mounting (attaching) the image reproduction device 201K on the mount 5K, it is possible to perform alignment for wireless signal transmission of the image reproduction device 201K. Thus, data, the control signal, and the reference signal can be wirelessly transmitted between the antennas 136 and 236. In this case, as shown in FIG. 15D, the carrier frequency Fo for data communication and the carrier frequency FC for the control signal and the reference signal are separated from each other to an extent such that no interference occurs within a range where the same antennas 136 and 236 can be shared. Although the housings 190 and 290 are disposed between the antennas 136 and 236, since the housings are formed of a dielectric material, there is no great influence on the wireless transmission in the millimeter band.

<Comparison with Comparative Examples>

[First Comparative Example]

Figure 16A:
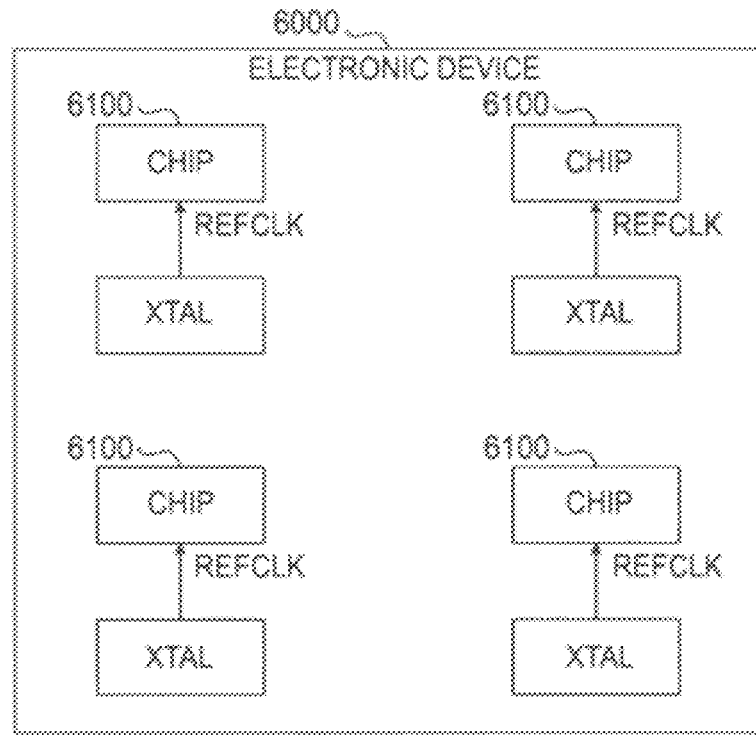
FIGS. 16A and 16B are diagrams illustrating a first comparative example.
Figure 16B:
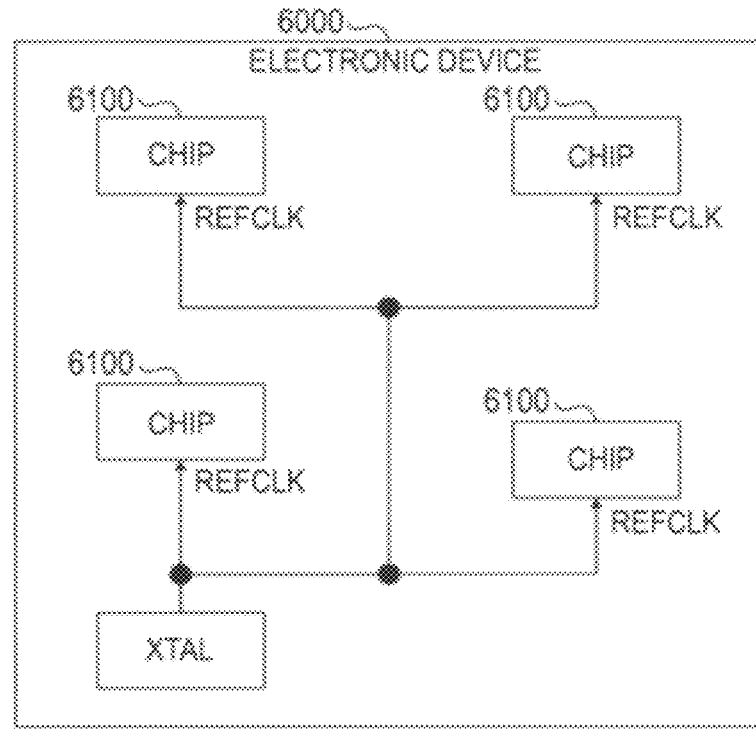

FIGS. 16A and 16B are diagrams illustrating the first comparative example. The first comparative example is a comparative example of the "method of supplying a reference signal." A plurality of chips 6100 requiring the reference signal REFCLK are disposed in an electronic device 6000.

In the first comparative example (Example 1) shown in FIG. 16A, each chip 6100 includes the same original reference signal generation unit 6100 as the original reference signal generation unit 5100 as a functional unit that generates the reference signal REFCLK serving as the clock of a digital circuit or the reference of a synthesizer. The original reference signal generation unit 6100 generates the reference signal REFCLK having the frequency fck using a crystal oscillator (XTAL) as an example. Even if the frequencies of the reference signals REFCLK generated by the respective chips 6100 are made identical, since the crystal oscillators at respective positions have fluctuations, it is difficult to make the frequencies exactly identical to each other. Moreover, since the crystal oscillators operate independently, the frequencies are not synchronized. In this case, since the plurality of reference signals REFCLK interfere with each other, noise countermeasures are required. As in the case of the first comparative example (Example 2) shown in FIG. 16B, a crystal oscillator (XTAL) may be connected to any one of the respective chips 6100, and one chip 6100 may generate the reference signal REFCLK and supply the same to the remaining chips 6100. In this case, since the same reference signal REFCLK is used, there is no problem associated with a shift of frequency and phase synchronization, and no interference occurs. Thus, noise countermeasures are not required. However, wirings 6120 for sharing the reference signal REFCLK are required, and the problem of unnecessary radiation may occur when the level of the reference signal REFCLK increases.

[Second Comparative Example]

FIGS. 17A and 17B are diagrams illustrating the second comparative example. The basic configuration of the second comparative example is similar to the configuration of the present embodiment shown in FIG. 7. The second comparative example (Example 1) shown in FIG. 17A is the same as the present embodiment in that the carrier signal Lo_TX and the carrier signal Lo_RX are generated based on the same reference signal REFCLK, and synchronization (in both frequency and phase) of the carrier signal is achieved. However, wirings 6230 for sharing the reference signal REFCLK are required, and the problem of unnecessary radiation occurs when the level of the reference signal REFCLK increases. In the case of the second comparative example (Example 2) shown in FIG. 17B, when using individual reference signals REFCLK which are not synchronized, it is necessary to provide a synchronization circuit 8149 at the subsequent stage (or the preceding stage) of a buffer unit 8418 to achieve synchronization using a demodulated baseband signal. However, in this case, the circuit size and power consumption may increase.

[Third Comparative Example]

FIG. 18 is a diagram illustrating the third comparative example. The third comparative example corresponds to one disclosed in JP-A-2003-244016. The third comparative example is similar to the configuration of the present embodiment shown in FIG. 7 in that it uses the carrier signal transmitting device 6. However, in the third comparative example, a carrier signal (local oscillation signal) of the millimeter band is transmitted from the carrier signal transmitting device 6 to respective communication chips 6300, and the respective communication chips 6300 transmit and receive an input intermediate frequency-band signal by up-converting the frequency to the millimeter band using the received common carrier signal. The third comparative example has a configuration that is restricted to communication which uses intermediate frequency-band signals, and signal processing circuits for processing signals subsequent to the intermediate frequency-band signals are required. In addition, since the carrier signal itself is shared, there is a drawback in that only one frequency can be used as the carrier signal.

[Others]

None of the first to third comparative examples makes description relating to wireless transmission of the control signal. When transmitting a high data rate transmission subject signal wirelessly (through radio waves) and transmitting a low data rate clock signal or control signal wirelessly rather than through wires, the use efficiency of frequency and power consumption change depending on how the wireless transmission will be performed. For example, when the same millimeter wave transmission method as the high data rate transmission is used in wireless transmission of the low data rate clock signal or control signal, the low data rate information may be dispersed to convert into high data rate information and the high data rate information may be transmitted. However, in this case, since the frequencies are not utilized efficiently, a dispersion processing circuit consumes unnecessary power.

[Present Embodiment]

In contrast, in the configuration of the present embodiment, since the control signal and the reference signal are transmitted wirelessly to respective destinations, it is possible to solve the interference and noise problems. Moreover, since the control signal and the reference signal are transmitted wirelessly, it is possible to solve various problems (for example, signal distortion and unnecessary radiation) resulting from the use of electric wirings. Furthermore, by controlling the respective functional units based on the control signal transmitted wirelessly, it is possible to optimize matters associated with communication performance such as transmission signal quality or transmission power consumption. Furthermore, when the control signal and the reference signal are transmitted wirelessly in an integrated manner, it is possible to reduce the circuit size, the costs, and the power consumption, and achieve the effective use of transmission bands as compared to when the signals are transmitted separately. Furthermore, in regard to the reference signal, it is possible to set the frequency of the reference signal based on a frequency multiplication factor. That is, on the receiver side, a plurality of frequencies can be used as the frequency of the reference signal. Furthermore, even when using a reference signal of the same frequency, it is possible to set the frequency of the carrier signal based on the setting of the frequency multiplication factor c of the communication device and to use a plurality of frequencies as the frequency of the carrier signal.

The present disclosure contains subject matter related to that disclosed in Japanese Priority Patent Application JP 2011-005631 filed in the Japan Patent Office on Jan. 14, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A signal transmission device comprising:
   a housing;
   at least one of a first communication device that transmits a wireless control signal and a second communication device that receives the wireless control signal transmitted from the first communication device to reproduce a digital control signal,
   wherein the wireless control signal is transmitted separately from a wireless transmission subject signal which is transmitted between a third communication device and a fourth communication device; and further comprising
   a fifth communication device that transmits a wireless reference signal used in the third or fourth communication device separately from the wireless transmission subject signal and a sixth communication device that receives the wireless reference signal to reproduce a digital reference signal and supplies the digital reference signal to the third or fourth communication device, wherein the first communication device and/or the second communication device as well as the fifth communication device and sixth communication device are contained within the housing.

2. The signal transmission device according to claim 1, wherein the wireless control signal is modulated by a frequency shift keying method.

3. The signal transmission device according to claim 1, wherein the wireless control signal is modulated with a carrier frequency different from the wireless transmission subject signal.

4. The signal transmission device according to claim 1, wherein the wireless transmission subject signal and the wireless control signal have a frequency in a millimeter band.

5. The signal transmission device according to claim 1, wherein the digital control signal is used for controlling a transmission state of the wireless transmission subject signal.

6. The signal transmission device according to claim 5, wherein the digital control signal is used for setting a transmission power of the wireless transmission subject signal.

7. The signal transmission device according to claim 1, further comprising:
   a signal combination unit that generates one combined signal representing the wireless control signal and the wireless reference signal based on the digital control signal and the digital reference signal; and
   a signal separation unit that receives and reproduces a combined wireless signal to separate the wireless control signal and the wireless reference signal.

8. The signal transmission device according to claim 7, wherein the one combined signal is modulated by a frequency shift keying method.

9. The signal transmission device according to claim 8, wherein the signal separation unit includes
a comparing unit that compares the one combined signal with a determination reference value, and
a logical circuit unit that generates the digital control signal and the digital reference signal based on a result by the comparing unit.

10. The signal transmission device according to claim 7, wherein the one combined signal is modulated with a carrier frequency different from the wireless transmission subject signal.

11. The signal transmission device according to claim 7, wherein the wireless transmission subject signal and the one combined signal have a frequency in a millimeter band.

12. The signal transmission device according to claim 1, wherein the first communication device includes a signal combination unit that generates one combined signal representing the wireless control signal and the wireless reference signal based on the digital control signal and the digital reference signal, and transmits the one combined signal,
wherein the second communication device includes a signal separation unit that receives and reproduces the one combined signal to separate the wireless control signal and the wireless reference signal.

13. The signal transmission device according to claim 1, wherein the digital reference signal is used for synchronizing a transmitting-side signal processing operation on the transmission subject signal with a receiving-side signal processing operation.

14. The signal transmission device according to claim 1, further comprising
at least one of the third and the fourth communication devices.

* * * * *